US007990210B2

(12) United States Patent
Iida et al.

(10) Patent No.: US 7,990,210 B2
(45) Date of Patent: Aug. 2, 2011

(54) AMPLIFIER, AMPLIFYING METHOD, AND FILTER

(75) Inventors: Sachio Iida, Chiba (JP); Atsushi Yoshizawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 78 days.

(21) Appl. No.: 12/093,207

(22) PCT Filed: Sep. 4, 2007

(86) PCT No.: PCT/JP2007/067196
§ 371 (c)(1),
(2), (4) Date: May 6, 2009

(87) PCT Pub. No.: WO2008/032601
PCT Pub. Date: Mar. 20, 2008

(65) Prior Publication Data
US 2009/0219086 A1 Sep. 3, 2009

(30) Foreign Application Priority Data

Sep. 11, 2006 (JP) .............................. P2006-246171
Dec. 21, 2006 (JP) .............................. P2006-345074
Dec. 21, 2006 (JP) .............................. P2006-345075

(51) Int. Cl.
*H03F 7/00* (2006.01)
(52) U.S. Cl. ........................... 330/4.9; 330/4.5; 327/355
(58) Field of Classification Search .................. 330/4.9, 330/4.5; 327/355
See application file for complete search history.

(56) References Cited

U.S. PATENT DOCUMENTS

| 3,591,848 | A * | 7/1971 | Otto ............................... 307/424 |
| 5,530,393 | A * | 6/1996 | Guerrieri et al. ............... 327/355 |
| 7,495,515 | B1 * | 2/2009 | Branch et al. .................. 330/305 |
| 7,688,130 | B2 * | 3/2010 | Li et al. .......................... 327/359 |
| 2005/0275026 | A1 | 12/2005 | Tsividis et al. |

OTHER PUBLICATIONS

European Search Report from European Patent Office dated Oct. 2, 2008, for Application No. 07806651.1-1233/1944865, 4 pages.
Figueiredo, P. M. et al., "The MOS Capacitor Amplifier", IEEE Transactions on Circuits and Systems II: Express Briefs, IEEE Service Center, New York, NY ,vol. 51, No. 3, Mar. 2004, pp. 111-115.
Oliveira, J. P. et al., "Low-Power CMOS Comparator With Embedded Amplification for Ultra-high-speed ADCs", IEEE International Symposium on Circuits and Systems, 2007, May 2007, pp. 3602-3605.

(Continued)

*Primary Examiner* — Patricia Nguyen
(74) *Attorney, Agent, or Firm* — Finnegan, Henderson, Farabow, Garrett & Dunner, L.L.P.

(57) ABSTRACT

An amplifier is provided which includes: a first variable capacitance device of which capacitance is variable, a second variable capacitance device of which capacitance is variable, electrically connected to the first variable capacitance device, and of an inverse conductivity type from the first variable capacitance device, and a first input unit for selectively inputting a bias voltage and a voltage signal to the first variable capacitance device and the second variable capacitance device, wherein, in the event that the bias voltage and the voltage signal are input to the first variable capacitance device and the second variable capacitance device, the capacitance of the first variable capacitance device and the second variable capacitance device is taken as a first value, and wherein the voltage signal is amplified with the capacitance of the first variable capacitance device and the second variable capacitance device as a second value smaller than the first value.

11 Claims, 33 Drawing Sheets

OTHER PUBLICATIONS

Ranganathan, S. et al., "Discrete-Time Parametric Amplification Based on a Three-Terminal MOS Varactor: Analysis and Experimental Results", IEEE Journal on Solid-State Circuits, IEEE Service Center, Piscataway, NJ, US, vol. 38, No. 12, Dec. 2003, pp. 2087-2093.

L. Richard Carley et al., "High-Speed Low-Power Integrating CMOS Sampling-and-Holding Amplifier Architecture," Proceedings of IEEE 1995 Custom Integrated Circuits conference, pp. 543-546, May 1995.

Y. Tsividis et al., "Strange Ways to Use the MOSFET," IEEE International Symposium on Circuits and Systems, pp. 449-452, Jun. 1997.

Pietro Andreani et al., "On the Use of MOS Varactors in RF VCO's."IEEE Journal of Solid State Circuits, pp. 905-910, Jun. 2000.

S. Ranganathan et al., "Discrete-Time Parametric amplification Based on a Three-Terminal MOS Varactor: Analysis and Experimental Results" IEEE Journal of Solid-State Circuits, vol. 38, No. 12, Dec. 2003, pp. 2087-2093.

* cited by examiner

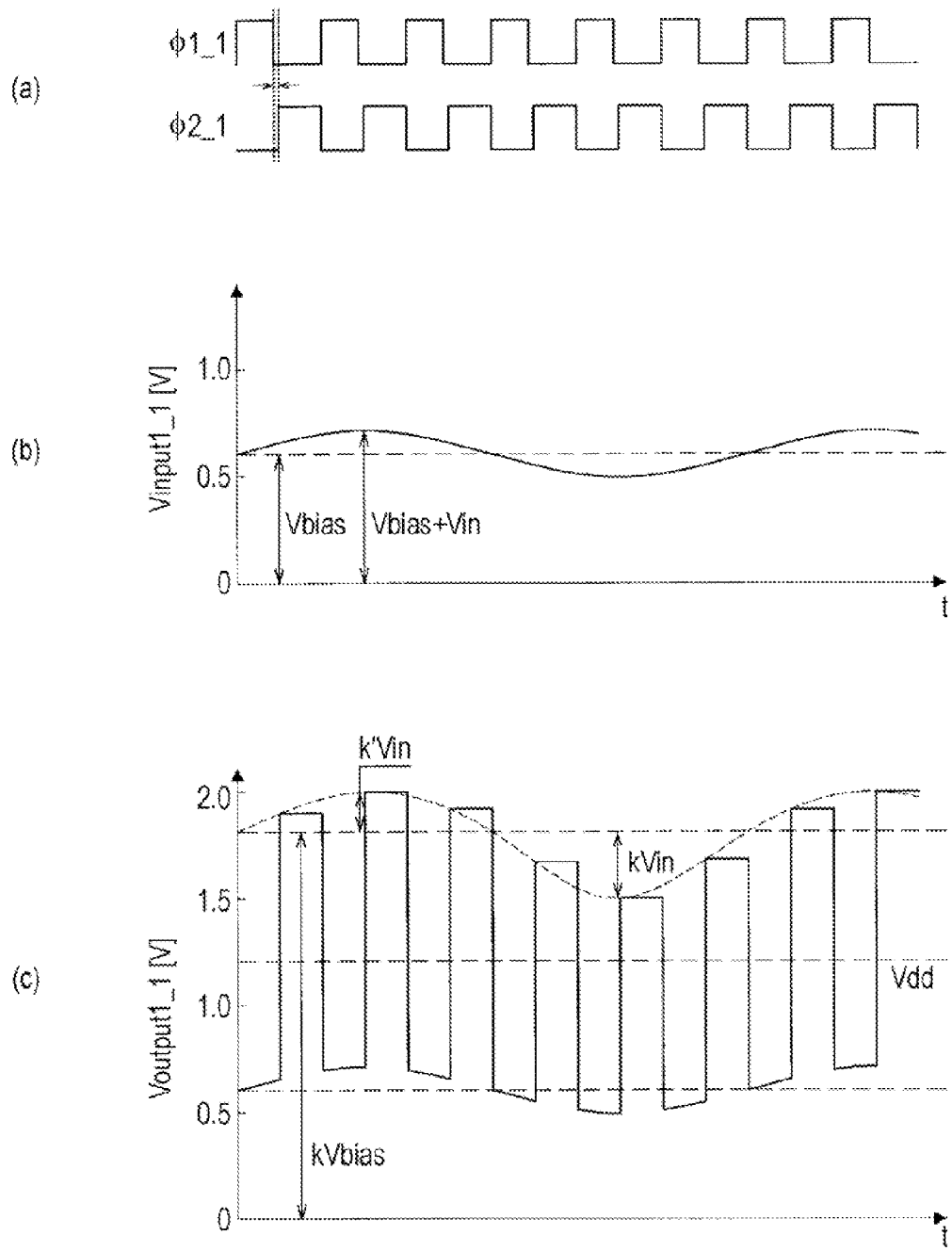

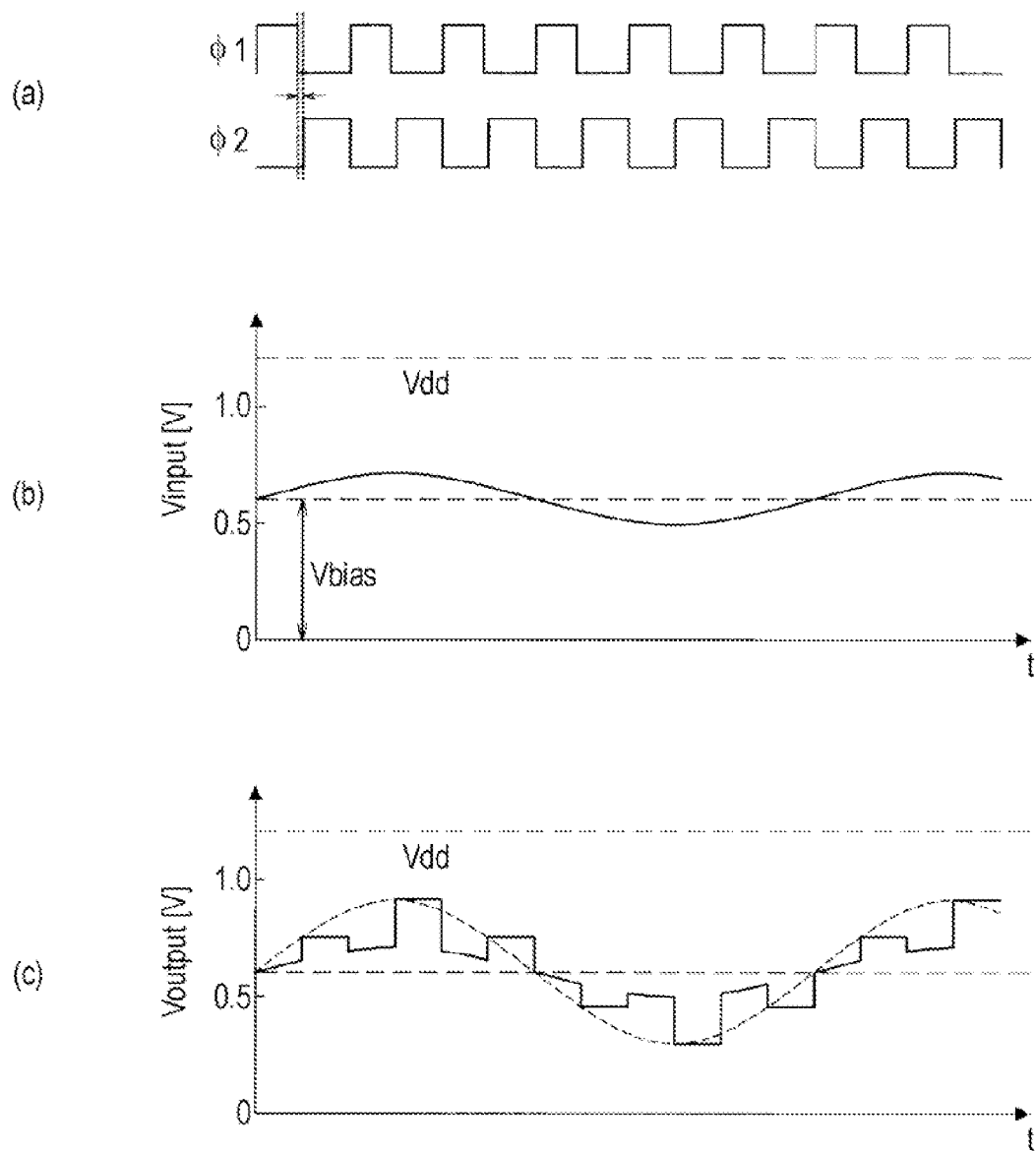

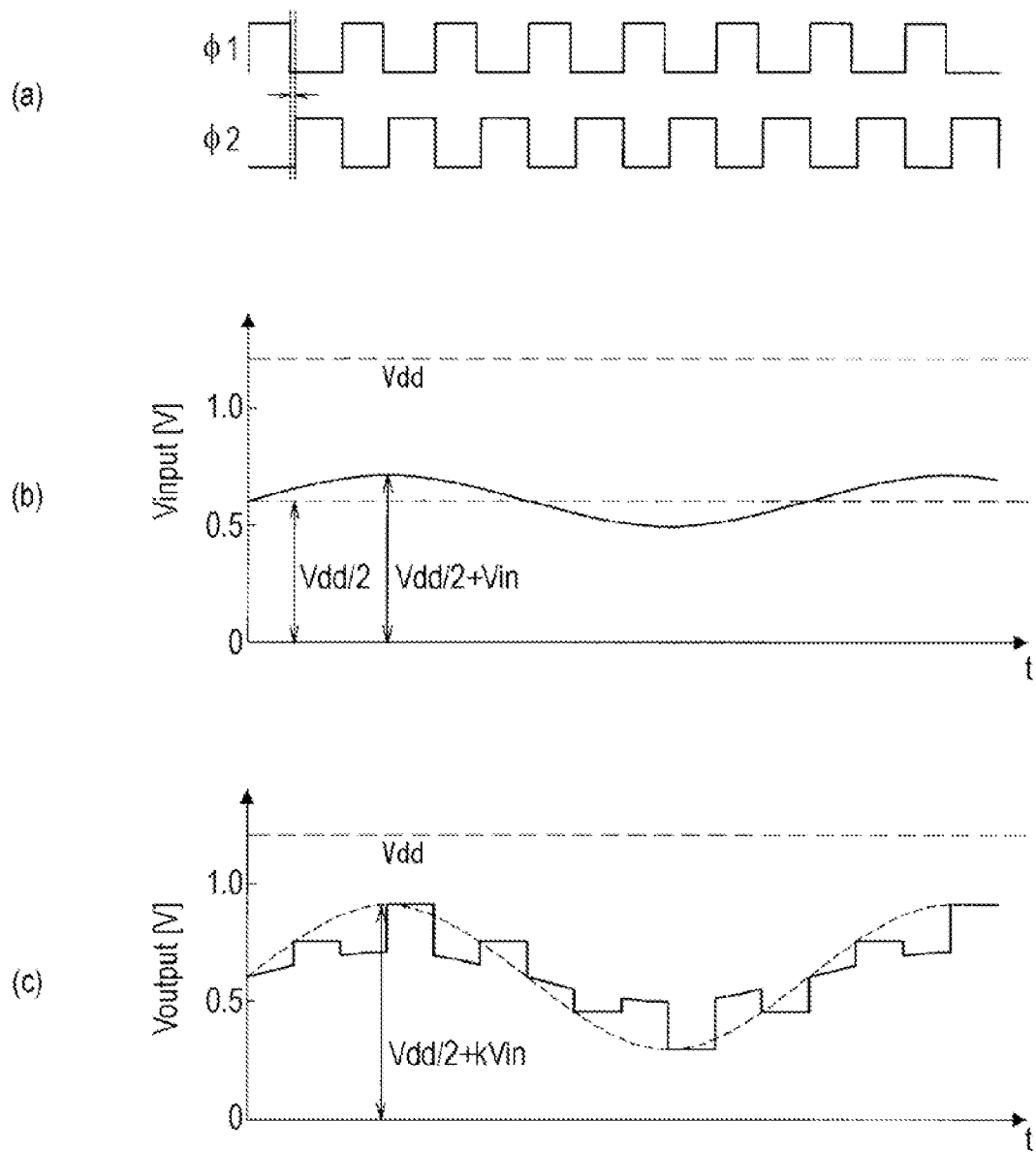

FIG. 31
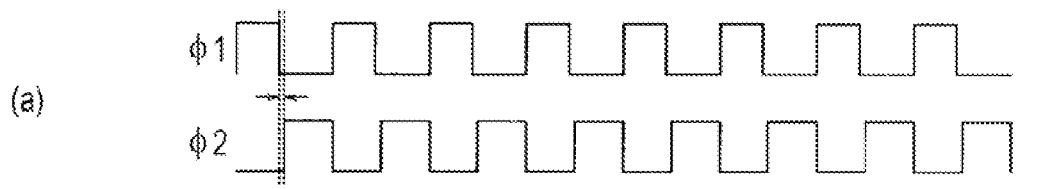
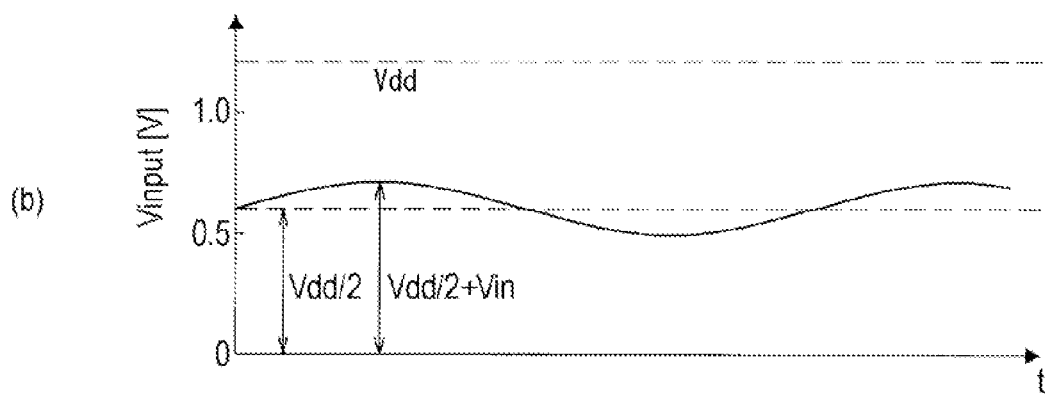
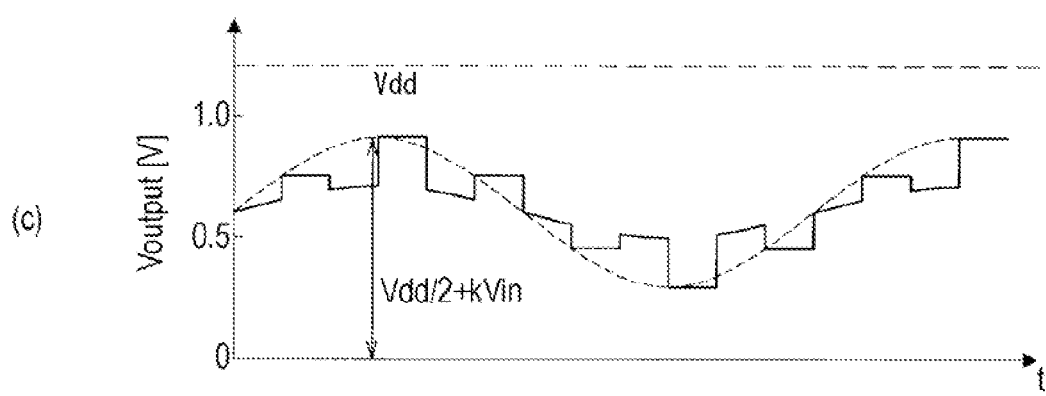

AMPLIFIER, AMPLIFYING METHOD, AND FILTER

TECHNICAL FIELD

The present invention relates to an amplifier, an amplifying method, and a filter.

BACKGROUND ART

In recent years, with Soc (System on Chip) for wireless communication wherein an RF (Radio Frequency) circuit and digital circuit are included in a single CMOS (Complementary Metal Oxide Semiconductor) chip, there has been developed a technology for finer RF circuits and lower electric power consumption, by employing analog discrete-time signal processing technology such as current mode sampling with high-speed clocks, switched capacitor circuits, and so forth.

An example of a technique to realize finer RF circuits and lower electric power consumption using a discrete-time parametric amplifier (MOSFET parametric amplifier) configured of a MOSFET (Metal Oxide Semiconductor Field effect transistor) is Patent Document 1.

Patent Document 1: US Patent Application Publication No. 2005/275026

DISCLOSURE OF INVENTION

Technical Problem

However, with the above-described conventional MOSFET parametric amplifier, the bias voltage and voltage signals input to the MOSFET parametric amplifier are amplified together while still in a superimposed state. Accordingly, the output signals of the MOSFET parametric amplifier are unnecessarily great, and the output signals are difficult to handle, to the extent that high voltage endurance needs to be provided to the downstream components which receive the output signals. Also, when the output signals of the MOSFET parametric amplifier are unnecessarily great, the arrangement becomes unsuitable for finer circuits and lower electric power consumption. Further, in the event that the output signals of the MOSFET parametric amplifier are greater than the power source voltage, the capacitance of the MOSFET decreases, resulting in distortion of the signal waveforms of the output signals.

The present invention has thus been made in light of the above problems, and it is an object of the present invention to provide a new and improved amplifier, amplifying method, and filter, capable of amplifying, of bias voltage and voltage signals input to an amplifier, the voltage signals.

Technical Solution

In order to achieve the above object, according to a first perspective of the present invention, an amplifier is provided, comprising: a first variable capacitance device of which capacitance is variable; a second variable capacitance device of which capacitance is variable, electrically connected to the first variable capacitance device, and of an inverse conductivity type from the first variable capacitance device; and a first input unit for selectively inputting a bias voltage and a voltage signal to the first variable capacitance device and the second variable capacitance device, wherein, in the event that the bias voltage and the voltage signal are input to the first variable capacitance device and the second variable capacitance device, the capacitance of the first variable capacitance device and the second variable capacitance device is taken as a first value, and wherein the voltage signal is amplified with the capacitance of the first variable capacitance device and the second variable capacitance device as a second value smaller than the first value.

The above amplifier has a first variable capacitance device, and second variable capacitance device, and a first input unit. The capacitance of the first variable capacitance device is variable. Also, the second variable capacitance device is of an inverse conductivity type from the first variable capacitance device, and the capacitance thereof is variable. The first input unit selectively inputs a bias voltage and a voltage signal to the first variable capacitance device and the second variable capacitance device. In the event that the bias voltage and the voltage signal are input to the first variable capacitance device and the second variable capacitance device, the capacitance is taken as a first value, and a charge is accumulated. Then, the first variable capacitance device and the second variable capacitance device reduce the capacitance from the first value to a smaller second value, so as to output an output voltage signal amplified by the voltage signal being multiplied by the first value as to the second value. Note that the bias voltage is substantially not amplified, since the charge equivalent to the amplification amount is cancelled out at the first variable capacitance device and the second variable capacitance device.

Also, voltage for canceling the amplification amount of the bias voltage may be impressed on the first variable capacitance device and the second variable capacitance device.

The charge equivalent to the amplification amount of the amplified bias voltage can be cancelled out at the first variable capacitance device and the second variable capacitance device, by impressing power source voltage, for example.

Also, an arrangement may be made wherein the first variable capacitance device and the second variable capacitance device are MOS varactors, for example, the first input unit has a first switch, for example, the gate terminals of the first variable capacitance device and the second variable capacitance device are each connected to the first switch, the source terminal and drain terminal of the first variable capacitance device are connected to a power source for outputting power source voltage, or to the ground, via a second switch, for example, and the source terminal and drain terminal of the second variable capacitance device are connected to the power source, or to the ground, via a third switch, for example, wherein, in the event of the second switch being connected to the power source, the third switch is connected to the ground, with the capacitance of the first variable capacitance device and the second variable capacitance device being taken as the first value, and in the event of the second switch being connected to the ground, the third switch is connected to the power source, with the capacitance of the first variable capacitance device and the second variable capacitance device being taken as the second value.

The first variable capacitance device and the second variable capacitance device are MOS varactors, for example, having mutually inverse conductivity. Also, the first input unit has a first switch, for example, and selectively inputs the bias voltage and the voltage signals to the first variable capacitance device and the second variable capacitance device in accordance with opening/closing of the first switch. The gate terminals of the first variable capacitance device and the second variable capacitance device are each connected to the first switch. Also, the source terminal and drain terminal of the first variable capacitance device are connected to, for example, a power source for outputting power source voltage, or to the ground, via a second switch, and the source terminal and drain terminal of the second variable capacitance device are connected to, for example, the power source, or to the ground, via a third switch.

Here, in the event of the second switch being connected to the power source, the third switch is connected to the ground, with the capacitance of the first variable capacitance device and the second variable capacitance device being taken as the first value. Also, in the event of the second switch being connected to the ground, the third switch is connected to the power source, with the capacitance of the first variable capacitance device and the second variable capacitance device being taken as the second value. Due to the second switch and third switch being operated so that the connection destinations are mutually different, the increase/decrease in capacitance of the mutually-inverse-conductivity-type first variable capacitance device and second variable capacitance device becomes the same.

Also, an arrangement may be made wherein the first variable capacitance device and the second variable capacitance device are MOS varactors, for example, the first input unit having a first switch, the source terminal and drain terminal of the first variable capacitance device and the source terminal and drain terminal of the second variable capacitance device are each connected to the first switch, the gate terminal of the second variable capacitance device is connected to a power source for outputting power source voltage, or to the ground, via a second switch, and the gate terminal of the first variable capacitance device is connected to the power source, or to the ground, via a third switch, wherein, in the event of the second switch being connected to the power source, the third switch is connected to the ground, with the capacitance of the first variable capacitance device and the second variable capacitance device being taken as the first value, and wherein, in the event of the second switch being connected to the ground, the third switch is connected to the power source, with the capacitance of the first variable capacitance device and the second variable capacitance device being taken as the second value.

The first variable capacitance device and the second variable capacitance device are MOS varactors, for example, having mutually inverse conductivity. Also, the first input unit has a first switch, and is capable of selectively inputting the bias voltage and the voltage signals to the first variable capacitance device and the second variable capacitance device in accordance with opening/closing of the first switch, for example. The source terminal and drain terminal of the first variable capacitance device and source terminal and drain terminal of the second variable capacitance device are each connected to the first switch. Also, the gate terminal of the second variable capacitance device is connected to, for example, a power source for outputting power source voltage, or to the ground, via a second switch, and the gate terminal of the first variable capacitance device is connected, for example, to the power source, or to the ground, via a third switch.

Here, in the event of the second switch being connected to the power source, the third switch is connected to the ground, with the capacitance of the first variable capacitance device and the second variable capacitance device being taken as the first value. Also, in the event of the second switch being connected to the ground, the third switch is connected to the power source, with the capacitance of the first variable capacitance device and the second variable capacitance device being taken as the second value. Due to the second switch and third switch being operated so that the connection destinations are mutually different, the increase/decrease in capacitance of the mutually-inverse-conductivity-type first variable capacitance device and second variable capacitance device becomes the same. According to this configuration, the signal voltage can be amplified while maintaining the bias voltage.

Also, the amplifier may comprise at least one or more adjusting variable capacitance devices, of the same conductivity type as the first variable capacitance device or the second variable capacitance device, and smaller in gate width than the first variable capacitance device and the second variable capacitance device; and at least one or more adjusting switches, for example, for connecting each of the source terminal and drain terminal of the at least one or more adjusting variable capacitance devices to the power source or the ground, wherein the at least one or more adjusting variable capacitance devices have the gate terminals thereof each connected to the first switch, in parallel to the first variable capacitance device or the second variable capacitance device.

The amplifier includes, for example, at least one or more adjusting variable capacitance devices, and at least one or more adjusting switches. Each of the adjusting variable capacitance devices is a variable capacitance device of the same conductivity type as the first variable capacitance device or the second variable capacitance device, and smaller in gate width than the first variable capacitance device and the second variable capacitance device. The gate (Gate) terminals of the adjusting variable capacitance devices are each connected to the first switch, and the source (Source) terminals and drain (Drain) terminals thereof are each connected to the adjusting switches corresponding to the adjusting variable capacitance devices. The area of the gate terminal of the first variable capacitance device or the area of the gate terminal of the second variable capacitance device can be indirectly adjusted by matching the connection state of the adjusting switches to the second switch (a case wherein the adjusting variable capacitance devices are of the same conductivity type as the first variable capacitance device) or the third switch (a case wherein the adjusting variable capacitance devices are of the same conductivity type as the second variable capacitance device).

Also, the amplifier may further comprise: a third variable capacitance device of which capacitance is variable; and a fourth variable capacitance device of which capacitance is variable, electrically connected to the third variable capacitance device, and of an inverse conductivity type from the third variable capacitance device, wherein the third variable capacitance device and the fourth variable capacitance device are MOS varactors, for example, the source terminals and drain terminals of the third variable capacitance device and the source terminals and drain terminals of the fourth variable capacitance device are each connected to the first switch, the gate terminal of the fourth variable capacitance device is connected to a power source for outputting power source voltage, or to the ground, via the second switch, the gate of the third variable capacitance device is connected to the power source for outputting power source voltage, or to the ground, via the third switch, and wherein, in the event of the second switch being connected to the power source, the third switch is connected to the ground, with the capacitance of the third variable capacitance device and the fourth variable capacitance device being taken as the first value, and wherein, in the event of the second switch being connected to the ground, the third switch is connected to the power source, with the capacitance of the third variable capacitance device and the fourth variable capacitance device being taken as the second value.

The amplifier may further comprise a third variable capacitance device and a fourth variable capacitance device. The third variable capacitance device and the fourth variable capacitance device are MOS varactors, for example, having mutually inverse conductivity. The source terminals and drain terminals of the third variable capacitance device and the fourth variable capacitance device are each connected to the first switch, for example. Also, the gate terminal of the fourth variable capacitance device is connected to, for example, a power source for outputting power source voltage, or to the ground, via the second switch, and the gate terminal of the third variable capacitance device is connected to, for example, the power source, or to the ground, via the third switch.

Now, in the event of the second switch being connected to the power source, the third switch is connected to the ground, with the capacitance of the third variable capacitance device and the fourth variable capacitance device being taken as the first value. Also, in the event of the second switch being connected to the ground, the third switch is connected to the power source, with the capacitance of the third variable capacitance device and the fourth variable capacitance device being taken as the second value. Due to the second switch and third switch being operated so that the connection destinations are mutually different, the increase/decrease in capacitance of the mutually-inverse-conductivity-type third variable capacitance device and fourth variable capacitance device becomes the same. According to this configuration, the signal voltage can be amplified while maintaining the bias voltage.

Also, an arrangement may be made wherein the first input unit selectively inputs the bias voltage and a positive phase voltage signal making up a differential signal serving as the voltage signal, the first variable capacitance device and the second variable capacitance device amplify positive phase voltage signal with the capacitance as a second value smaller than the first value, the amplifier further comprises a third variable capacitance device of which capacitance is variable; a fourth variable capacitance device of which capacitance is variable, electrically connected to the third variable capacitance device, and of an inverse conductivity type from the third variable capacitance device; and a second input unit for selectively inputting, to the third variable capacitance device and the fourth variable capacitance device, the bias voltage and an inverse phase voltage signal of which the phase has been inverted from the positive phase voltage signal; wherein, in the event that the bias voltage and the inverse phase voltage signal are input to the third variable capacitance device and the fourth variable capacitance device, the capacitance of the third variable capacitance device and the fourth variable capacitance device are taken as a third value, and wherein the inverse phase voltage signal is amplified with the capacitance of the third variable capacitance device and the fourth variable capacitance device as a fourth value smaller than the third value.

The amplifier further comprises a third variable capacitance device, a fourth variable capacitance device, and a second input unit. The third variable capacitance device and the fourth variable capacitance device have mutually inverse conductivity, and correspond to the first variable capacitance device and second variable capacitance device. Also, the second input unit is a component corresponding to the first input unit. The first input unit selectively inputs the bias voltage and a positive phase voltage signal making up a differential signal serving as the voltage signal to the first variable capacitance device and the second variable capacitance device. Also, the second input unit selectively inputs the bias voltage and an inverse phase voltage signal, of which the phase has been inverted from the positive phase voltage signal, to the third variable capacitance device and the fourth variable capacitance device. Now, input of the positive phase voltage signal or inverse phase voltage signal at the first input unit and second input unit is performed synchronously. Accordingly, the amplifier outputs differential signals by outputting output voltage signals wherein the positive phase voltage signal has been amplified, from the first variable capacitance device and the second variable capacitance device, and outputting output voltage signals wherein the inverse phase voltage signal has been amplified, from the third variable capacitance device and the fourth variable capacitance device.

Also, an arrangement may be made wherein the first variable capacitance device, the second variable capacitance device, the third variable capacitance device, and the fourth variable capacitance device, are MOS varactors, for example, the first input unit having a first switch, for example, the second input unit having a second switch, for example, the gate terminals of the first variable capacitance device and the second variable capacitance device are connected to the first switch; the gate terminals of the third variable capacitance device and the fourth variable capacitance device are connected to the second switch; the source terminals and/or drain terminals of the first variable capacitance device and the third variable capacitance device are connected, for example, to a power source for outputting power source voltage, or to the ground, via a third switch, the source terminals and/or drain terminals of the second variable capacitance device and the fourth variable capacitance device are connected to the power source, or to the ground, via a fourth switch, and wherein, in the event of the third switch being connected to the power source, the fourth switch is connected to the ground, with the capacitance of the first variable capacitance device and the second variable capacitance device being taken as the first value, and the capacitance of the third variable capacitance device and the fourth variable capacitance device being taken as the third value, and wherein, in the event of the third switch being connected to the ground, the fourth switch is connected to the power source, with the capacitance of the first variable capacitance device and the second variable capacitance device being taken as the second value, and the capacitance of the third variable capacitance device and the fourth variable capacitance device being taken as the fourth value.

The first variable capacitance device and the second variable capacitance device are MOS varactors for example, having mutually inverse conductivity. In the same way, the third variable capacitance device and the fourth variable capacitance device are MOS varactors for example, having mutually inverse conductivity. Also, the first input unit has a first switch for example, and selectively inputs the bias voltage and positive phase voltage signal to the first variable capacitance device and the second variable capacitance device, in accordance with opening/closing of the first switch. In the same way, the second input unit has a second switch for example, and selectively inputs the bias voltage and inverse phase voltage signal to the third variable capacitance device and the fourth variable capacitance device, in accordance with opening/closing of the second switch. The gate terminals of the first variable capacitance device and the second variable capacitance device are each connected to the first switch, and the gate terminals of the third variable capacitance device and the fourth variable capacitance device are each connected to the second switch. Now, the source terminals and/or drain terminals of the first variable capacitance device and the third variable capacitance device are connected to a power source for outputting power source voltage, or to the ground, via a third switch, for example, and the source terminals and/or drain terminals of the second variable capacitance device and the fourth variable capacitance device are connected to the power source, or to the ground, via a fourth switch, for example.

Now, in the event of the second switch being connected to the power source, the third switch is connected to the ground, with the capacitance of the first variable capacitance device and the second variable capacitance device being taken as the first value, and the capacitance of the third variable capacitance device and the fourth variable capacitance device being taken as the third value. Also, in the event of the second switch being connected to the ground, the third switch is connected to the power source, with the capacitance of the first variable capacitance device and the second variable capacitance device being taken as the second value, and the capacitance of the third variable capacitance device and the fourth variable capacitance device being taken as the fourth value. Due to the second switch and third switch being operated so that the connection destinations are mutually different, the increase/decrease in capacitance of the mutually-inverse-conductivity-type first variable capacitance device and second variable capacitance device, and of the mutually-inverse-conductivity-type third variable capacitance device and fourth variable capacitance device, becomes the same.

Also, an arrangement may be made wherein the capacitance of the first variable capacitance device and the second variable capacitance device is taken as a third value greater than the first value in the event of attenuating the voltage signal, the amplifier further comprising at least one third variable capacitance device of the same conductivity type as the first variable capacitance device and of which the capacitance is variable, connected to the first input unit in parallel to the first second variable capacitance device; and at least one fourth variable capacitance device of the same conductivity type as the second variable capacitance device and of which the capacitance is variable, connected to the first input unit in parallel to the second variable capacitance device.

By the capacitance of the first variable capacitance device and the second variable capacitance device being taken as a third value greater than the first value, the voltage signal can be attenuated by multiplication by a ratio of the first value corresponding to the third value. Also, the amplifier further comprises at least one third variable capacitance device and at least one fourth variable capacitance device. The third variable capacitance device is of the same conductivity type as the first variable capacitance device and the capacitance thereof is variable. Also, the fourth variable capacitance device is of the same conductivity type as the second variable capacitance device and the capacitance thereof is variable. Now, the third variable capacitance device and the fourth variable capacitance device, in the same way as with the first variable capacitance device and second variable capacitance device, can perform amplification by multiplication by a ratio of the first value corresponding to the second value, by reduction of the capacitance to a second value smaller than the first value, and also, the voltage signal can be attenuated by multiplication by a ratio of the first value by corresponding to the third value, by taking the capacitance as a third value greater than the first value. Accordingly, the gain of output voltage signals output from the amplifier can be switched over by independently changing increase/decrease of capacitance at the first variable capacitance device and the second variable capacitance device, and of capacitance at the third variable capacitance device and the fourth variable capacitance device.

Also, the amplifier may comprise at least one capacitance device having a predetermined capacitance and capable of accumulating a charge equivalent to the predetermined capacitance, disposed upstream of the first input unit, wherein the voltage signal which the first input unit inputs is a voltage signal due to charge sharing by the first variable capacitance device, the second variable capacitance device, and the at least one capacitance device.

The amplifier receives input of voltage signals by charge sharing of the at least one capacitance device disposed upstream of the first input unit, the first variable capacitance device, and the second variable capacitance device, and voltage signals from the charge sharing can be amplified. Accordingly, the amplifier can be used as the final stage of a charged main filter circuit configured with a SINC filter, for example.

Also, the MOS varactor may be a reverse mode MOS varactor.

Also, the MOS varactor may be an accumulation mode MOS varactor.

The MOS varactor may be a reverse mode MOS varactor, or an accumulation mode MOS varactor. While the reverse mode MOS varactor and accumulation mode MOS varactor differ in the workings of how capacitance is increased/decreased, both are capable of capacitance increase/decrease, so the amplifier can amplify, of the input bias voltage and voltage signal, the voltage signal.

Also, in order to achieve the above object, according to a second perspective of the present invention, an amplifier is provided, comprising: a first variable capacitance unit of which capacitance is variable; a second variable capacitance unit of which capacitance is variable, electrically connected to the first variable capacitance unit; and a first input unit for selectively inputting a bias voltage and a voltage signal to the first variable capacitance unit and the second variable capacitance unit, wherein the first variable capacitance unit and the second variable capacitance unit are each a combination of the same components, and wherein, in the event that the bias voltage and the voltage signal are input to the first variable capacitance unit and the second variable capacitance unit, the capacitances of the first variable capacitance unit and the second variable capacitance unit are each taken as a same first value, and wherein the voltage signal is amplified with the capacitances of each of the first variable capacitance unit and the second variable capacitance unit as a same second value each smaller than the first value.

According to this configuration, the capacitance of the first variable capacitance device and the second variable capacitance device can each be made the same, so the signal voltage can be amplified while maintaining the bias voltage.

Also, in order to achieve the above object, according to a third perspective of the present invention, an amplifying method, relating to an amplifier including a first variable capacitance device of which capacitance is variable, and a second variable capacitance device of which capacitance is variable and of an inverse conductivity type from the first variable capacitance device, is provided, comprising: a step for inputting a bias voltage and a voltage signal to the first variable capacitance device and the second variable capacitance device, and accumulating a first charge corresponding to a first capacitance; a step for holding the first charge, and a voltage corresponding to the bias voltage and the voltage signal; and a step for amplifying the voltage signal by reducing the capacitance of the first variable capacitance device and the second variable capacitance device from the first capacitance to a second capacitance smaller than the first capacitance.

The step for amplifying the voltage signal may further comprise: a step for reducing the capacitance of the first variable capacitance device and the second variable capacitance device from the first capacitance to the second capacitance; a step for amplifying the bias voltage and the voltage signal in accordance to the ratio of the first capacitance as to the second capacitance; and a step for canceling out a charge equivalent to the amount of amplification of the amplified bias voltage at the first variable capacitance device and the second variable capacitance device.

By using this method, of the input bias voltage and voltage signal, the voltage signal can be amplified.

Also, in order to achieve the above object, according to a fourth perspective of the present invention, a filter is provided comprising: an amplifying unit to which a bias voltage and a voltage signal are input, with the voltage signal being amplified and output; a first switch unit for selectively inputting the bias voltage and the voltage signal to the amplifying unit; and a second switch unit for selectively outputting the voltage signal output from the amplifying unit, the amplifying unit including a first variable capacitance device of which capacitance is variable; and a second variable capacitance device of which capacitance is variable, electrically connected to the first variable capacitance device, and of an inverse conductivity type from the first variable capacitance device, wherein, in the event that the bias voltage and the voltage signal are input to the first variable capacitance device and the second variable capacitance device, the capacitance of the first variable capacitance device and the second variable capacitance device is taken as a first value, and wherein the voltage signal is amplified with the capacitance of the first variable capacitance device and the second variable capacitance device as a second value smaller than the first value.

With this configuration, the signal voltage can be amplified and output while maintaining the input bias voltage.

Also, the filter may further comprise a third switch unit for setting the amplifying unit to an initial state prior to input of the voltage signal.

With this configuration, even in a case wherein input of bias voltage and voltage signal has been repeatedly performed, the signal voltage can be amplified and output while maintaining the input bias voltage, in a state wherein the amplification efficiency of signal voltage is maintained.

Also, in order to achieve the above object, according to a fifth perspective of the present invention, a filter is provided comprising: an amplifying unit to which a bias voltage and a voltage signal are input, with the voltage signal being amplified and output; a first switch unit for selectively inputting the bias voltage and the voltage signal to the amplifying unit; and a second switch unit for selectively outputting the voltage signal output from the amplifying unit, the amplifying unit including a first variable capacitance unit of which capacitance is variable; and a second variable capacitance unit of which capacitance is variable, electrically connected to the first variable capacitance unit; with the first variable capacitance unit and the second variable capacitance unit each being a combination of the same components, wherein, in the event that the bias voltage and the voltage signal are input to the first variable capacitance unit and the second variable capacitance unit, the capacitances of the first variable capacitance unit and the second variable capacitance unit are each taken as a same first value, and wherein the voltage signal is amplified with the capacitances of each of the first variable capacitance unit and the second variable capacitance unit as a same second value each smaller than the first value.

With this configuration, the signal voltage can be amplified and output while maintaining the input bias voltage.

In order to achieve the above object, according to another perspective of the present invention, an amplifier is provided comprising: a first variable capacitance device of which capacitance is variable; a second variable capacitance device of which capacitance is variable, electrically connected to the first variable capacitance device, and of an inverse conductivity types as to the first variable capacitance device; and a first input unit for selectively inputting a bias voltage and a voltage signal to the first variable capacitance device and the second variable capacitance device, wherein, in the event that the bias voltage and the voltage signal are input to the first variable capacitance device and the second variable capacitance device, the capacitance of the first variable capacitance device and the second variable capacitance device is taken as a first value, and wherein the voltage signal is amplified with the capacitance of the first variable capacitance device and the second variable capacitance device as a second value smaller than the first value.

The amplifier has a first variable capacitance device, a second variable capacitance device, and a first input unit. The capacitance of the first variable capacitance device is variable. Also, the second variable capacitance device is of an inverse conductivity type as the first variable capacitance device, and the capacitance is variable. The first input unit selectively inputs a bias voltage and a voltage signal to the first variable capacitance device and the second variable capacitance device. In the event that the bias voltage and the voltage signal are input to the first variable capacitance device and the second variable capacitance device, the capacitance of the first variable capacitance device and the second variable capacitance device is taken as a first value, and a charge is accumulated. The first variable capacitance device and the second variable capacitance device reduce the capacitance to a second value smaller than the above first value, thereby outputting an output voltage signal wherein the voltage signal has been amplified by multiplying by a ratio of the first value as to the second value. Note that the bias voltage is substantially not amplified, since the charge equivalent to the amplification amount is cancelled out at the first variable capacitance device and the second variable capacitance device.

Also, voltage for canceling the amplification amount of the bias voltage may be impressed on the first variable capacitance device and the second variable capacitance device.

Also, impressing power source voltage, for example, on the first variable capacitance device and the second variable capacitance device, enables charge equivalent to the amplification amount of the bias voltage to be cancelled out.

Also, an arrangement may be made wherein the first variable capacitance device and the second variable capacitance device are MOS varactors, for example, the first input unit having a first switch, for example, the gate terminals of the first variable capacitance device and the second variable capacitance device are each connected to the first switch, the source terminal and drain terminal of the first variable capacitance device are connected to a power source for outputting power source voltage, or to the ground, via a second switch, for example, and the source terminal and drain terminal of the second variable capacitance device are connected to the power source, or to the ground, via a third switch, for example, and wherein, in the event of the second switch being connected to the power source, the third switch is connected to the ground, with the capacitance of the first variable capacitance device and the second variable capacitance device being taken as the first value, and wherein, in the event of the second switch being connected to the ground, the third switch is connected to the power source, with the capacitance of the first variable capacitance device and the second variable capacitance device being taken as the second value.

The first variable capacitance device and the second variable capacitance device are MOS varactors, for example, having mutually inverse conductivity. Also, the first input unit has a first switch, and the bias voltage and the voltage signal are selectively input to the first variable capacitance device and the second variable capacitance device in accordance with opening/closing of the first switch. The gate terminals of the first variable capacitance device and the second variable capacitance device are each connected to the first switch. Also, the source and drain terminals of the first variable capacitance device are connected to a power source for outputting power source voltage, or to the ground, via a second switch, for example, and the source terminal and drain terminal of the second variable capacitance device are connected to the power source, or to the ground, via a third switch, for example.

Now, in the event of the second switch being connected to the power source, the third switch is connected to the ground, with the capacitance of the first variable capacitance device and the second variable capacitance device being taken as the first value. Also, in the event of the second switch being connected to the ground, the third switch is connected to the power source, with the capacitance of the first variable capacitance device and the second variable capacitance device being taken as the second value. Due to the second switch and third switch being operated so that the connection destinations are mutually different, the increase/decrease in capacitance of the mutually-inverse-conductivity-type first variable capacitance device and second variable capacitance device becomes the same.

The amplifier may comprise at least one or more adjusting variable capacitance devices, of the same conductivity type as the first variable capacitance device or the second variable capacitance device, and smaller in gate width than the first variable capacitance device and the second variable capacitance device; and at least one or more adjusting switches for connecting each of the source terminal and drain terminal of the at least one or more adjusting variable capacitance devices to the power source or the ground, wherein the at least one or more adjusting variable capacitance devices have the gate terminals thereof each connected to the first input, in parallel to the first variable capacitance device or the second variable capacitance device.

The amplifier includes, for example, at least one or more adjusting variable capacitance devices, and at least one or more adjusting switches. Each of the adjusting variable capacitance devices is a variable capacitance device of the same conductivity type as the first variable capacitance device or the second variable capacitance device, and smaller in gate width than the first variable capacitance device and the second variable capacitance device. The gate (Gate) terminals of the adjusting variable capacitance devices are each connected to the first switch, and the source (Source) terminals and drain (Drain) terminals thereof are each connected to the adjusting switches corresponding to the adjusting variable capacitance devices. The area of the gate terminal of the first variable capacitance device or the area of the gate terminal of the second variable capacitance device can be indirectly adjusted by matching the connection state of the adjusting switches to the second switch (a case wherein the adjusting variable capacitance devices are of the same conductivity type as the first variable capacitance device) or the third switch (a case wherein the adjusting variable capacitance devices are of the same conductivity type as the second variable capacitance device).

Also, an arrangement may be made wherein the first input unit selectively inputs the bias voltage and a positive phase voltage signal making up a differential signal serving as the voltage signal, the first variable capacitance device and the second variable capacitance device amplify the capacitance as a second value smaller than the first value, the amplifier further comprises a third variable capacitance device of which capacitance is variable; a fourth variable capacitance device of which capacitance is variable, electrically connected to the third variable capacitance device, and of an inverse conductivity type from the third variable capacitance device; and a second input unit for selectively inputting, to the third variable capacitance device and the fourth variable capacitance device, the positive phase voltage signal and an inverse phase voltage signal of which the phase has been inverted from the positive phase voltage signal; wherein, in the event that the bias voltage and the inverse voltage signal are input to the third variable capacitance device and the fourth variable capacitance device, the capacitance of the third variable capacitance device and the fourth variable capacitance device are taken as a third value, and wherein the inverse voltage signal is amplified with the capacitance of the third variable capacitance device and the fourth variable capacitance device as a fourth value smaller than the third value.

The amplifier further comprises a third variable capacitance device, a fourth variable capacitance device, and a second input unit. The third variable capacitance device and the fourth variable capacitance device have mutually inverse conductivity, and correspond to the above first variable capacitance device and above second variable capacitance device. Also, the second input unit is a component corresponding to the above first input unit. The first input unit selectively inputs a positive phase voltage signal making up a differential signal serving as the voltage signal to the first variable capacitance device and the second variable capacitance device. Also, the second input unit selectively inputs an inverse phase voltage signal, of which the phase has been inverted from the positive phase voltage signal, to the third variable capacitance device and the fourth variable capacitance device. Now, input of the above positive phase voltage signal or inverse phase voltage signal at the above first input unit and above second input unit is performed synchronously. Accordingly, the amplifier outputs differential signals by outputting output voltage signals wherein the positive phase voltage signal has been amplified, from the first variable capacitance device and the second variable capacitance device, and outputting output voltage signals wherein the inverse phase voltage signal has been amplified, from the third variable capacitance device and the fourth variable capacitance device.

Also, an arrangement may be made wherein the first variable capacitance device, the second variable capacitance device, the third variable capacitance device, and the fourth variable capacitance device, are MOS varactors, the first input unit having a first switch, the second input unit having a second switch, the gate terminals of the first variable capacitance device and the second variable capacitance device are connected to the first switch; the gate terminals of the third variable capacitance device and the fourth variable capacitance device are connected to the second switch; the source terminals and/or drain terminals of the first variable capacitance device and the third variable capacitance device are connected to a power source for outputting power source voltage, or to the ground, via a third switch, the source terminals and/or drain terminals of the second variable capacitance device and the fourth variable capacitance device are connected to a power source for outputting power source voltage, or to the ground, via a fourth switch, and wherein, in the event of the third switch being connected to the power source, the fourth switch is connected to the ground, with the capacitance of the first variable capacitance device and the second variable capacitance device being taken as the first value, and the capacitance of the third variable capacitance device and the fourth variable capacitance device being taken as the third value, and wherein, in the event of the third switch being connected to the ground, the fourth switch is connected to the power source, with the capacitance of the first variable capacitance device and the second variable capacitance device being taken as the second value, and the capacitance of the third variable capacitance device and the fourth variable capacitance device being taken as the fourth value.

The first variable capacitance device and the second variable capacitance device are MOS varactors for example, having mutually inverse conductivity. In the same way, the third variable capacitance device and the fourth variable capacitance device are MOS varactors for example, having mutually inverse conductivity. The first input unit has a first switch for example, and selectively inputs the bias voltage and positive phase voltage signal to the first variable capacitance device and the second variable capacitance device, in accordance with opening/closing of the first switch. In the same way, the second input unit has a second switch for example, and selectively inputs the bias voltage and inverse phase voltage signal to the third variable capacitance device and the fourth variable capacitance device, in accordance with opening/closing of the second switch. The gate terminals of the first variable capacitance device and the second variable capacitance device are each connected to the first switch, and the gate terminals of the third variable capacitance device and the fourth variable capacitance device are connected to the second switch. Now, the source terminals and/or drain terminals of the first variable capacitance device and the third variable capacitance device are connected to a power source for outputting power source voltage, or to the ground, via a third switch, for example, and the source terminals and/or drain terminals of the second variable capacitance device and the fourth variable capacitance device are connected to a power source for outputting power source voltage, or to the ground, via a fourth switch, for example.

Now, in the event of the third switch being connected to the power source, the fourth switch is connected to the ground, with the capacitance of the first variable capacitance device and the second variable capacitance device being taken as the first value, and the capacitance of the third variable capacitance device and the fourth variable capacitance device being taken as the third value. Also, in the event of the third switch being connected to the ground, the fourth switch is connected to the power source, with the capacitance of the first variable capacitance device and the second variable capacitance device being taken as the second value, and the capacitance of the third variable capacitance device and the fourth variable capacitance device being taken as the fourth value. Due to the second switch and third switch being operated so that the connection destinations are mutually different, the increase/decrease in capacitance of the mutually-inverse-conductivity-type first variable capacitance device and second variable capacitance device, and of the mutually-inverse-conductivity-type third variable capacitance device and fourth variable capacitance device, becomes the same.

Also, an arrangement may be made wherein the capacitance of the first variable capacitance device and the second variable capacitance device is taken as a third value greater than the first value in the event of attenuating the voltage signal, the amplifier further comprising at least one third variable capacitance device of the same conductivity type as the first variable capacitance device and of which the capacitance is variable, connected to the first input unit in parallel to the first variable capacitance device; and at least one fourth variable capacitance device of the same conductivity type as the second variable capacitance device and of which the capacitance is variable, connected to the first input unit in parallel to the second variable capacitance device.

By the capacitance of the first variable capacitance device and the second variable capacitance device being taken as a third value greater than the first value, the voltage signal can be attenuated by multiplication by a ratio of the first value. Also, the amplifier further comprises at least one third variable capacitance device and at least one fourth variable capacitance device. The third variable capacitance device is of the same conductivity type as the first variable capacitance device and the capacitance thereof is variable. Also, the fourth variable capacitance device is of the same conductivity type as the second variable capacitance device and the capacitance thereof is variable. Now, the third variable capacitance device and the fourth variable capacitance device, in the same way as with the first variable capacitance device and second variable capacitance device, can perform amplification by multiplication by a ratio of the first value corresponding to the second value, by reduction of the capacitance to a second value smaller than the first value, and also, the voltage signal can be attenuated by multiplication by a ratio of the first value by corresponding to the third value, by taking the capacitance as a third value greater than the first value. Accordingly, the gain of output voltage signals output from the amplifier can be switched over by independently changing increase/decrease of capacitance at the first variable capacitance device and the second variable capacitance device, and capacitance at the third variable capacitance device and the fourth variable capacitance device.

The amplifier may comprise at least one capacitance device having a predetermined capacitance and capable of accumulating a charge equivalent to the predetermined capacitance, disposed upstream of the first input unit, wherein the voltage signal which the first input unit inputs is a voltage signal due to charge sharing by the first variable capacitance device, the second variable capacitance device, and the at least one capacitance device.

The amplifier receives input of voltage signals by charge sharing of the at least one capacitance device disposed upstream of the first input unit, the first variable capacitance device, and the second variable capacitance device, and voltage signals from charge sharing can be amplified. Accordingly, the amplifier can be used as the final stage of a charged main filter circuit configured with a SINC filter, for example.

Also, the MOS varactor may be a reverse mode MOS varactor.

Also, the MOS varactor may be an accumulation mode MOS varactor.

The MOS varactor may be a reverse mode MOS varactor, or an accumulation mode MOS varactor. While the reverse mode MOS varactor and accumulation mode MOS varactor differ in the workings of how capacitance is increased/decreased, both are capable of capacitance increase/decrease, so the amplifier can amplify, of the input bias voltage and voltage signal, the voltage signal.

Also, in order to achieve the above object, according to another perspective of the present invention, an amplifying method, relating to an amplifier including a first variable capacitance device of which capacitance is variable, and a second variable capacitance device of which capacitance is variable and of an inverse conductivity type from the first variable capacitance device, is provided, comprising: a step for inputting a bias voltage and a voltage signal to the first variable capacitance device and the second variable capacitance device, and accumulating a first charge corresponding to a first capacitance; a step for holding the first charge, and a voltage corresponding to the bias voltage and the voltage signal; and a step for amplifying the voltage signal by reducing the capacitance of the first variable capacitance device and the second variable capacitance device from the first capacitance to a second capacitance smaller than the first capacitance.

The step for amplifying the voltage signal may further comprise: a step for reducing the capacitance of the first variable capacitance device and the second variable capacitance device from the first capacitance to the second capacitance; a step for amplifying the bias voltage and the voltage signal in accordance to the ratio of the first capacitance as to the second capacitance; and a step for canceling out a charge equivalent to the amount of amplification of the amplified bias voltage at the first variable capacitance device and the second variable capacitance device.

By using this method, of the input bias voltage and voltage signal, the voltage signal can be amplified.

In order to achieve the above object, according to another perspective of the present invention, an amplifier is provided comprising: a first variable capacitance device of which capacitance is variable; a second variable capacitance device of which capacitance is variable, electrically connected to the first variable capacitance device; and a first input unit for selectively inputting a bias voltage and a voltage signal to the first variable capacitance device and the second variable capacitance device, wherein, in the event that the bias voltage and the voltage signal are input to the first variable capacitance device and the second variable capacitance device, the capacitance of the first variable capacitance device and the second variable capacitance device is taken as a first value, and wherein the voltage signal is amplified with the capacitance of the first variable capacitance device and the second variable capacitance device as a second value smaller than the first value.

The amplifier may have a first variable capacitance device, a second variable capacitance device, and a first input unit. The capacitance of the first variable capacitance device is variable. The second variable capacitance device is electrically connected to the first variable capacitance device, and the capacitance is variable as with the first variable capacitance device. The first input unit can selectively input a bias voltage and a voltage signal to the first variable capacitance device and the second variable capacitance device. In the event that the bias voltage and the voltage signal are input to the first variable capacitance device and the second variable capacitance device, the capacitance of the first variable capacitance device and the second variable capacitance device can be taken as a first value, with a charge being accumulated. The first variable capacitance device and the second variable capacitance device each reduce the capacitance to a second value smaller than the above first value, thereby outputting an output voltage signal wherein the voltage signal has been amplified by multiplying by a ratio of the first value as to the second value. Note that the bias voltage is substantially not amplified, since the charge equivalent to the amplification amount is cancelled out at the first variable capacitance device and the second variable capacitance device. According to this configuration, the signal voltage can be amplified while maintaining the bias voltage.

Also, voltage for canceling the amplification amount of the bias voltage may be impressed on the first variable capacitance device and the second variable capacitance device.

Also, impressing power source voltage, for example, on the first variable capacitance device and the second variable capacitance device, enables charge equivalent to the amplification amount of the bias voltage to be cancelled out.

Also, the first variable capacitance device and the second variable capacitance device may be of the same conductivity type.

With this configuration as well, charge equivalent to the amplification amount is cancelled out at the first variable capacitance device and the second variable capacitance device, so the signal voltage can be amplified while maintaining the bias voltage.

Also, an arrangement may be made wherein the first variable capacitance device and the second variable capacitance device are n-channel-type MOS varactors, the first input unit having a first switch, the source terminal and drain terminal of the first variable capacitance device and the gate terminal of the second variable capacitance device are each connected to the first switch, the gate terminal of the first variable capacitance device is connected to a power source for outputting power source voltage, or to the ground, via a second switch, and the source terminal and drain terminal of the second variable capacitance device are connected to the power source, or to the ground, via a third switch, and wherein, in the event of the second switch being connected to the power source, the third switch is connected to the ground, with the capacitance of the first variable capacitance device and the second variable capacitance device being taken as the first value, and wherein, in the event of the second switch being connected to the ground, the third switch is connected to the power source, with the capacitance of the first variable capacitance device and the second variable capacitance device being taken as the second value.

The first variable capacitance device and the second variable capacitance device are n-channel-type MOS varactors, for example, and are variable capacitance devices having the same conductivity type as each other. Also, the first input unit has a first switch, and the bias voltage and the voltage signal are selectively input to the first variable capacitance device and the second variable capacitance device in accordance with opening/closing of the first switch. The source terminal and drain terminal of the first variable capacitance device and the gate terminal of the second variable capacitance device are each connected to the first switch. Also, the gate terminal of the first variable capacitance device is connected to a power source for outputting power source voltage, or to the ground, via a second switch, for example, and the source terminal and drain terminal of the second variable capacitance device are connected to the power source, or to the ground, via a third switch, for example.

Now, in the event of the second switch being connected to the power source, the third switch is connected to the ground, with the capacitance of the first variable capacitance device and the second variable capacitance device being taken as the first value. Also, in the event of the second switch being connected to the ground, the third switch is connected to the power source, with the capacitance of the first variable capacitance device and the second variable capacitance device being taken as the second value. Due to the second switch and third switch being operated so that the connection destinations are mutually different, the increase/decrease in capacitance of the mutually-inverse-conductivity-type first variable capacitance device and second variable capacitance device becomes the same. According to this configuration, the signal voltage can be amplified while maintaining the bias voltage.

Also, the first variable capacitance device and the second variable capacitance device may be p-channel-type MOS varactors, the first input unit having a first switch, wherein the gate terminal of the first variable capacitance device and source terminal and drain terminal of the second variable capacitance device are each connected to the first switch, the source terminal and drain terminal of the first variable capacitance device are connected to a power source for outputting power source voltage, or to the ground, via a second switch, and the gate terminal of the second variable capacitance device is connected to the power source, or to the ground, via a third switch, and wherein, in the event of the second switch being connected to the power source, the third switch is connected to the ground, with the capacitance of the first variable capacitance device and the second variable capacitance device being taken as the first value, and wherein, in the event of the second switch being connected to the ground, the third switch is connected to the power source, with the capacitance of the first variable capacitance device and the second variable capacitance device being taken as the second value.

The first variable capacitance device and the second variable capacitance device are p-channel-type MOS varactors, for example, and are variable capacitance devices having the same conductivity type as each other. Also, the first input unit has a first switch, and the bias voltage and the voltage signal can be selectively input to the first variable capacitance device and the second variable capacitance device in accordance with opening/closing of the first switch. The gate terminal of the first variable capacitance device and source terminal and drain terminal of the second variable capacitance device are each connected to the first switch. Also, the source terminal and drain terminal of the first variable capacitance device are connected to a power source for outputting power source voltage, or to the ground, via a second switch, for example, and the gate terminal of the second variable capacitance device is connected to the power source, or to the ground, via a third switch, for example.

Now, in the event of the second switch being connected to the power source, the third switch is connected to the ground, and the capacitance of the first variable capacitance device and the second variable capacitance device can be taken as the first value. Also, in the event of the second switch being connected to the ground, the third switch is connected to the power source, and the capacitance of the first variable capacitance device and the second variable capacitance device can be taken as the second value.

In order to achieve the above object, according to another perspective of the present invention, a filter is provided comprising: an amplifying unit to which a bias voltage and a voltage signal are input, with the voltage signal being amplified and output; a first switch unit for selectively inputting the bias voltage and the voltage signal to the amplifying unit; and a second switch unit for selectively outputting the voltage signal output from the amplifying unit, the amplifying unit including a first variable capacitance device of which capacitance is variable; and a second variable capacitance device of which capacitance is variable, electrically connected to the first variable capacitance device, wherein, in the event that the bias voltage and the voltage signal are input to the first variable capacitance device and the second variable capacitance device, the capacitance of the first variable capacitance device and the second variable capacitance device is taken as a first value, and wherein the voltage signal is amplified with the capacitance of the first variable capacitance device and the second variable capacitance device as a second value smaller than the first value.

With this configuration, the voltage signal can be amplified and output while maintaining the input bias voltage.

Also, the filter may further comprise a third switch unit for setting the amplifying unit to an initial state prior to input of the voltage signal.

With this configuration, even in a case wherein input of bias voltage and voltage signal has been repeatedly performed, signal voltage can be amplified and output while maintaining the input bias voltage, in a state wherein the amplification efficiency of signal voltage is maintained.

ADVANTAGEOUS EFFECTS

According to the present invention, of the bias voltage and voltage signal input to the amplifier, the voltage signal can be amplified. Also, according to the present invention, of the bias voltage and voltage signal input to the filter, the voltage signal can be amplified.

BRIEF DESCRIPTION OF DRAWINGS

FIG. 4 is an explanatory diagram illustrating the waveform of signals of the conventional MOSFET parametric amplifier shown in FIG. 3A and FIG. 3B.

FIG. 10 is an explanatory diagram illustrating the waveform of signals according to the first embodiment shown in FIG. 9A and FIG. 9B.

FIG. 21 is an explanatory diagram illustrating the waveform of signals according to the seventh embodiment shown in FIG. 19 and FIG. 20.

FIG. 31 is an explanatory diagram illustrating the waveform of signals according to the eleventh embodiment shown in FIG. 29 and FIG. 30.

BEST MODES FOR CARRYING OUT THE INVENTION

Figure 1A:
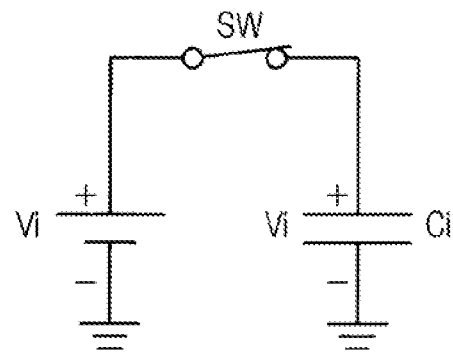
FIG. 1A is an explanatory diagram illustrating the principle of a discrete-time parametric amplifier amplifying voltage signals.

Preferred embodiments of the present invention will be described in detail below with reference to the attached drawings. Note that with the Present Description and the drawings, components having substantially the same functional configuration will be denoted with the same reference numerals, thereby omitting redundant description.

(Principle of Discrete-Time Parametric Amplifier)

First, the principle of a discrete-time parametric amplifier amplifying voltage signals will be described with reference to FIG. 1A through FIG. 1C. Note that FIG. 1A is a diagram illustrating a Track state wherein the discrete-time parametric amplifier accumulates charge, FIG. 1B is a diagram illustrating a Hold state wherein the accumulated charge is held, and further FIG. 1C is a diagram illustrating a Boost state wherein voltage is amplified.

Figure 1B:
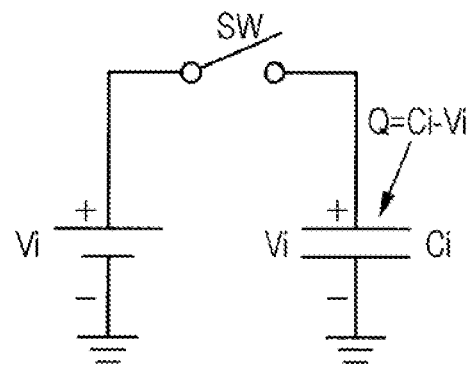
FIG. 1B is an explanatory diagram illustrating the principle of a discrete-time parametric amplifier amplifying voltage signals.
Figure 1C:
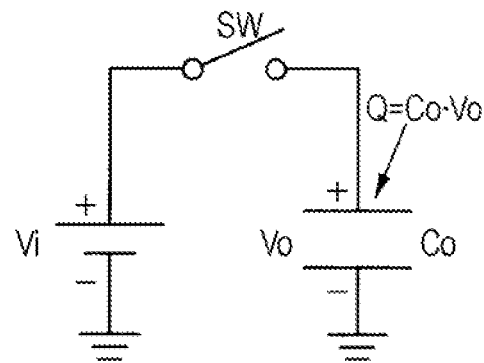
FIG. 1C is an explanatory diagram illustrating the principle of a discrete-time parametric amplifier amplifying voltage signals.

As shown in FIG. 1A through FIG. 1C, this discrete-time parametric amplifier is configured of a power source for outputting an input voltage Vi, a variable capacitance device of which the capacitance changes, and a switch SW for controlling input of the input voltage Vi as to the variable capacitance device.

The overall operations of this parametric amplifier will be described as follows. First, in a Track state (FIG. 1A), the switch SW is in an on (ON) state, so the input voltage Vi is applied to the variable capacitance device Ci via the switch SW. Accordingly, a charge Q (=Ci·Vi) which is obtained as the product of the input voltage Vi and the capacitance Ci of the variable capacitance device is accumulated at both ends of the variable capacitance device.

In this state, upon the switch SW changing to OFF, and the parametric amplifier making transition to the Hold state (FIG. 1B), the variable capacitance device holds the charge Q accumulated in the Track state, and consequently, the potential difference between both electrodes of the variable capacitance device is maintained at the input voltage Vi directly prior to the switch SW opening.

In this state, in the event that the capacitance of the variable capacitance device changes from Ci to Co as shown in FIG. 1C, the potential difference generated between both electrodes of the variable capacitance device changes as follows.

[Mathematical Expression 1]

$$Vo = \frac{Q}{Co} = \frac{Ci}{Co} \cdot Vi = kVi \qquad \text{(Expression 1)}$$
$$\left(k = \frac{Ci}{Co}, 0 < Co, 0 < Ci\right)$$

Thus, the inter-electrode potential following capacitance change is proportionate to (Ci/Co). Accordingly, based on this relation, setting the capacitance of the variable capacitance device such that Co<Ci allows the potential difference generated between both electrodes of the variable capacitance device to be Boosted (amplified) to "k" times (however, in the event that Ci<Co, the inter-electrode potential difference is attenuated). Note that "k" in Expression 1 is called capacitance change ratio.

(Problems with Conventional MOSFET Parametric Amplification)

Next, the problems of conventional MOSFET parametric amplification using the above discrete-time parametric amplifier will be described with reference to FIG. 2A through FIG. 5B.

[First Problem]

Figure 2A:
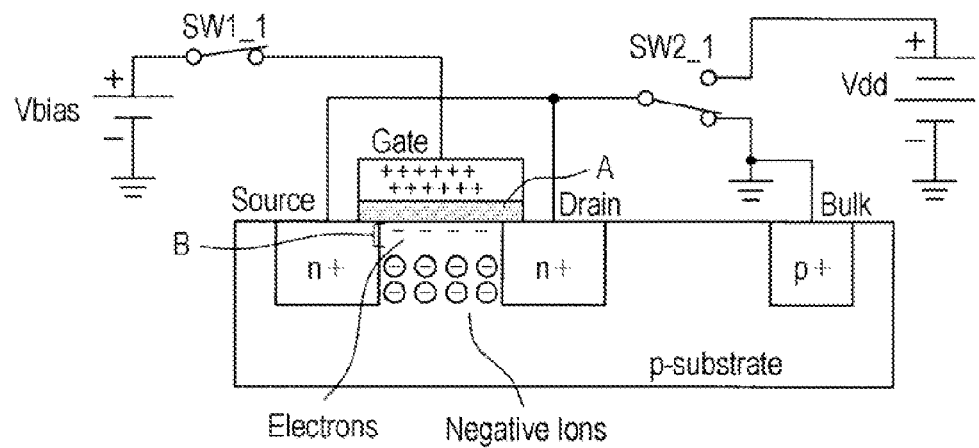
FIG. 2A is an explanatory diagram illustrating the configuration of an n-MOSFET in a conventional MOSFET parametric amplifier.
Figure 2B:
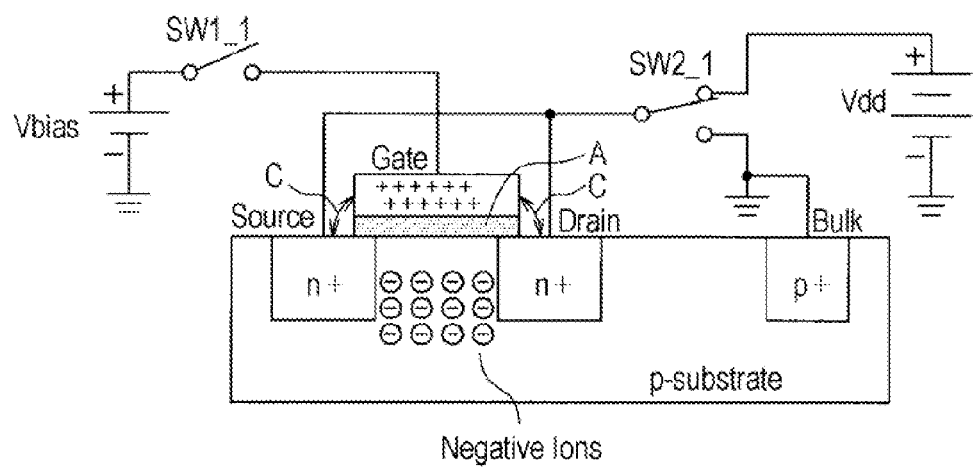
FIG. 2B is an explanatory diagram illustrating the configuration of an n-MOSFET in a conventional MOSFET parametric amplifier.

FIG. 2A and FIG. 2B are explanatory diagrams illustrating the configuration of an n (negative)-MOSFE with a conventional MOSFET parametric amplifier. Note that FIG. 2A shows a Track state, and FIG. 2B shows a Boost state.

As shown in FIG. 2A and FIG. 2B, with a conventional MOSFET parametric amplifier, bias voltage source is connected to the Gate terminal of the n-MOSFET via a switch SW1_1, and the bias voltage Vbias is applied to the Gate terminal in accordance with the connections state (ON/OFF state) of the switch SW1_1. Also, the Source terminal and Drain terminal are connected to a power source outputting power source voltage Vdd (hereafter referred to as "power source voltage source") or the ground, via a switch SW2_1, with the voltage applied to the Source terminal and Drain terminal being capable of being switched over in accordance of the connection state of the switch SW2_1. Note that the Bulk terminal is connected to the ground.

In the Track state, the above MOSFET parametric amplifier is in a state wherein the switch SW1_1 is ON and the switch SW2_1 is connected to the ground (FIG. 2A). Consequently, the bias voltage Vbias is applied to the Gate terminal, and the Source terminal and Drain terminal maintain ground voltage. Now, in the event that the bias voltage Vbias is set so as to be higher than the threshold voltage Vt of the n-MOSFET, the n-MOSFET is in a strongly inverted state, so an inversion layer B is formed at the interface between the oxide film A and P substrate (P-substrate), and electrons (Electrons) are accumulated. As a result thereof, the capacitance of the n-MOSFET increases.

Next, as shown in FIG. 2B, upon the switch SW1_1 going to OFF and the switch SW2_1 being connected to the power source voltage source side, transition is made to a state wherein the power source voltage Vdd is applied to the Source terminal and the Drain terminal, and also the bias voltage Vbias is not applied. In this state, the inversion layer B which had been formed at the interface between the oxide film A and P substrate (P-substrate) disappears due to the power source voltage Vdd is applied to the Source terminal and the Drain terminal, with negative ions (Negative Ions) increasing and the capacitance of the n-MOSFET decreasing. Also, at this time, the Gate terminal is in a state of a charge being held thereat, so upon the connection state of switches changing as shown in FIG. 2B and change in capacitance occurring, the voltage of the Gate terminal changes to a value obtained by the bias voltage Vbias having been Boosted (amplified) by multiplication by the capacitance change ratio (see Expression 1). Note that while FIG. 2A and FIG. 2B show an n-MOSFET, the principle of voltage amplification at the Gate terminal is the same with a p (positive)-MOSFET as well, even though there are the differences that the conductivity is inverse, and also the Bulk terminal is connected to the power source voltage source side outputting the power source voltage Vdd. Hereafter, description of a conventional MOSFET parametric amplifier will be made using an n-MOSFET.

Now, as described above, change (amplification) of the Gate terminal voltage occurs due to change in the inversion layer B. Now, in the case of a MOSFET, the voltage endurance of the device must be determined taking into consideration the potential difference between the Gate terminal–Source terminal, or the Gate terminal–Drain terminal, i.e., the magnitude of voltage applied to the Gate terminal. Accordingly, upon the Gate terminal voltage being Boosted by change in capacitance, not only the voltage endurance of the MOSFET where the Gate terminal voltage has been amplified (i.e., the MOSFET actually performing the Boost), but also the voltage endurance of the downstream MOSFET where the amplified voltage is to be input, needs to be taken into consideration. Accordingly, with circuits having conventional MOSFET parametric amplifiers, there is difficulty in handling output signals output from the MOSFET parametric amplifiers.

[Second Problem]

Next, a second program of the above-described conventional MOSFET parametric amplifier will be described with reference to FIG. 3A, FIG. 3B, FIG. 4A, and FIG. 4B. Note that FIG. 3A and FIG. 3B circuit diagram representations of the schematic drawings of FIG. 2A and FIG. 2B, with FIG. 3A illustrating a Track state, and FIG. 3B a Boost state, respectively.

Figure 3A:
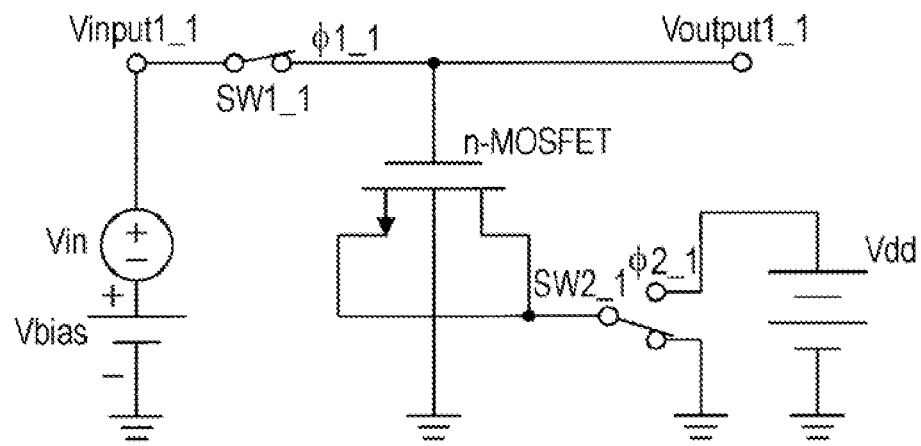
FIG. 3A is an explanatory diagram illustrating a conventional MOSFET parametric amplifier.
Figure 3B:
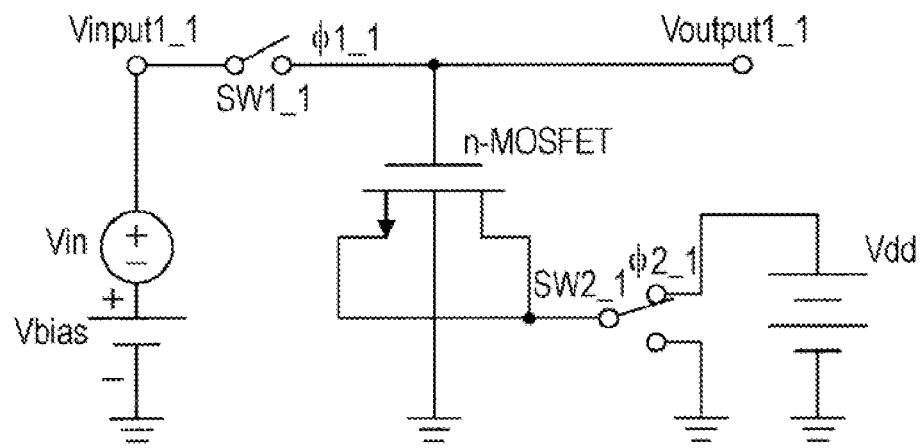
FIG. 3B is an explanatory diagram illustrating a conventional MOSFET parametric amplifier.

Also, FIG. 4 is an explanatory diagram illustrating waveforms of signals relating to a conventional MOSFET parametric amplifier 10 shown in FIG. 3A and FIG. 3B, with FIG. 4(a) illustrating control clock signals for controlling the switches in FIG. 3A and FIG. 3B, FIG. 4(b) input voltage signals Vinput 1_1 input to the conventional MOSFET parametric amplifier 10, and FIG. 4(c) output voltage signals Voutput 1_1 output from the conventional MOSFET parametric amplifier 10, respectively.

Now, let us assume that the following relations hold with the conventional MOSFET parametric amplifier 10.

(1) The switch SW1_1 operates synchronously with a clock signal φ1_1 shown in FIG. 4(a), so as to be "ON" when the clock signal φ1_1 is high (high) and "OFF" when low (low).

(2) The switch Sw2_1 operates synchronously with a clock signal φ2_1 shown in FIG. 4(a), so as to be "connected to the power source voltage source side" when the clock signal φ2_1 is high (high) and "connected to the ground side" when low (low).

Note that the input voltage signal Vinput 1_1 input to the conventional MOSFET parametric amplifier 10 is a signal wherein the bias voltage Vbias and the voltage signal Vin are superimposed, as shown in FIG. 4(b).

In this example, while the clock signal φ1_1 is "high", the switch SW1_1 is "ON", and also, the clock signal φ2_1 which is inverted as to the clock signal φ1_is "low", such that the switch SW2_1 is connected to the ground. Consequently, the conventional MOSFET parametric amplifier 10 is in a Track state (FIG. 3A), an inversion layer is formed at the P substrate side of the Gate oxide film, with the voltage of the Gate terminal changing in accordance with the input voltage signal Vinput 1_1, and charge being accumulated in the n-MOSFET.

Next, upon the clock signal φ1_1 changing to "low", the switch SW1_1 goes "OFF". Also, at this time, the clock signal φ2_1 goes to "high" in accordance with the clock signal φ1_1, and the switch SW2_1 is connected to the power source voltage source (actually, the inversion timing of the two is offset, but this point will be described later). Consequently, the conventional MOSFET parametric amplifier 10 makes transition to the Boost state, and the capacitance of the n-MOSFET decreases. At this time, the Gate terminal of the n-MOSFET is holding a charge, so the input voltage signal Vinput 1_1 changes to a value amplified by multiplication by the capacitance change ratio. Though not shown in FIG. 3A and FIG. 3B, transition is made from the Track state shown in FIG. 3A to the Boost state shown in FIG. 3B via a Hold state, due to the clock signal φ2_1 rising after the clock signal φ1_1 falls (i.e., due to there being a time difference in the inversion timing of the two signals).

Now, let us consider the voltage (Boost voltage) at the Gate terminal of the n-MOSFET at the time of the conventional MOSFET parametric amplifier 10 making transition to the Boost state, i.e., the output voltage Voutput 1_1 of the MOSFET parametric amplifier 10. At this time, as shown in FIG. 4(c), the output voltage Voutput 1_1 is a value wherein the input voltage Vinput 1_1 (=bias voltage Vbias+voltage signal Vin) has been amplified by multiplication by the capacitance change ratio (k times). That is to say, not only the voltage signal Vin which should be Boosted, but also the bias voltage Vbias is also multiplied by the capacitance change ratio accordingly. Accordingly, with a circuit having a conventional MOSFET parametric amplifier 10, the output voltage Voutput 1_1 becomes unnecessarily great, and becomes unsuitable for finer circuits and lower electric power consumption. Note that with FIG. 4(c), distortion is present in the output voltage Voutput 1_1, such as a part of the amplified voltage signal Vin being amplified by multiplication by k' (0<k'<k), which will be described next.

[Third Problem]

With the second problem of the conventional MOSFET parametric amplifier 10 described above, description has been made that the output voltage Voutput 1_1 becomes unnecessarily great, and it can be seen from reference to FIG. 4(c) that the above-described distortion is present in the output voltage Voutput 1_1. Accordingly, the problem of this distortion occurring in the output voltage Voutput 1_1 will be discussed next as a third problem of the conventional MOSFET parametric amplifier 10.

Figure 5A:
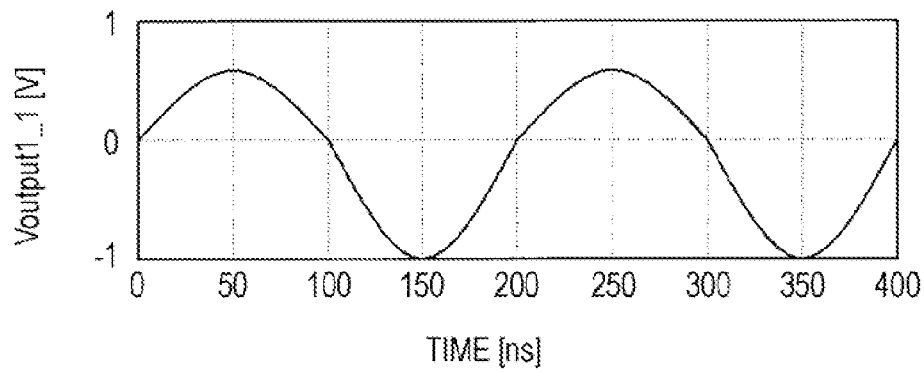
FIG. 5A is an explanatory diagram illustrating a contributing factor in distortion of output voltage signals in a conventional MOSFET parametric amplifier.
Figure 5B:
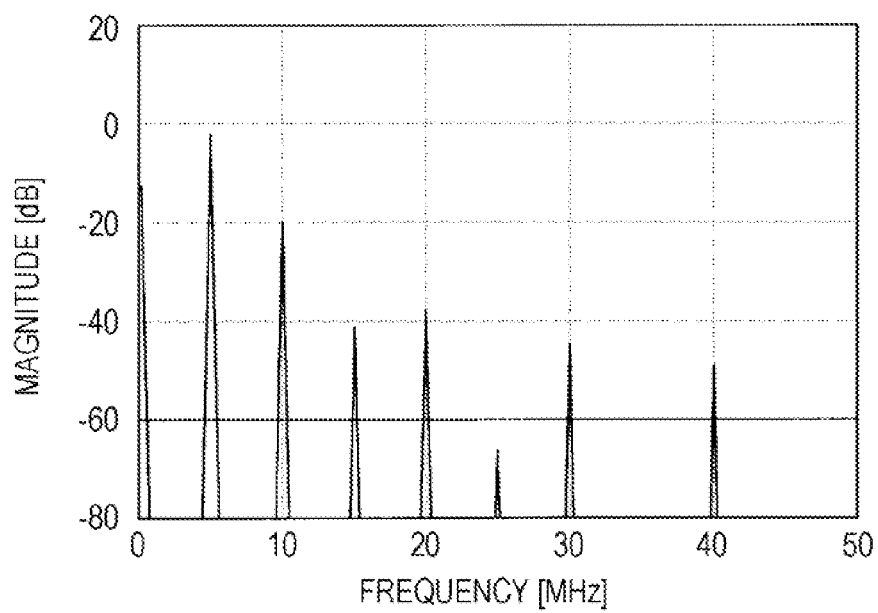
FIG. 5B is an explanatory diagram illustrating a contributing factor in distortion of output voltage signals in a conventional MOSFET parametric amplifier.

FIG. 5A and FIG. 5B are explanatory diagrams illustrating a contributing factor in distortion of the output voltage Voutput in the conventional MOSFET parametric amplifier 10. FIG. 5A is an explanatory diagram illustrating the waveform of the 5 MHz frequency extracted from the output voltage signal Voutput 1_1 as a continuous-time waveform. Also, FIG. 5B is an explanatory diagram illustrating the frequency spectrum of FIG. 5A.

With reference to FIG. 5B, in addition to the fundamental wave of 5 MHz, there are present a −60 [dB] DC (direct current) component and a harmonic wave with a higher frequency than 5 MHz, with the DC component and harmonic wave component distorting the output voltage Voutput 1_1. The above distortion is due to the capacitance of the n-MOSFET dropping when the output voltage Voutput 1_1 exceeds to the power source voltage Vdd. Accordingly, in FIG. 4(c), there is the relation that the greater the capacitance change ratio is, the greater the distortion occurring in the output voltage Voutput 1_1 becomes.

That is to say, with the conventional MOSFET parametric amplifier 10, distortion occurs at the output voltage Voutput 1_1 at the time of Boosting the output voltage Voutput 1_1 output from the MOSFET parametric amplifier, so the components which receive the output voltage Voutput 1_1 must perform correction or the like of the output voltage Voutput 1_1 as appropriate.

As described above, with the conventional MOSFET parametric amplifier 10, the bias voltage and voltage signal input to the MOSFET parametric amplifier 10 are amplified together while still in a superimposed state, creating at least the three above-described problems. Accordingly, with the amplifier according to the presents embodiment, a technique for solving the above problems by the following technique in general, has been employed.

(Principle of Amplification with Amplifier According to Present Invention)

First, the amplification principle according to the present invention will be described with reference to FIG. 6A through FIG. 7C. Note that FIG. 6A and FIG. 6B are explanatory diagrams illustrating the Track state and Hold state of an amplifier according to an embodiment of the present invention, with FIG. 6A illustrating the Track state, and FIG. 6B the Hold state, respectively.

Figure 7A:
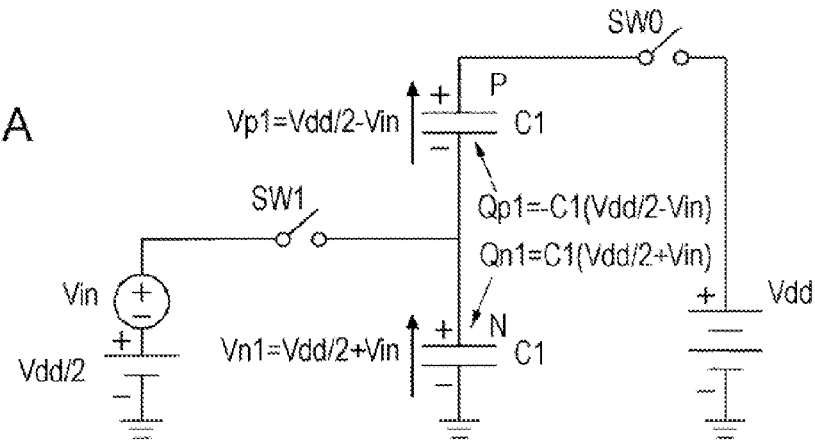
FIG. 7A is an explanatory diagram illustrating movement of charge in a Boost state with an amplifier according to an embodiment of the present invention.
Figure 7B:
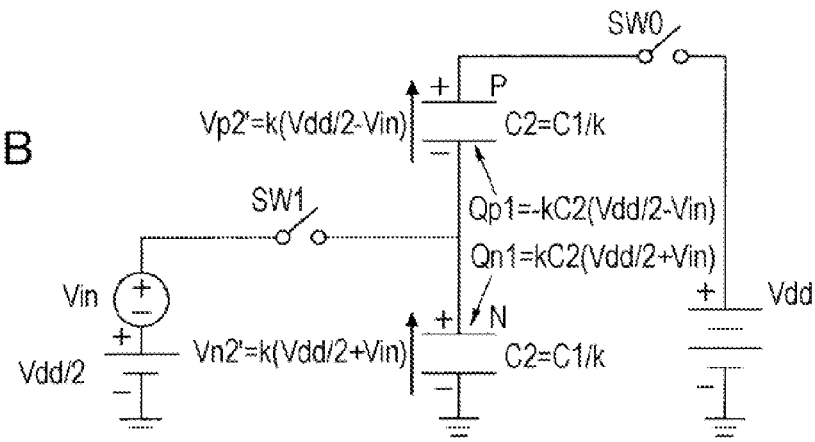
FIG. 7B is an explanatory diagram illustrating movement of charge in a Boost state with an amplifier according to an embodiment of the present invention.
Figure 7C:
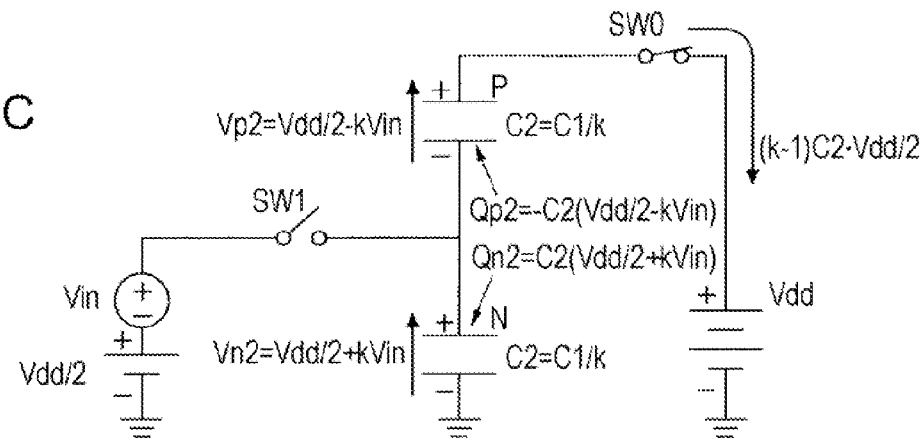
FIG. 7C is an explanatory diagram illustrating movement of charge in a Boost state with an amplifier according to an embodiment of the present invention.

Also, FIG. 7A through FIG. 7C are explanatory diagrams illustrating movement of charge in a Boost state with the amplifier according to an embodiment of the present invention, with FIG. 7A through 7C each illustrating movement of charge in the Boost state over time.

With reference to FIG. 6A through FIG. 7C, the amplifier according to an embodiment of the present invention has (1) a first variable capacitance device P with variable capacitance, and (2) a second variable capacitance device N with inverse conductivity as to the first variable capacitance device P, with a bias voltage Vdd/2 and voltage signal Vin being input to the first variable capacitance device P and the second variable capacitance device N in accordance with the connection state of the switch SW1. Also, the first variable capacitance device P is connected to the power source voltage source, and the second variable capacitance device N is connected to the ground N. Note that while the bias voltage has been shown to be Vdd/2 in FIG. 6A through FIG. 7C, it is needless to say that the arrangement is not restricted to the above.

Figure 6A:
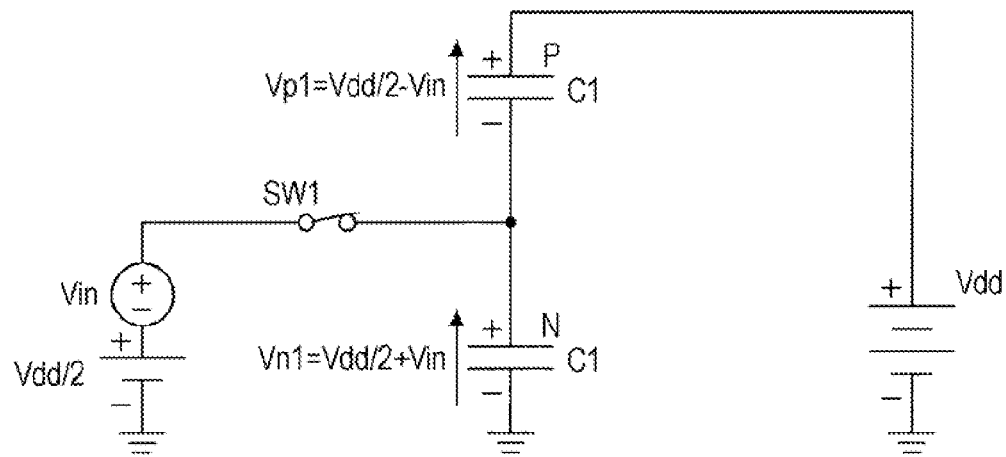
FIG. 6A is an explanatory diagram illustrating a Track state and Hold state with an amplifier according to an embodiment of the present invention.
Figure 6B:
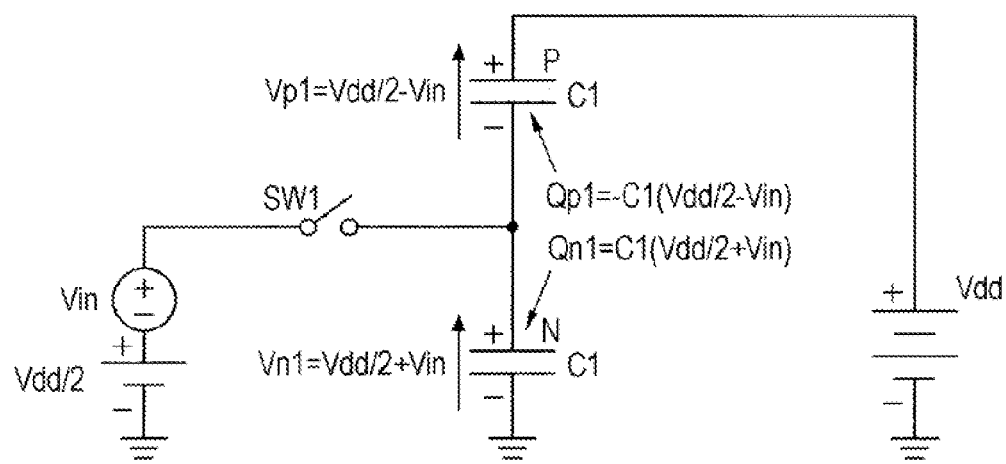
FIG. 6B is an explanatory diagram illustrating a Track state and Hold state with an amplifier according to an embodiment of the present invention.

First, as shown in FIG. 6A, when the switch SW1 is in the "ON" state, the bias voltage Vdd/2 and voltage signal Vin are input via the switch SW1, whereby Vp1=Vdd/2−Vin is applied to both ends of the first variable capacitance device P, and also Vn1=Vdd/2+Vin is applied to both ends of the second variable capacitance device N. Consequently, the first variable capacitance device P and the second variable capacitance device N accumulate charge.

In this state, in the event that the switch SW1 opens and is in a state where the bias voltage Vdd/2 and voltage signal Vin are not applied (Hold state), the following relations hold at the amplifier.

(1) The charge Qp1=−C1·Vp1=−C1(Vdd/2−Vin) immediately prior to the switch SW1 opening is held at the Gate terminal of the first variable capacitance device P (the terminal at the side connected to the switch SW1 in FIG. 6B).

(2) The charge Qn1=C1·Vn1=C1(Vdd/2+Vin) immediately prior to the switch SW1 opening is held at the Gate terminal of the second variable capacitance device N (the terminal at the side connected to the switch SW1 in FIG. 6B).

Now, the difference in charge between the Gate terminal of the first variable capacitance device P and the second variable capacitance device N is an amount proportionate to the voltage signal Vin.

Next, description will be made regarding the Boost state, with reference to FIG. 7A through FIG. 7C. FIG. 7A is a diagram illustrating the Hold state as with FIG. 6B, but is illustrated as a configuration with a switch SW0 not present in FIG. 6B, in order to describe movement of charge in the Boost state. Now, the switch SW0 is a switch for controlling connection between the first variable capacitance device P and the power source voltage source as shown in FIG. 7A through FIG. 7C, but is an imaginary switch for sake of description. That is to say, FIG. 6B and FIG. 7A are essentially identical.

With reference to FIG. 7A, the switch SW0 is open, so in the same way as with FIG. 6B, the charge of the Gate terminal of the first variable capacitance device P is Qp1=−C1·Vp1=−C1(Vdd/2−Vin), and also the charge at the Gate terminal of the second variable capacitance device N is Qn1=C1·Vn1=C1(Vdd/2+Vin). Note that other states are the same as with FIG. 6B.

In this state, let us consider a case wherein the capacitance of the first variable capacitance device P and the capacitance of the second variable capacitance device N are reduced to "1/k" times (i.e., the post-change capacitance C2=C1/k). At this time, the charge at the Gate terminal of the first variable capacitance device P can be represented as Qp1=−C1·Vp1=−C1(Vdd/2−Vin)=−kC2 (Vdd/2−Vin), and in the same way, the charge at the Gate terminal of the second variable capacitance device N can be represented as Qn1=C1·Vn1=C1(Vdd/2+Vin)=kC2 (Vdd/2+Vin).

Also, the voltage Vp2' impressed on both ends of the first variable capacitance device P is Vp2'=k(Vdd/2−Vin), and is amplified by being multiplied by the capacitance change ratio, i.e., k times. In the same way, the voltage Vn2' impressed on both ends of the second variable capacitance device N is Vn2'=k(Vdd/2+Vin), and is amplified by being multiplied by the capacitance change ratio, i.e., k times. Note that the principle of voltage amplification is the same as the principle with the discrete-time parametric amplifier shown in the above-described Expression 1.

Next, as shown in FIG. 7C, upon the switch SW0 being closed from the state in FIG. 7B, the first variable capacitance device P is connected to the power source voltage source. At this time, the power source voltage source Vdd is impressed on the first variable capacitance device P and the second variable capacitance device N, so the charge Q'=(k−1) C2·Vdd/2 moves from the first variable capacitance device P to the power source voltage source side. Simultaneously with moving of the charge Q', charge of an amount equivalent to the charge Q' disappears from the Gate terminal of the first variable capacitance device P and the second variable capacitance device N. That is to say, the charge at the Gate terminal of the first variable capacitance device P is Qp2=−C2(Vdd/2−kVin), and the charge at the Gate terminal of the second variable capacitance device N is Qp2=C2(Vdd/2+kVin).

Now, the difference in charge between the Gate terminal of the first variable capacitance device P and the second variable capacitance device N is held, so the voltage Vp2 impressed on both ends of the first variable capacitance device P is expressed with Expression 2, and the voltage Vn2 impressed on both ends of the second variable capacitance device N is expressed with Expression 3.

[Mathematical Expression 2]

$$Vp2=(Vdd/2)-k \cdot Vin=Vbias-k \cdot Vin \quad \text{(Expression 2)}$$

[Mathematical Expression 3]

$$Vn2=(Vdd/2)+k \cdot Vin=Vbias+k \cdot Vin \quad \text{(Expression 3)}$$

Accordingly, with the amplifier according to an embodiment of the present invention, unlike the conventional MOSFET parametric amplifier 10 where the bias voltage and voltage signal are amplified together while still in a superimposed state, the voltage signal Vin is amplified k (capacitance change ratio) times, but the bias voltage Vdd/2=Vbias is not amplified. Accordingly, with the amplifier according to an embodiment of the present invention, the output voltage is not unnecessarily great as with the conventional MOSFET parametric amplifier 10, so the probability of the three problems of the conventional MOSFET parametric amplifier 10 described above occurring can be made very small, thereby contributing to finer circuits and lower electric power consumption.

Note that with the above, description has been made that with regard to the first variable capacitance device P an the second variable capacitance device N, the terminals at the side connected to the switch SW1 in FIG. 6A through FIG. 7C are respectively the Gate terminal of the first variable capacitance device P and the second variable capacitance device N. However, the principle of amplification with the amplifier according to the present invention is not restricted to the above-described case, and can be applied, for example, to a case wherein the terminals on the side connected to the switch SW1 in FIG. 6A through FIG. 7C are the Source terminal and Drain terminal of the first variable capacitance device P and the Source terminal and Drain terminal of the second variable capacitance device, respectively.

Now, for a case wherein the terminals on the side connected to the switch SW1 in FIG. 6A through FIG. 7C are the Source terminal and Drain terminal of the first variable capacitance device P and the Source terminal and Drain terminal of the second variable capacitance device, respectively, all that is necessary is to interchange the first variable capacitance device P and the second variable capacitance device N in FIG. 6A through FIG. 7C, for example. Due to the configuration described above for example, the amplifier according to an embodiment of the present invention allows the probability of the three problems of the conventional MOSFET parametric amplifier 10 described above occurring to be made very small, thereby contributing to finer circuits and lower electric power consumption. Note that it is needless to say that the amplifier according to the present invention is not restricted to a configuration having a Gate terminal, a Source terminal, and a Drain terminal.

Also, the terminals at the side connected to the switch SW1 will be described below as the Gate terminal of the first variable capacitance device P and the Gate terminal of the second variable capacitance device N, respectively.

(Amplifying Method Using the Amplification Principle According to the Present Invention)

Figure 8:
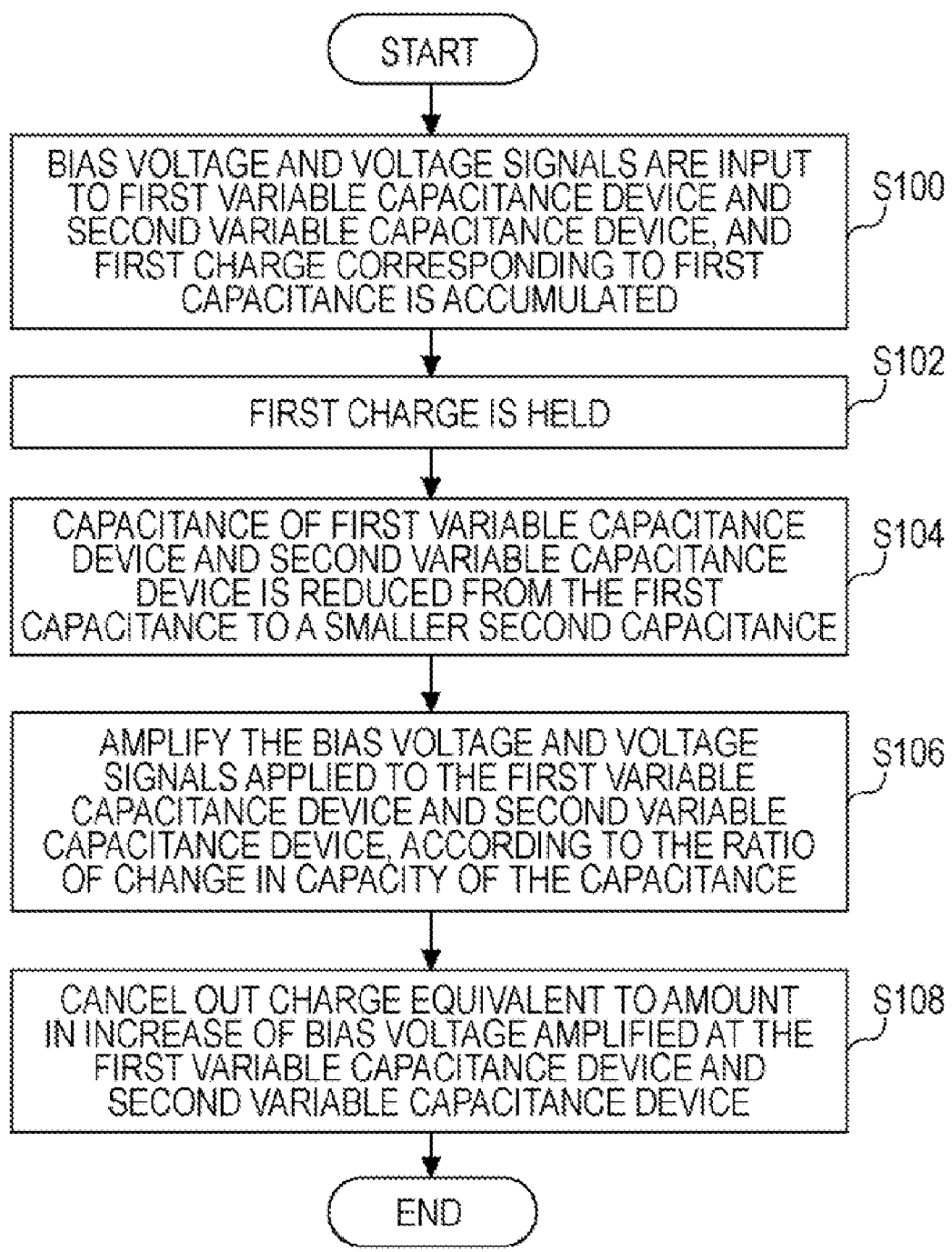
FIG. 8 is a flowchart illustrating an amplifying method using the principle of amplification according to the present invention.

An amplifying method according to an embodiment of the present invention based on the above principle will be described with reference to FIG. 8. FIG. 8 is a flowchart illustrating an amplifying method using the amplification principle according to the present invention.

Bias voltage and voltage signals are input, and a first charge corresponding to a first capacitance is accumulated in the first variable capacitance device and the second variable capacitance device (S100)

Input of the above bias voltage and voltage signals is stopped, and the charge accumulated in step S100 is held (S102). At this time, a voltage equivalent to the above bias voltage and the above voltage signal is impressed on the first variable capacitance device and the second variable capacitance device.

The capacitance of the first variable capacitance device and the second variable capacitance device is reduced from the first capacitance to a second capacitance which is smaller than the first capacitance, while still holding the charge held in step S102 (S104).

The bias voltage and voltage signal applied to the first variable capacitance device and the second variable capacitance device are amplified in accordance with the capacitance change ratio (first capacitance/second capacitance) of the change in capacitance in step S104 (S106).

The charge equivalent to the amount of amplification of bias voltage, amplified at the first variable capacitance device and the second variable capacitance device in step S106, is cancelled out (S108). Now, canceling out of the charge equivalent to the amount of amplification of the above bias voltage occurs by the power source voltage Vdd being impressed on the first variable capacitance device and the second variable capacitance device.

The amplifying method using the amplification principle according to the present invention amplifies, of the bias voltage and voltage signals input to the amplifier, the voltage signals, by the above step S100 through S108.

Note that in step S104, the capacitance of the first variable capacitance device and the second variable capacitance device is reduced from the first capacitance to a second capacitance which is smaller than the first capacitance, but is not restricted to this, and the capacitance of the first variable capacitance device and the second variable capacitance device may be increased from the first capacitance to a third capacitance which is greater than the first capacitance. In this case, in step S106 the bias voltage and voltage signal impressed on the first variable capacitance device and second variable capacitance device are attenuated.

First Embodiment

Figure 9A:
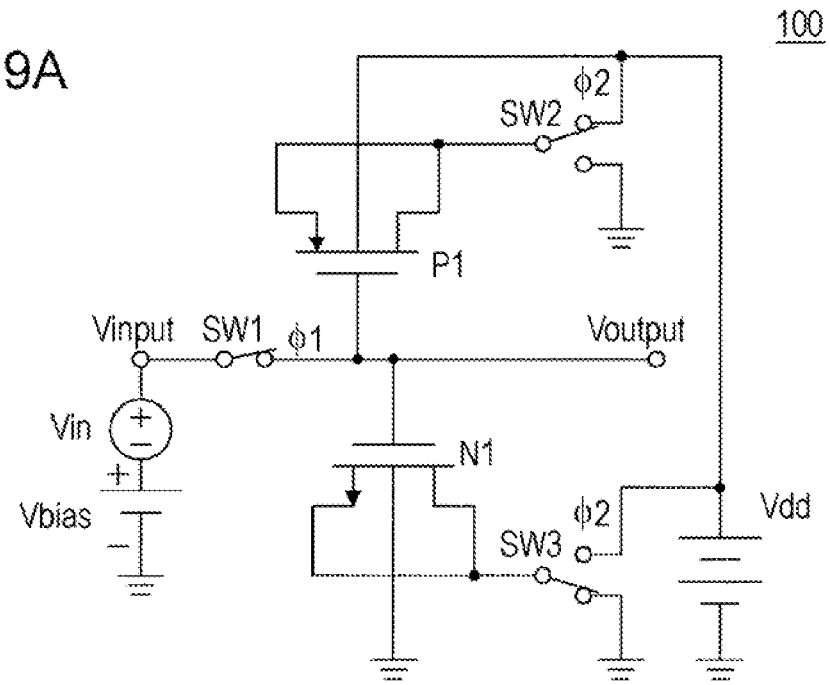
FIG. 9A is an explanatory diagram illustrating an amplifier according to a first embodiment of the present invention.
Figure 9B:
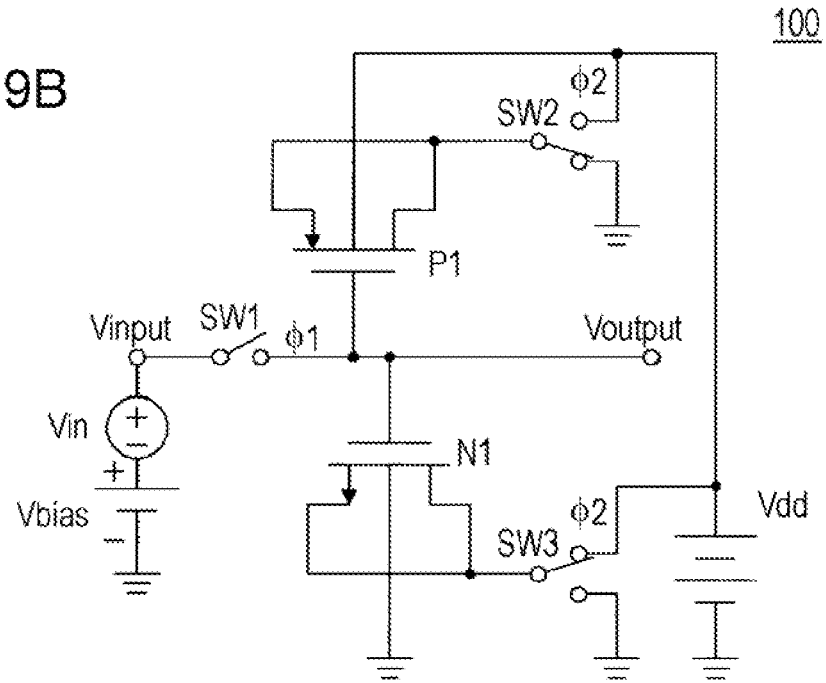
FIG. 9B is an explanatory diagram illustrating an amplifier according to the first embodiment of the present invention.

Next, an embodiment of an amplifier according to the present invention using the above-described amplification principle according to the present invention will be described with reference to FIG. 9A through FIG. 10. FIG. 9A and FIG. 9B are explanatory diagrams illustrating an amplifier 100 according to a first embodiment of the present invention, with FIG. 9A illustrating the Track state of the amplifier 100, and FIG. 9B illustrating the Boost state of the amplifier 100.

Also, FIG. 10($a$) is a diagram illustrating control clock signals for controlling switches of FIG. 9A and FIG. 9B, FIG. 10($b$) is a diagram illustrating an input voltage signal Vinput input to the amplifier 100 according to the first embodiment of the present invention, and FIG. 10($c$) is a diagram illustrating an output voltage signal Voutput output from the amplifier 100 according to the first embodiment of the present invention.

With reference to FIG. 9A and FIG. 9B, the amplifier 100 according to the first embodiment of the present invention is configured of a CMOS having a p-MOS varactor P1 and n-MOS varactor N1. Now, the p-MOS varactor P1 and n-MOS varactor N1 change in capacitance depending on whether or not there is an inversion layer, as with the MOS-FET shown in FIG. 2A and FIG. 2B.

The bias voltage Vbias and voltage signal Vin are input to the Gate terminal of the p-MOS varactor P1 and n-MOS varactor N1, in accordance with the connection state of the switch SW1. Also, the Source terminal and Drain terminal of the p-MOS varactor P1 are connected to the power source voltage source and the ground in accordance with the connection state of the switch SW2, and the Source terminal and Drain terminal of the n-MOS varactor N1 are connected to the power source voltage source and the ground in accordance with the connection state of the switch SW3. Now, the p-MOS varactor P1 and n-MOS varactor N1 have inverse conductivity, so in order to match the increase/decrease change of capacitance of the p-MOS varactor P1 and n-MOS varactor N1, in the event that the switch SW2 is connected to the power source voltage source the switch SW3 is connected to the ground, and in the event that the switch SW2 is connected to the ground the switch SW3 is connected to the power source voltage source.

Now, the switch SW1 synchronizes with the clock signal $\phi 1$ shown in FIG. 10($a$), so as to close when the clock signal $\phi 1$ is high, and input the bias voltage Vbias and voltage signal Vin to the Gate terminals of the p-MOS varactor P1 and n-MOS varactor N1. Also, the switch SW1 opens when the clock signal $\phi 1$ is low, thereby controlling input of the bias voltage Vbias and voltage signal Vin to the Gate terminals of the p-MOS varactor P1 and n-MOS varactor N1. Note that the relation between the clock signal $\phi 1$ and the switch SW1 is not restricted to the above, and the switch SW1 may close when the clock signal $\phi 1$ is low. Also, while various embodiments relating to the present invention will be described, the relation between clock signals and switches are not restricted, in the same way as with the above relation between the clock signal $\phi 1$ and switch SW1.

The switch SW2 synchronizes with the clock signal $\phi 2$ shown in FIG. 10($a$), so as to be connected to the ground when the clock signal $\phi 2$ is high, and connected to the power source voltage source when the clock signal $\phi 2$ is low. Also, the switch SW3 synchronizes with the clock signal $\phi 2$, so as to be connected to the power source voltage source when the clock signal $\phi 2$ is high, and connected to the ground when the clock signal $\phi 2$ is low. Now, as shown in FIG. 10($a$), the clock signal $\phi 1$ and clock signal $\phi 2$ are input such that the phases thereof do not overlap. A Track state, Hold state, and Boost state are created at the amplifier 100 according to the first embodiment of the present invention by keeping the relation of passes of the clock signal $\phi 1$ and the clock signal $\phi 2$ from overlapping.

Also, the input voltage signal Vinput input to the amplifier 100 according to the first embodiment of the present invention is a signal wherein the bias voltage Vbias and voltage signal Vin are superimposed, as shown in FIG. 10($b$).

With reference to FIG. 9A, in the Track state, the input voltage signal Vinput is input to the Gate terminals of the p-MOS varactor P1 and n-MOS varactor N1 by the switch SW1 closing synchronously with the clock signal $\phi 1$. Also, the capacitance of the p-MOS varactor P1 and n-MOS varactor N1 increases due to the switch SW2 being connected to the power source voltage source synchronously with the clock signal $\phi 2$, and the switch SW3 being connected to the ground synchronously with the clock signal $\phi 2$. Accordingly, the voltage at the Gate terminals of the p-MOS varactor P1 and n-MOS varactor N1 changes in accordance with the input voltage signal Vinput, and charge corresponding to the input voltage signal Vinput is accumulated in the p-MOS varactor P1 and n-MOS varactor N1.

Next, with reference to FIG. 9B, in the Boost state, the input voltage signal Vinput is not input to the Gate terminals of the p-MOS varactor P1 and n-MOS varactor N1 due to the switch SW1 opening synchronously with the clock signal $\phi 1$, also, the switch SW2 is connected to the ground synchronously with the clock signal φ2, and the switch SW3 is connected to the power source voltage source synchronously with the clock signal φ2, whereby the capacitance of the p-MOS varactor P1 and n-MOS varactor N1 decreases. At this time, the Gate terminals of the p-MOS varactor P1 and n-MOS varactor N1 hold a charge, so the voltage signal Vin is amplified by being multiplied by the capacitance change ratio, with the magnitude of the bias voltage Vbias being held as it is. Accordingly, as shown in FIG. 10(c), the output voltage Voutput of the amplifier 100 according to the first embodiment of the present invention assumes a waveform wherein the voltage signal Vin has been amplified by being multiplied by the capacitance change ratio, with the magnitude of the bias voltage Vbias being held as it is, as to the input voltage signal Vinput. Now, the output voltage Voutput is smaller than the power source voltage Vdd, so there is no distortion output voltage as with the conventional MOSFET parametric amplifier 10. Note that while not illustrated in FIG. 9A and FIG. 9B, having the clock signal φ2 to rise following the clock signal φ1 falling as shown in FIG. 10(a) causes transition from the Track state shown in FIG. 9A via the Hold state to the Boost state shown in FIG. 9B.

Accordingly, with the amplifier 100 according to the first embodiment of the present invention, an output voltage signal, wherein a voltage signal has been amplified by being multiplied by the capacitance change ratio with the magnitude of the bias voltage being held as it is as to the input voltage signal, can be output, so the output voltage signal never becomes unnecessarily great. Accordingly, a circuit having the amplifier according to the first embodiment of the present invention no longer needs to be provided with special measures regarding output voltage signals of the amplifier according to the first embodiment of the present invention, making handling of the output voltage signals easier, and also enabling contribution to finer circuits and lower electric power consumption. Further, the probability of the magnitude of the output voltage signal becoming greater than the power source voltage Vdd can be made very small, so there is no distortion in output voltage signals, and desired output voltage signals can be obtained.

Modification of First Embodiment

With the amplifier 100 according to the first embodiment of the present invention shown in FIG. 9A and FIG. 9B, a configuration has been illustrated wherein the Gate terminals of the p-MOS varactor P1 and n-MOS varactor N1 are connected to the switch SW1, the Source terminal and Drain terminal of the p-MOS varactor P1 are each connected to the switch SW2, and the Source terminal and Drain terminal of the n-MOS varactor N1 are each connected to the switch SW3. However, the configuration of the amplifier according to the first embodiment of the present invention is not restricted to the above. For example, the amplifier according to the first embodiment of the present invention may have the Source terminal and Drain terminal of the p-MOS varactor P1 and the Source terminal and Drain terminal of the n-MOS varactor N1 each connected to the switch SW1, with the Gate terminal of the n-MOS varactor N1 connected to the switch SW2 and the Gate terminal of the p-MOS varactor P1 connected to the switch SW3.

Now, the p-MOS varactor P1 and n-MOS varactor N1 have inverse conductivity. Accordingly, in order to match the increase/decrease change of capacitance, as with the case of the amplifier 100, (1) in the event that the switch SW2 is connected to the power source voltage source the switch SW3 is connected to the ground, and, (2) in the event that the switch SW2 is connected to the ground the switch SW3 is connected to the power source voltage source.

With the above configuration as well, a Track state, Hold state, and Boost state can be created at the amplifier 100, so the voltage signal Vin can be amplified by being multiplied by the capacitance change ratio, with the magnitude of the bias voltage Vbias being held as it is, as shown in Expressions 2 and 3.

Thus, with the amplifier according to the first embodiment of the present invention, an output voltage signal, wherein a voltage signal has been amplified by being multiplied by the capacitance change ratio with the magnitude of the bias voltage being held as it is as to the input voltage signal, can be output, so the output voltage signal never becomes unnecessarily great. Accordingly, a circuit having the amplifier according to the first embodiment of the present invention no longer needs to be provided with special measures regarding output voltage signals of the amplifier according to the first embodiment of the present invention, making handling of the output voltage signals easier, and also enabling contribution to finer circuits and lower electric power consumption. Further, the probability of the magnitude of the output voltage signal becoming greater than the power source voltage Vdd can be made very small, so there is no distortion in output voltage signals, and desired output voltage signals can be obtained.

Second Embodiment

Figure 11:
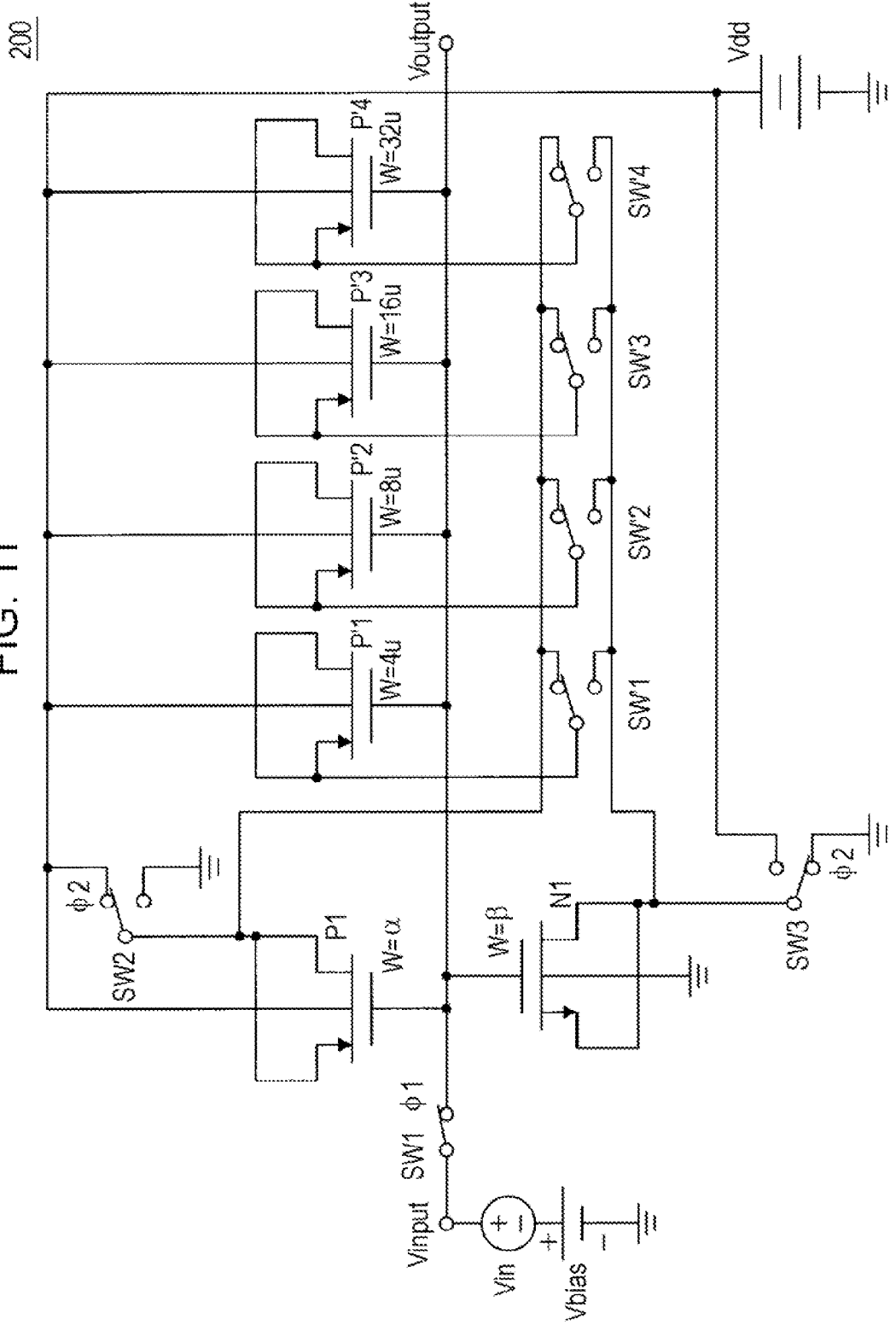
FIG. 11 is an explanatory diagram illustrating an amplifier according to a second embodiment of the present invention.

As described with the amplification principle of the amplifier according to embodiments of the present invention, with the amplifier according to embodiments of the present invention, the same amount of charge is eliminated at the Gate terminal of the first variable capacitance device P and the Gate terminal of the second variable capacitance device N, so the voltage signal is amplified by being multiplied by the capacitance change ratio, while maintaining the magnitude of bias voltage. Accordingly, it is preferable that the area of the Gate terminal of the first variable capacitance device P and the area of the Gate terminal of the second variable capacitance device are the same. However, in actual manufacturing processes, there are cases wherein the area of the Gate terminal of the first variable capacitance device P and the area of the Gate terminal of the second variable capacitance device do not agree, due to irregularities in manufacturing of the devices. Accordingly, next, a second embodiment wherein the area of the Gate terminal of the first variable capacitance device P and the area of the Gate terminal of the second variable capacitance device can be adjusted, will be described. FIG. 11 is an explanatory diagram illustrating an amplifier 200 according to a second embodiment of the present invention.

As shown in FIG. 11, the amplifier 200 according to the second embodiment of the present invention has the same basic configuration as that of the amplifier 100 according to the first embodiment, further provided with multiple adjusting p-MOS varactors P'1 through P'4 having minute gate widths being provided in parallel to the p-MOS varactor P1. The gate width of the p-MOS varactor P1 is W=α, and the gate width of the n-MOS varactor N1 is W=β. Also, the gate width of the adjusting p-MOS varactor P'1 is W=4[μm], and in the same way, the gate widths of the adjusting p-MOS varactors P'2 through P'4 are W=8[μm], 16[μm], and 32[μm]. Here, for sake of description, we will assume that the gate lengths of the p-MOS varactor P1, n-MOS varactor N1, and p-MOS varactors P'1 through P'4 are 1[μm].

The Gate terminals of the adjusting p-MOS varactors P'1 through P'4 are connected to the switch SW1, and the bias voltage Vbias and voltage signal Vin are input in accordance with the connection state of the switch SW1. Further, the varactors P'1 through P'4 have the following relations.
(1) The Source terminal and Drain terminal of the adjusting p-MOS varactor P'1 is connected to the power source voltage source in accordance with the connection state of the switch SW'1, and in the same way,
(2) the Source terminals and Drain terminals of the adjusting varactors P'2 through P'4 are connected to the power source voltage source in accordance with the connection state of the switches SW'2 through SW'4.

In the event that each of the switches SW'1 through SW'4 have the same polarity as the p-MOS varactor P1, i.e., with the same connection destination as the SW2, the area of the Gate terminal of the p-MOS varactor P1 increases. For example, as shown in FIG. 11, in the event that the switch SW2 and the switches SW'1 through SW'4 are connected to the power source voltage source, the area Sp of the Gate terminal of the p-MOS varactor P1 is, based on Sp=α, Sp'=α+(4+8+16+32)=α+60 [μm2], which is maximal. Also, in the event that the switch SW2 and the switches SW'1 through SW'3 are connected to the power source voltage source, and the switch SW'4 is connected to the ground, the area Sp of the Gate terminal of the p-MOS varactor P1 is Sp'=α+(4+8+16)=α+28 [μm2]. As described above, with the amplifier 200 according to the second embodiment of the present invention, appropriately independently switching the connections of the switches SW'1 through SW'4 enables the area Sp of the Gate terminal of the p-MOS varactor P1 to be indirectly changed. Accordingly, the area ratio Sn/Sp value between the area Sp of the Gate terminal of the first variable capacitance device P and the area Sn=β of the Gate terminal of the second variable capacitance device N can be precisely or approximately adjusted to 1.

Now, in FIG. 11, the gate widths of the p-MOS varactors P'1 through P'4 are weighted with powers of two, the reason thereof being for bit control of the area Sp of the Gate terminal of the first variable capacitance device P. For example, in an event of employing the configuration in FIG. 11, 4-bit control, i.e., area Wp of the Gate terminal of the first variable capacitance device P, can be varied in 16 ways. As a matter of course, control of the area Wp of the Gate terminal of the first variable capacitance device P is not restricted to the above-described, and the gate widths of the p-MOS varactors P'1 through P'4 can be arbitrarily set.

Also, in FIG. 11, the area Sp of the Gate terminal of the first variable capacitance device P was indirectly changed by changing the polarity of voltage to be impressed on the Source terminals and Drain terminals of the adjusting p-MOS varactors P'1 through P'4, in a state wherein the Gate terminals of the adjusting varactors P'1 through P'4 are connected. However, the area Sp of the Gate terminal of the first variable capacitance device P may be indirectly changed by providing switches at the Gate terminal side of the adjusting varactors P'1 through P'4.

Accordingly, the amplifier 200 according to the second embodiment of the present invention is capable of adjusting the area ratio between the area of the Gate terminal of the first variable capacitance device P and the area of the Gate terminal of the second variable capacitance device N. Accordingly, even in the event the area of the Gate terminal of the first variable capacitance device P and the area of the Gate terminal of the second variable capacitance device N differ due to irregularities among devices, the magnitude of the bias voltage included in the input voltage signal can be maintained.

Thus, with the amplifier 200 according to the second embodiment of the present invention, in the same way as with the amplifier 100 according to the first embodiment of the present invention, an output voltage signal, wherein a voltage signal has been amplified by being multiplied by the capacitance change ratio with the magnitude of the bias voltage being held as it is as to the input voltage signal, can be output, so the output voltage signal never becomes unnecessarily great. Accordingly, a circuit having the amplifier 200 according to the second embodiment of the present invention no longer needs to be provided with special measures regarding output voltage signals of the amplifier 200 according to the second embodiment of the present invention, making handling of the output voltage signals easier, and also enabling contribution to finer circuits and lower electric power consumption. Further, the probability of the magnitude of the output voltage signal becoming greater than the power source voltage Vdd can be made very small, so there is no distortion in output voltage signals, and desired output voltage signals can be obtained.

Also, while FIG. 11 shows a configuration wherein the area of the Gate terminals of the first variable capacitance device P is adjusted, the arrangement is not restricted to the above-described, and arrangements may be made, for example, wherein multiple adjusting n-MOS varactors with very small gate widths are provided for adjusting the area of the Gate terminal of the second variable capacitance device N, or wherein both the area of the Gate terminal of the first variable capacitance device P and the area of the Gate terminal of the second variable capacitance device N are adjusted.

Third Embodiment

Figure 12:
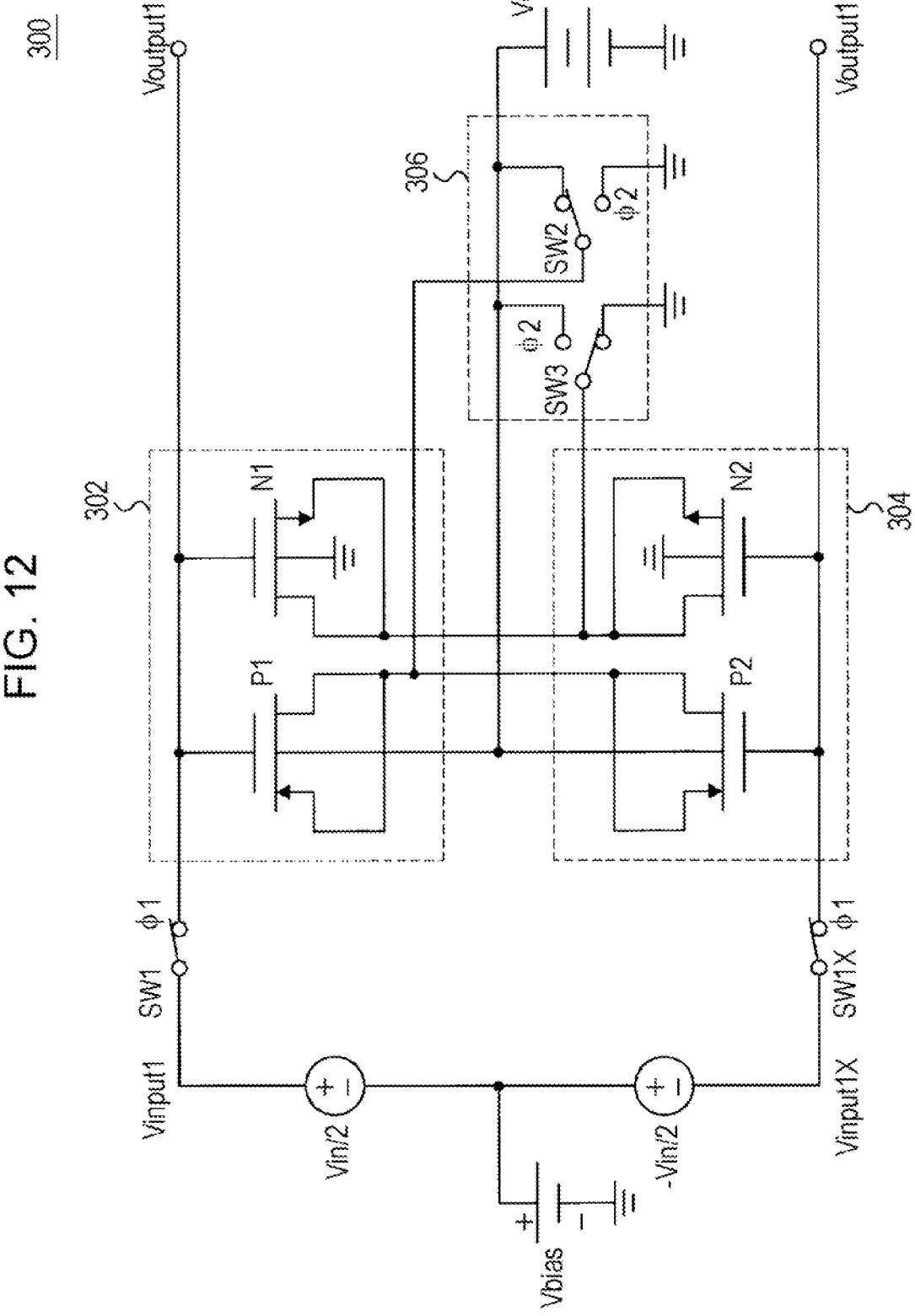
FIG. 12 is an explanatory diagram illustrating an amplifier according to a third embodiment of the present invention.

Next, a differential amplifying circuit using the principle of amplification according to the present invention will be described as a third embodiment of the present invention. FIG. 12 is an explanatory diagram illustrating an amplifier 300 according to the third embodiment of the present invention.

Figure 13:
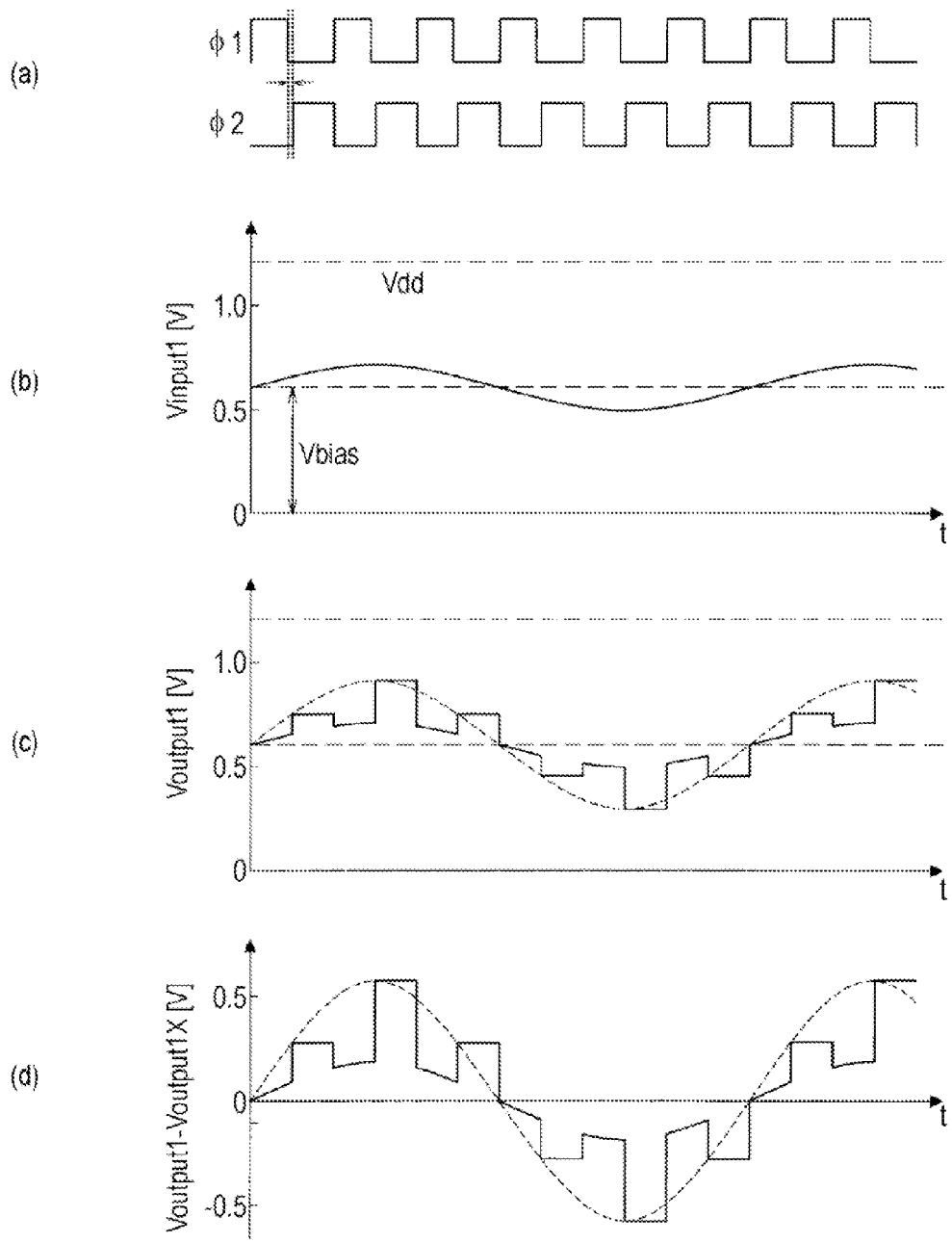
FIG. 13 is an explanatory diagram illustrating the waveform of signals according to the third embodiment shown in FIG. 12.

Also, FIG. 13 is an explanatory diagram illustrating waveforms according to the third embodiment of the present invention shown in FIG. 12. Here, FIG. 13(a) is a diagram illustrating control clock signals for controlling switches in FIG. 12, and FIG. 13(b) is a diagram illustrating a positive phase input voltage signal Vinput1 input to the amplifier 300 according to the third embodiment of the present invention. Also, FIG. 13(c) is a diagram illustrating a positive phase output voltage signal Voutput1 output from the amplifier 300 according to the third embodiment of the present invention, and FIG. 13(d) is a diagram illustrating a differential output voltage signal Voutput1−Voutput1X output from the amplifier 300 according to the third embodiment of the present invention. Now, the Voutput1X in the differential output voltage signal Voutput1−Voutput1X is an inverse phase output voltage signal wherein the phase has been inverted from that of the positive phase output voltage signal Voutput1.

With reference to FIG. 12, the amplifier 300 according to the third embodiment of the present invention includes a first amplifying unit 302 to which the positive phase input voltage signal Vinput1, obtained by superimposing the bias voltage Vbias and positive phase voltage signal Vin/2 in accordance with the connection state of the switch SW1, a second amplifying unit 304 to which the inverse phase input voltage signal VinputX, obtained by superimposing the bias voltage Vbias and inverse phase voltage signal −Vin/2 in accordance with the connection state of a switch SW1X, and a switching unit 306 for connecting the first amplifying unit 302 and second amplifying unit 304 to the power source voltage source or the ground. Here, the inverse phase input voltage signal Vinput1X is a signal wherein the phase has been inverted from that of the positive phase input voltage signal Vinput1.

The first amplifying unit 302 and the first amplifying unit 304 are of the same configuration as the amplifier 100 according to the first embodiment of the present invention described above. The first amplifying unit has a p-MOS varactor P1 and n-MOS varactor N1, with the positive phase input voltage signal Vinput1 being input to the Gate terminals of the p-MOS varactor P1 and n-MOS varactor N1 in accordance with the connection state of the switch SW1. Also, the second amplifying unit has a p-MOS varactor P2 and n-MOS varactor N2, with the inverse phase input voltage signal Vinput1X being input to the Gate terminals of the p-MOS varactor P2 and n-MOS varactor N2 in accordance with the connection state of the switch SW1X.

The switching unit 306 includes switches SW2 and SW3, with the switch SW2 connecting the n-MOS varactor N1 and the n-MOS varactor N2 to the power source voltage source or the ground, and the switch SW3 connecting the p-MOS varactor P1 and the p-MOS varactor P2 to the power source voltage source or the ground. Now, the p-MOS varactors P1 and P2 and the n-MOS varactors N1 and N2 have inverse conductivity, so in order to match the increase/decrease change of capacitance of the p-MOS varactors P1 and P2 and the n-MOS varactors N1 and N2, in the event that the switch SW2 is connected to the ground the switch SW3 is connected to the power source voltage source, and in the event that the switch SW2 is connected to the power source voltage source the switch SW3 is connected to the ground.

Now, the switch SW1 operates synchronously with the clock signal $\phi 1$ shown in FIG. 13($a$), so as to close when the clock signal $\phi 1$ is high, and input the positive phase input voltage signal Vinput1 shown in FIG. 13($b$) to the Gate terminals of the p-MOS varactor P1 and n-MOS varactor N1. Also, the switch SW1 opens when the clock signal $\phi 1$ is low, thereby controlling input of the positive phase input voltage signal Vinput1 to the Gate terminals of the p-MOS varactor P1 and n-MOS varactor N1.

Also, the switch SW1X operates synchronously with the clock signal $\phi 1$ shown in FIG. 13($a$), so as to close when the clock signal $\phi 1$ is high, and input the inverse phase input voltage signal Vinput1X to the Gate terminals of the p-MOS varactor P2 and n-MOS varactor N2. Also, the switch SW1X opens when the clock signal $\phi 1$ is low, thereby controlling input of the positive phase input voltage signal Vinput1X to the Gate terminals of the p-MOS varactor P2 and n-MOS varactor N2.

Also, the switch SW2 operates synchronously with the clock signal $\phi 2$ shown in FIG. 13($a$), so as to connect the n-MOS varactors N1 and N2 to the ground when the clock signal $\phi 2$ is low, and to connect the n-MOS varactors N1 and N2 to the power source voltage source when the clock signal $\phi 2$ is high. The switch SW3 operates synchronously with the clock signal $\phi 2$ shown in FIG. 13($a$), so as to connect the p-MOS varactors P1 and P2 to the power source voltage source when the clock signal $\phi 2$ is low, and to connect the p-MOS varactors P1 and P2 to the ground when the clock signal $\phi 2$ is high.

In the same way as with the amplifier 100 according to the first embodiment of the present invention described above, the first amplifying unit 302 makes transition through the Track state, Hold state, and Boost state, based on the clock signals $\phi 1$ and $\phi 2$ shown in FIG. 13($a$), thereby outputting the positive phase output voltage signal Voutput1 shown in FIG. 13($c$), wherein the bias voltage Vbias has been maintained and the positive phase voltage signal Vin/2 has been amplified by being multiplied by the capacitance change ratio.

In the same way, the second amplifying unit 304 makes transition through the Track state, Hold state, and Boost state, based on the clock signals $\phi 1$ and $\phi 2$ shown in FIG. 13($a$), thereby outputting the inverse phase output voltage signal Voutput1X wherein the bias voltage Vbias has been maintained and the inverse phase voltage signal −Vin/2 has been amplified by being multiplied by the capacitance change ratio.

Now, the positive output voltage signal Voutput1 and the inverse output voltage signal Voutput1X are used as the differential output voltage signal Voutput1−Voutput1X shown in FIG. 13($d$).

Accordingly, a circuit having the amplifier 300 according to the third embodiment of the present invention can cancel out noise (distortion when even) generated in the positive output voltage signal Voutput1 and the inverse output voltage signal Voutput1X, by taking the positive output voltage signal Voutput1 and the inverse output voltage signal Voutput1X output from the amplifier 300 according to the third embodiment of the present invention as the differential output voltage signal Voutput1−Voutput1X shown in FIG. 13($d$).

Also, with the amplifier 300 according to the third embodiment of the present invention, a positive phase output voltage signal, wherein a positive phase voltage signal has been amplified by being multiplied by the capacitance change ratio with the magnitude of the bias voltage being held as it is as to the positive phase input voltage signal, can be output, so the positive phase output voltage signal never becomes unnecessarily great. In the same way, an inverse positive phase output voltage signal, wherein an inverse phase voltage signal has been amplified by being multiplied by the capacitance change ratio with the magnitude of the bias voltage being held as it is as to the inverse phase input voltage signal, can be output, so the inverse phase output voltage signal never becomes unnecessarily great. Accordingly, a circuit having the amplifier 300 according to the third embodiment of the present invention no longer needs to be provided with special measures regarding differential output voltage signals of the amplifier 300 according to the third embodiment of the present invention, making handling of the differential output voltage signals easier, and also enabling contribution to finer circuits and lower electric power consumption. Further, the probability of the magnitude of the differential output voltage signal becoming greater than the power source voltage Vdd can be made very small, so there is no distortion in differential output voltage signals, and desired differential output voltage signals can be obtained.

Fourth Embodiment

Figure 14:
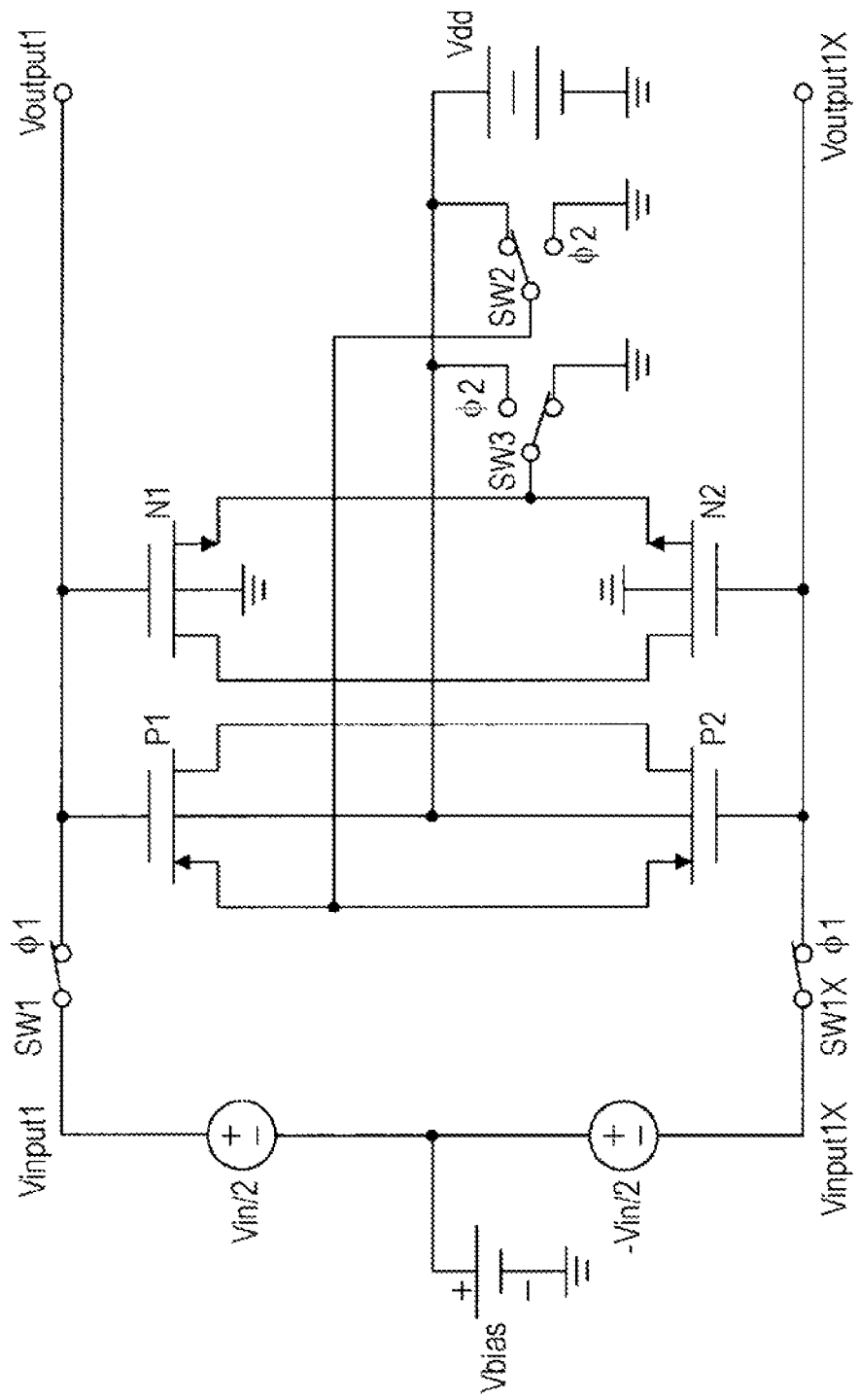
FIG. 14 is an explanatory diagram illustrating an amplifier according to a fourth embodiment of the present invention.

FIG. 14 is a diagram illustrating an amplifier 400 according to a fourth embodiment of the present invention.

With reference to FIG. 14, the amplifier 400 according to the fourth embodiment of the present invention is basically of the same configuration as the amplifier 300 according to the third embodiment of the present invention, configuring a differential amplifying circuit. Also, in comparison with the amplifier 300 according to the third embodiment of the present invention shown in FIG. 12, with the amplifier 400 according to the fourth embodiment of the present invention, the Drain terminals of the p-MOS varactor P1 and the p-MOS varactor P2 are mutually connected, but the Drain terminals of each of the above p-MOS varactors and the Source terminals of the p-MOS varactor P1 and the p-MOS varactor P2 are not connected. Also, while the drain terminals of the n-MOS varactor N1 and the n-MOS varactor N2 are mutually connected, the Drain terminals of each of the n-MOS varactors and the Source terminals of each of the n-MOS varactor N1 and the n-MOS varactor N2 are not connected. With such a configuration as described above as well, the capacitance of the p-MOS varactor P1, p-MOS varactor P2, n-MOS varactor N1, and n-MOS varactor N2 can be varied by changing the inversion layer by impressing power source voltage Vdd to on of the Source terminal or Drain terminal.

Accordingly, the wiring of the with the amplifier 400 according to the fourth embodiment of the present invention can be simplified as compared with that of the amplifier 300 according to the third embodiment of the present invention, and also, the switches SW2 and SW3 are connected only with the Source terminals of the p-MOS varactors P1 and P2 and n-MOS varactors N1 and N2, so the load on the switches SW2 and SW3 can be alleviated.

Also, with the amplifier 400 according to the fourth embodiment of the present invention, as with the amplifier 300 according to the third embodiment of the present invention, a positive phase output voltage signal, wherein a positive phase voltage signal has been amplified by being multiplied by the capacitance change ratio with the magnitude of the bias voltage being held as it is as to the positive phase input voltage signal, can be output, so the positive phase output voltage signal never becomes unnecessarily great. In the same way, an inverse positive phase output voltage signal, wherein an inverse phase voltage signal has been amplified by being multiplied by the capacitance change ratio with the magnitude of the bias voltage being held as it is as to the inverse phase input voltage signal, can be output, so the inverse phase output voltage signal never becomes unnecessarily great. Accordingly, a circuit having the amplifier 400 according to the fourth embodiment of the present invention no longer needs to be provided with special measures regarding differential output voltage signals of the amplifier 400 according to the fourth embodiment of the present invention, making handling of the differential output voltage signals easier, and also enabling contribution to finer circuits and lower electric power consumption. Further, the probability of the magnitude of the differential output voltage signal becoming greater than the power source voltage Vdd can be made very small, so there is no distortion in differential output voltage signals, and desired differential output voltage signals can be obtained.

Also, while a configuration is shown in FIG. 14 wherein the switches SW2 and SW3 are connected only to the Source terminals of the p-MOS varactors P1 and P2 and the n-MOS varactors N1 and N2, this is not restricted to the above-described, and a configuration may be made wherein the switches SW2 and SW3 are connected only to the Drain terminals of the p-MOS varactors P1 and P2 and the n-MOS varactors N1 and N2.

Fifth Embodiment

Figure 15:
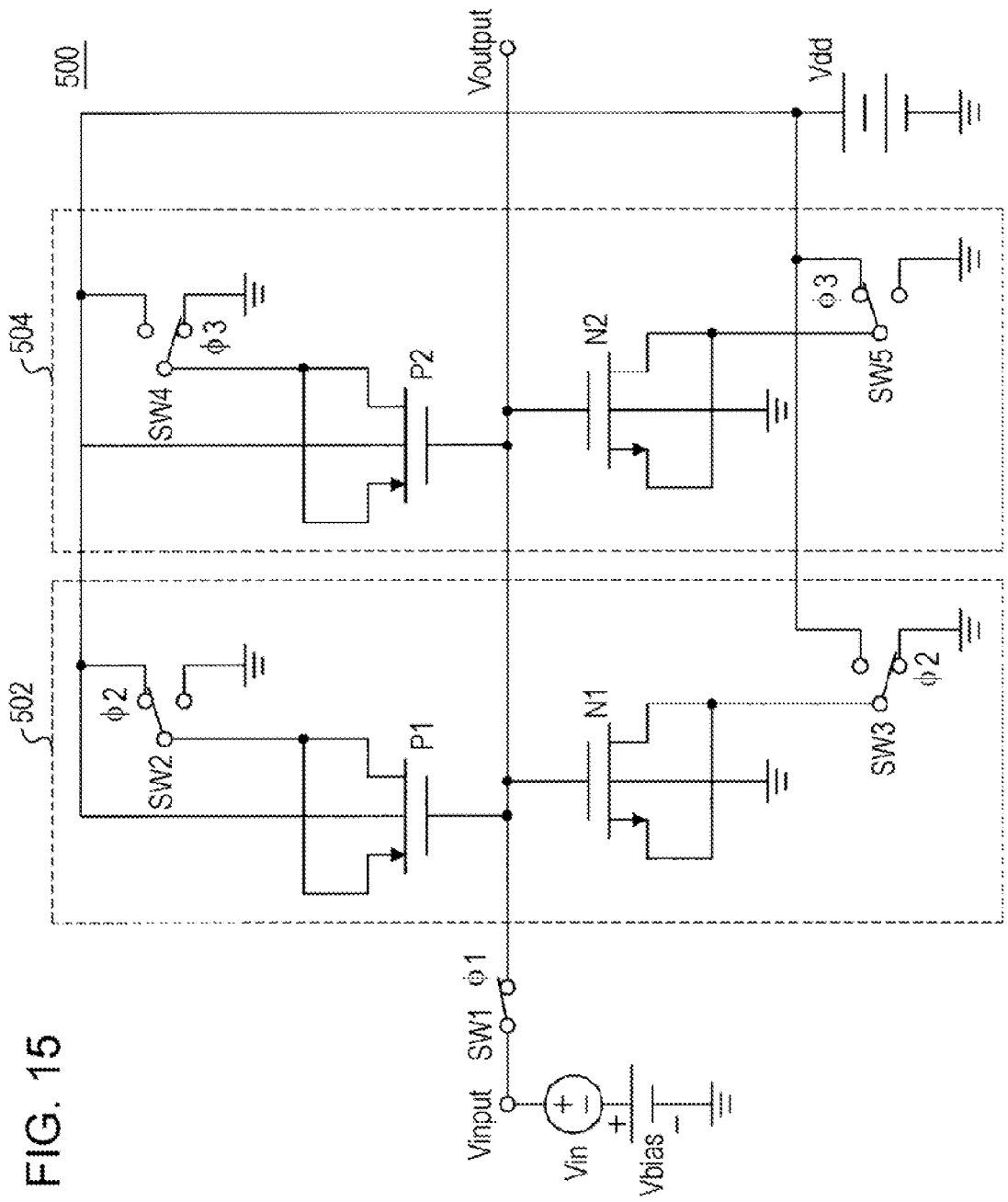
FIG. 15 is an explanatory diagram illustrating an amplifier according to a fifth embodiment of the present invention.

As shown in Expression 1, a discrete-time parametric amplifier can amplify or attenuate signals by capacitance change ratio. Accordingly, next, description will be made regarding an amplifier according to a fifth embodiment of the present invention, which is capable of switching over the gain of output voltage signals in the process of transition from the Track state to the Boost state via the Hold state, by combining cases wherein the capacitance of p-MOS varactors and n-MOS varactors increases and cases wherein the capacitance thereof decreases. FIG. 15 is an explanatory diagram illustrating an amplifier 500 according to the fifth embodiment of the present invention. Here, FIG. 15 illustrates a Track state.

With reference to FIG. 15, the amplifier 500 according to the fifth embodiment of the present invention has a first amplifying unit 502 and second amplifying unit 504 to which an input voltage signal Vinput wherein the bias voltage Vbias and voltage signal Vin have been superimposed is input in accordance with the connection state of the switch SW1. Here, the first amplifying unit 502 and second amplifying unit 504 are connected serially.

The first amplifying unit 502 is of the same configuration as the amplifier 100 according to the first embodiment of the present invention described above, and has a p-MOS varactor P1 and n-MOS varactor N1, with the input voltage signal Vinput being input to the Gate terminals of the p-MOS varactor P1 and n-MOS varactor N1 in accordance with the connection state of the switch SW1. Also, the Source terminal and drain terminal of the p-MOS varactor P1 are connected to the power source voltage source and the ground in accordance with the connection state of the switch SW2, and the Source terminal and drain terminal of the n-MOS varactor N1 are connected to the power source voltage source and the ground in accordance with the connection state of the switch SW3. Now, the p-MOS varactor P1 and the n-MOS varactor N1 have inverse conductivity, so in order to match the increase/decrease change of capacitance of the p-MOS varactor P1 and the n-MOS varactor N1, in a situation wherein the switch SW2 is connected to the power source voltage source, the switch SW3 needs to be connected to the ground, and in a situation wherein the switch SW2 is connected to the ground, the switch SW3 needs to be connected to the power source voltage source.

The second amplifying unit 504 is of the same configuration as the amplifier 100 according to the first embodiment of the present invention described above, and has a p-MOS varactor P2 and n-MOS varactor N2, with the input voltage signal Vinput being input to the Gate terminals of the p-MOS varactor P2 and n-MOS varactor N2 in accordance with the connection state of the switch SW1. Also, the Source terminal and drain terminal of the p-MOS varactor P2 are connected to the power source voltage source and the ground in accordance with the connection state of the switch SW4, and the Source terminal and drain terminal of the n-MOS varactor N2 are connected to the power source voltage source and the ground in accordance with the connection state of the switch SW5. Now, the p-MOS varactor P2 and the n-MOS varactor N2 have inverse conductivity, so in order to match the increase/decrease change of capacitance of the p-MOS varactor P2 and the n-MOS varactor N2, in a situation wherein the switch SW4 is connected to the power source voltage source, the switch SW5 needs to be connected to the ground, and in a situation wherein the switch SW4 is connected to the ground, the switch SW5 needs to be connected to the power source voltage source.

This amplifier 500 according to the fifth embodiment of the present invention operates as follows.

(1) At the time of transition from the Track state to the Boost state via the Hold state, at the amplifier 500 ON/OFF of the switches SW2 and SW3 of the first amplifying unit 502 is switched over based on the clock signal φ2, and the capacitance of the p-MOS varactor P1 and n-MOS varactor N1 increases or decreases.

(2) At the time of transition from the Track state to the Boost state via the Hold state, at the amplifier 500 ON/OFF of the switches SW4 and SW5 of the second amplifying unit is switched over based on a clock signal φ3, and the capacitance of the p-MOS varactor P1 and n-MOS varactor N1 increases or decreases.

For example, (Case a) we will assume, at the time of transition from the Track state to the Boost state via the Hold state (i.e., at the time of Boost), cases of [i] reduction of capacitance of the p-MOS varactor P1 and the n-MOS varactor N1 of the first amplifying unit, and [ii] increase in capacitance of the p-MOS varactor P2 and the n-MOS varactor N2 of the second amplifying unit. In this case, the amplification operation of the overall circuit is cancelled out at the amplifier 500 and the gain of the output voltage signal Voutput is "1", and the output voltage signal Voutput is a signal the same as the input voltage signal Vinput. (Case b) Also, in the event of reducing both the capacitance of the p-MOS varactor P1 and the n-MOS varactor N1 of the first amplifying unit and the capacitance of the p-MOS varactor P2 and the n-MOS varactor N2 of the second amplifying unit at the time of Boost, the gain of the output voltage signal Voutput is k (capacitance change ratio), and the output voltage signal Voutput is a signal obtained by the input voltage signal Vinput being amplified by being multiplied by k. (Case c) In the same way, in the event of increasing both the capacitance of the p-MOS varactor P1 and the n-MOS varactor N1 of the first amplifying unit and the capacitance of the p-MOS varactor P2 and the n-MOS varactor N2 of the second amplifying unit at the time of Boost, the gain of the output voltage signal Voutput is 1/k, and the output voltage signal Voutput is a signal obtained by the input voltage signal Vinput being attenuated by being multiplied by 1/k.

That is to say, as illustrated by the above cases a, b, and c, with the amplifier 500 according to the fifth embodiment shown in FIG. 15, independently changing the capacitance of each of the first amplifying unit 502 and the second amplifying unit 504 enables capacitance change ratio switchover as in the following Expression, i.e., gain switchover.

[Mathematical Expression 4]

$$\begin{cases} \frac{k+k}{1+1} = k \\ \frac{k+1}{1+k} = \frac{1+k}{k+1} = 1 \\ \frac{1+1}{k+k} = \frac{1}{k} \end{cases} \quad \text{(Expression 4)}$$

Also, the amplifier 500 according to the fifth embodiment of the present invention shown in FIG. 15 has two amplifying units, the first amplifying units 502 and the second amplifying unit 504, whereby switching over of the three types of gain shown in Expression 4 can be performed, but the amplifier 500 according to the fifth embodiment of the present invention is not restricted to the configuration shown in FIG. 15. For example, switching over of gain such as shown in Expression 5 can be performed by further providing a third amplifying unit (not shown in the drawings).

[Mathematical Expression 5]

$$\begin{cases} \frac{k+k+k}{1+1+1} = k \\ \frac{k+k+1}{1+1+k} = \frac{k+1+k}{1+k+1} = \frac{1+k+k}{k+1+1} = \frac{2k+1}{k+2} \\ \frac{k+1+1}{1+k+k} = \frac{1+k+1}{k+1+k} = \frac{1+1+k}{k+k+1} = \frac{k+2}{2k+1} \\ \frac{1+1+1}{k+k+k} = \frac{1}{k} \end{cases} \quad \text{(Expression 5)}$$

As shown in Expression 5, due to the amplifier 500 according to the fifth embodiment of the present invention having the three amplifying units of the first through third amplifying units, the increase/decrease changes of capacitance of the p-MOS varactors and n-MOS varactors which the first through third amplifying unit have are all made to be the same, whereby the gain of the output voltage signal Voutput is k or 1/k. Accordingly, the amplifier 500 according to the fifth embodiment of the present invention can amplify the input voltage signal Vinput to k (capacitance change ratio) times, or attenuate to 1/k times. Also, by independently changing the increase/decrease changes of capacitance of the p-MOS varactors and n-MOS varactors which the first through third amplifying unit have, the gain of the output voltage signal Voutput is (2k+1)/(k+2), or (k+2)/(2k+1). Accordingly, the amplifier 500 according to the fifth embodiment of the present invention can output an output voltage signal Voutput which has been amplified or attenuated in accordance with the gain.

Accordingly, the amplifier 500 according to the fifth embodiment of the present invention can perform switching over of the capacitance change ratio of the overall amplifying by having multiple amplifying units arrayed serially, i.e., arraying multiple CMOS made up of p-MOS varactors and n-MOS varactors in parallel, thereby outputting output voltage signals amplified in accordance with the capacitance change ratio.

Thus, with the amplifier 500 according to the fifth embodiment of the present invention, in the same way as with the amplifier 100 according to the first embodiment of the present invention, an output voltage signal, wherein a voltage signal has been amplified by being multiplied by the capacitance change ratio with the magnitude of the bias voltage being held as it is as to the input voltage signal, can be output, so the output voltage signal never becomes unnecessarily great. Accordingly, a circuit having the amplifier 500 according to the fifth embodiment of the present invention no longer needs to be provided with special measures regarding output voltage signals of the amplifier 500 according to the fifth embodiment of the present invention, making handling of the output voltage signals easier, and also enabling contribution to finer circuits and lower electric power consumption. Further, the probability of the magnitude of the output voltage signal becoming greater than the power source voltage Vdd can be made very small, so there is no distortion in output voltage signals, and desired output voltage signals can be obtained.

Sixth Embodiment

Next, a charged main filter circuit having an amplifier using the principle of amplification according to the present invention will be described as a sixth embodiment of the present invention.

[Basic Operations of Charged Main Filter According to Embodiment of Present Invention]

Figure 16:
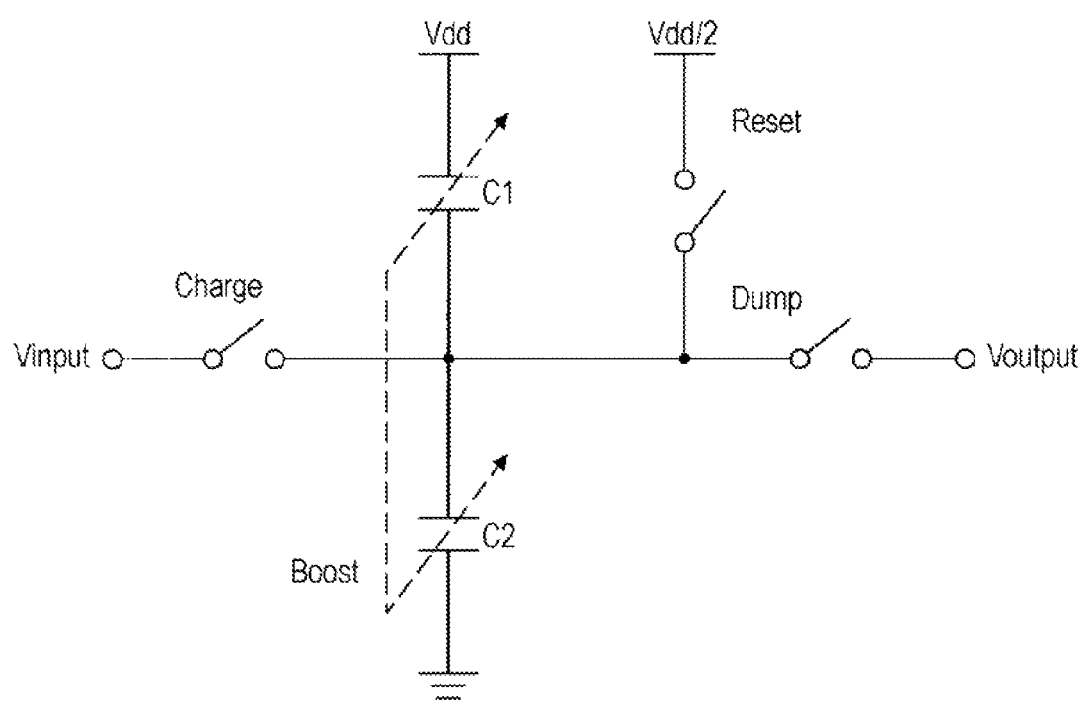
FIG. 16 is an explanatory diagram illustrating the schematics of a charged main filter circuit having the amplifier according to the present invention.

First, the basic operations of the charged main filter according to an embodiment of present invention will be described. FIG. 16 is an explanatory diagram illustrating the schematics of a charged main filer circuit having an amplifier according to an embodiment of the present invention.

The charged main filter according to an embodiment of present invention is a circuit which performs charge transfer by repeating the basic operations of a Reset state, Charge state, and Dump state. The above Reset state, Charge state, and Dump state can each be realized by schematic switches such as shown in FIG. 16, for example.

For example, the Reset state is realized by the Reset switch closing, and the Charge switch and Dump switch opening. In the Reset state, the bias voltage Vdd/2 is impressed on the variable capacitance devices C1 and C2, via the Reset switch, so as to be initialized to bias voltage. Now, with the Reset state, initialization can be performed faster by making the capacitance of the variable capacitance devices C1 and C2 to be a small state (i.e., Boost state).

Also, the Charge state is realized by opening the Reset switch from the Reset state, and closing the Charge switch. In the Charge state, the input voltage signal Vinput is impressed on the variable capacitance devices C1 and C2, via the Charge switch, so as to accumulate charge. Now, with the Charge state, the capacitance of the variable capacitance devices C1 and C2 is made to be a great state (i.e., Track state).

Also, the Dump state is realized by opening the Charge switch from the Charge state, and closing the Dump switch. In the Dump state, the charge accumulated in the variable capacitance devices C1 and C2 is transferred to a downstream circuit. Now, with the Dump state, bias voltage is maintained by making the capacitance of the variable capacitance devices C1 and C2 to be a small state (i.e., Boost state), and the voltage signal Voutput can be output in a state of the voltage signal having been amplified.

The charged main filer circuit according to an embodiment of the present invention transfers voltage signals to a downstream circuit, with operations such as described above. Also, as shown above, the Charge state and Boost are in an exclusive relation.

[Charged Main Filer Circuit According to Sixth Embodiment of Present Invention]

Figure 17:
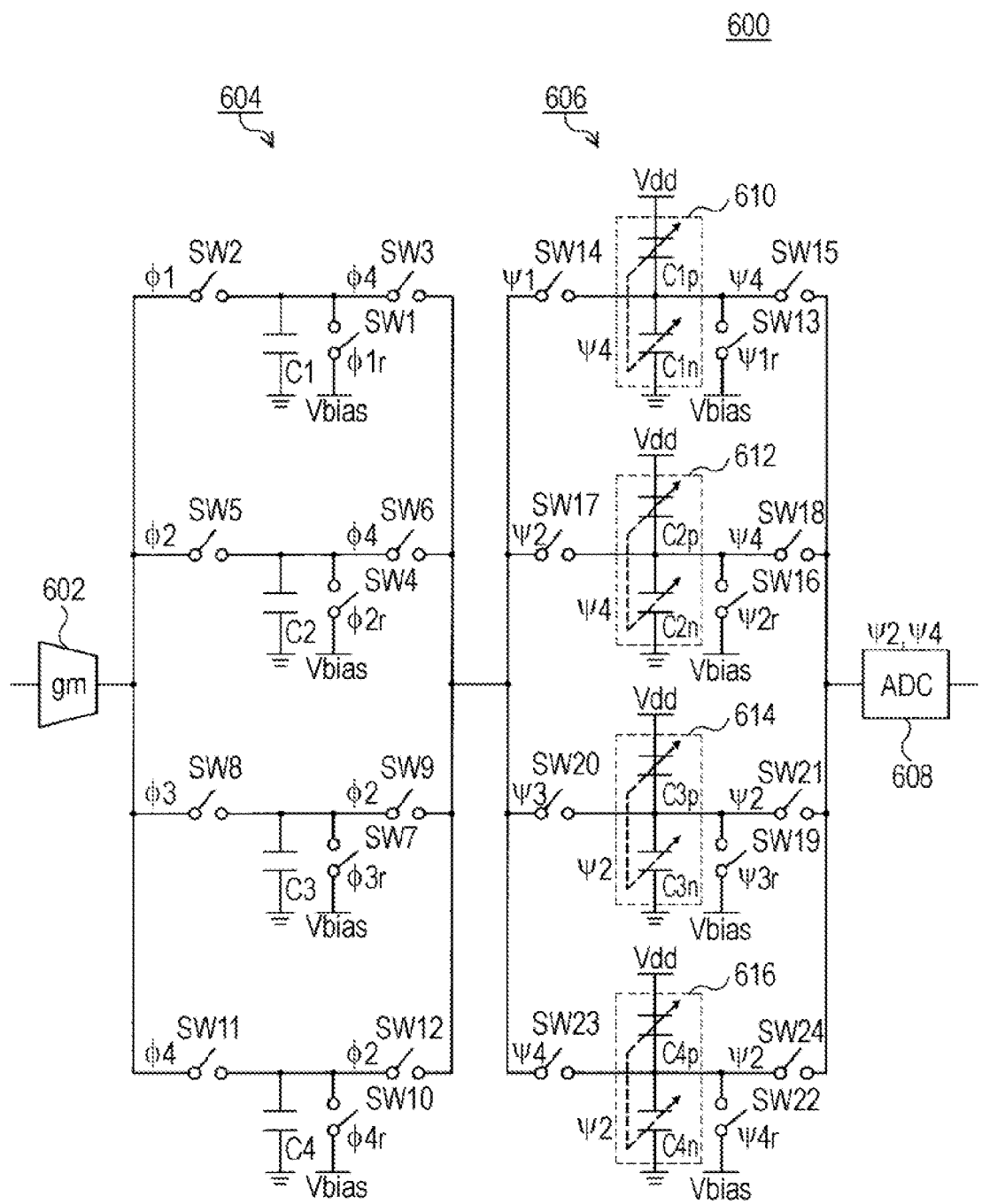
FIG. 17 is an explanatory diagram illustrating a charged main filter circuit having an amplifier according to a sixth embodiment of the present invention.
Figure 18:
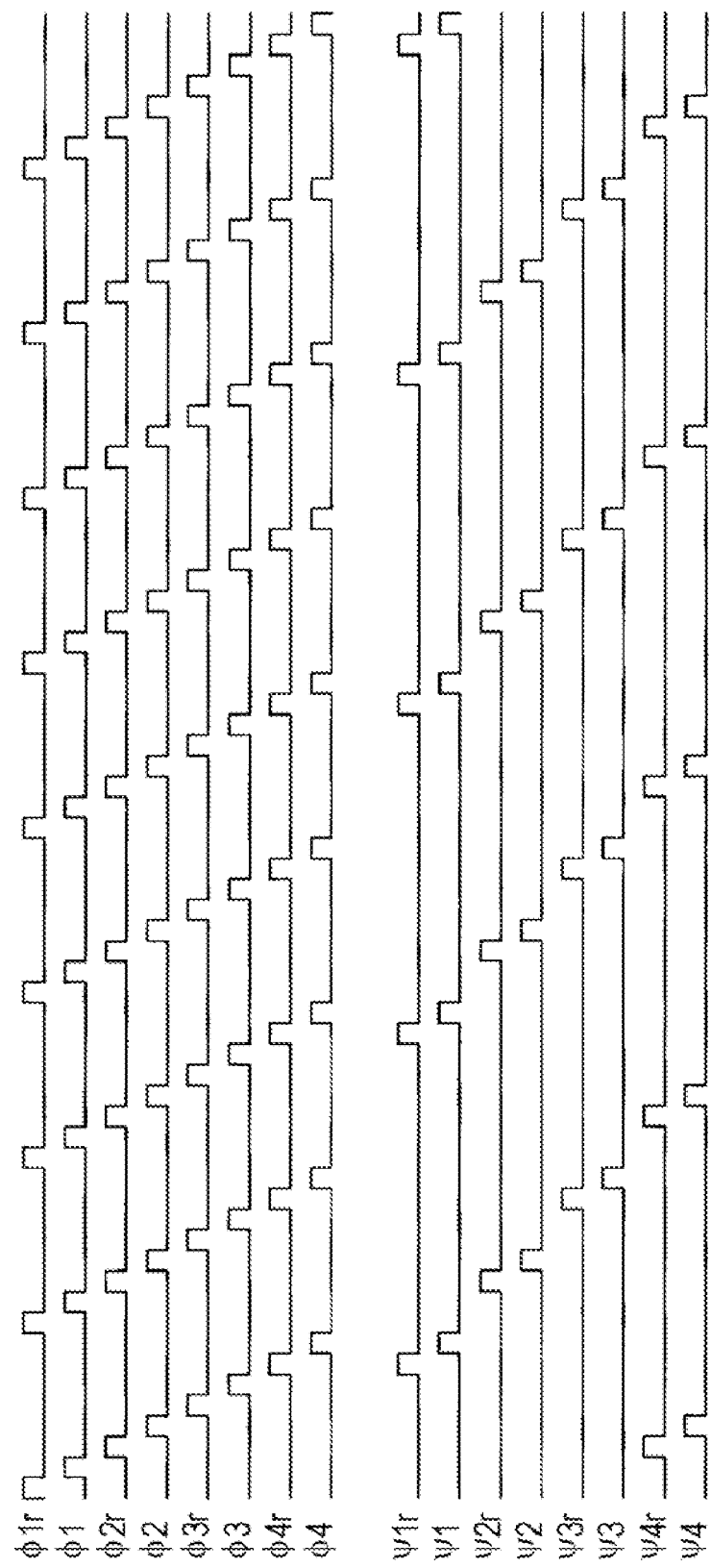
FIG. 18 is an explanatory diagram illustrating the waveforms of signals according to the sixth embodiment shown in FIG. 17.

FIG. 17 is an explanatory diagram illustrating a charged main filer circuit having an amplifier according to a sixth embodiment of the present invention. Also, FIG. 18 is an explanatory diagram illustrating waveforms of signals relating to the sixth embodiment of the present invention. Now, a charged main filer circuit is a type of circuit using reconfigurable RF technology which enables reception of wireless signals of different frequency bands with a single RF (Radio Frequency) circuit.

With reference to FIG. 17, the charged main filer circuit 600 according to the sixth embodiment of the present invention includes a transconductor (gm) 602, a first SINC filter circuit 604, a second SINC filter circuit 606, and an analog/digital conversion circuit (Analog to Digital Converter; ADC) 608.

The transconductor 602 is a voltage/current conversion device which converts input voltage signals into current proportionate to the voltage signals, and outputs. The first SINC filter circuit 604 has capacitors C1 through C4 having a predetermined capacitance, and switches SW1 through SW12. The second SINC filter circuit 606 has first variable capacitance devices C1$p$ through C4$p$ equivalent to the p-MOS varactors according to the first embodiment of the present invention, second variable capacitance devices C1$p$ through C4$p$ equivalent to the n-MOS varactors according to the first embodiment of the present invention, and switches SW13 through SW22. That is to say, in FIG. 17, the second SINC filter circuit 606 is of a configuration having four amplifying units 610 through 616 corresponding to the amplifier 100 according to the first embodiment of the present invention. The analog/digital conversion circuit 608 is a circuit for converting analog signals into digital signals.

First, the operations of the charged main filter circuit 600 according to the sixth embodiment of the present invention will be described based on the clock signals shown in FIG. 18. Now, while the first SINC filter circuit 604 has four capacitors C1 through C4, and the second SINC filter circuit 606 has four amplifying units 610 through 616, description will be made focused on the capacitors C1 and C2, and the amplifying units 610 and 612, for sake of convenience of description.

First, input/output of charge from the first SINC filter circuit 604 to the second SINC filter circuit 606 will be described. Upon the clock signal $\phi 1r$ going to high, the switch SW1 is closed and bias voltage Vbias is impressed on the capacitor C1, and charge accumulated in the capacitor C1 is removed. Also, upon the clock signal $\phi 1r$ going to low, the switch SW1 is opened and impression of bias voltage Vbias is stopped. Next, upon the clock signal $\phi 1$ going to high, the switch SW2 is closed, whereby the current output from the transconductor 602 is input, and the capacitor C1 accumulates charge. In the same way, upon the clock signal $\phi 2r$ going to high, the switch SW4 is closed and bias voltage Vbias is impressed on the capacitor C2, and charge accumulated in the capacitor C2 is removed. Next, upon the clock signal $\phi 2$ going to high, the switch SW5 is closed, whereby the current output from the transconductor 602 is input, and the capacitor C2 accumulates charge. Then, upon the clock signal $\phi 4$ going to high, the switches SW3 and SW6 are closed, whereby a part of the charge accumulated in the capacitors C1 and C2 is output to the second SINC filter circuit 606. At this time, the clock signal $\phi 1$ goes to high, so the switch SW14 is closed, and charge is accumulated at the amplifying unit 610 so as to maintain a state of equilibrium with the charge held in the capacitors C1 and C2 of the first SINC filter circuit 604. Now, sharing a charge among multiple capacitors (in the sixth embodiment of the present invention, between capacitor and amplifying unit) so as to form a state of equilibrium, as described above, is called charge sharing. Also, the charge input to the amplifying unit 610 is a charge output from the capacitors C1 and C2, and accordingly the sampling rate is decimated (Decimation) to ½.

Next, focusing on the second SINC filter circuit 606, with the amplifying unit 610, upon the clock signal $\phi 4$ going to high, the first variable capacitor device C1$p$ and the second variable capacitor device C1$n$ increase in capacitance, in the same way as with the p-MOS varactor P1 and the n-MOS varactor N1 of the amplifier 100 according to the first embodiment of the present invention. Next, upon the clock signal $\phi 1r$ going to high, the switch SW13 is closed and bias voltage Vbias is impressed on the amplifying unit 610, and charge accumulated in the amplifying unit 610 is removed. Then, upon the clock signal $\phi 1$ going to high, the switch SW14 is closed, and charge is accumulated by charge sharing. Upon the clock signal $\phi 4$ going to high again, the capacitance of the first variable capacitance device C1$p$ and the second variable capacitance device C1$n$ decreases as with the case of the p-MOS varactor P1 and n-MOS varactor N1 of the amplifier 100 according to the first embodiment described above, and the output voltage signal is amplified in accordance with change in capacitance change ratio. At this time, the switch SW15 is also closed in accordance with the clock signal φ4, so the amplified output voltage signal is output from the amplifying unit 610. Note that the amplifying unit 612 accumulates charge by charge sharing in the same way as with the amplifying unit 610, and upon the clock signal φ4 going to high, output voltage signals are output from the amplifying unit 612 and the output voltage signal is decimated, in the time as the amplifying unit 610.

Also, in the same way as with the capacitors C1 and C2 of the first SINC filter circuit 604 and the amplifying units 610 and 612 of the second SINC filter circuit 606, the capacitors C3 and C4 of the first SINC filter circuit 604 and the amplifying units 614 and 616 of the second SINC filter circuit 606 perform charge sharing and decimation of output voltage signals based on the clock signals φ1r through φ4r, φ1 through φ4, φ1r through φ4r, and φ1 through φ4.

In the event that the clock signal φ4 is high, the analog/digital conversion circuit 608 converts the output voltage signal amplified by the amplifying circuits 610 and 612 into digital values, and in the event that the clock signal φ2 is high, converts the output voltage signal amplified by the amplifying circuits 614 and 616 into digital values.

Accordingly, the charged main filter circuit 600 according to the sixth embodiment of the present invention can amplify and decimate voltage signals input to the transconductor 602, and further output digitized output voltage signals.

Also, with the amplifier of the charged main filter circuit 600 according to the sixth embodiment of the present invention, in the same way as with the amplifier 100 according to the first embodiment of the present invention, an output voltage signal, wherein a voltage signal has been amplified by being multiplied by the capacitance change ratio with the magnitude of the bias voltage being held as it is as to the input voltage signal by charge sharing, can be output, so the output voltage signal never becomes unnecessarily great. Accordingly, the amplifier 600 according to the sixth embodiment of the present invention no longer needs to be provided with special measures regarding output voltage signals of the amplifier according to the sixth embodiment of the present invention, making handling of the output voltage signals easier, and also enabling contribution to finer circuits and lower electric power consumption. Further, the probability of the magnitude of the output voltage signal becoming greater than the power source voltage Vdd can be made very small, so there is no distortion in output voltage signals, and desired output voltage signals can be obtained.

Seventh Embodiment

As described in the principle of amplification with the amplifier according to an embodiment of the present invention, charge of the same amount is cancelled out at one terminal of the first variable capacitance device P and one terminal of the second variable capacitance device N electrically connected to the one terminal of the variable capacitance device P, whereby the voltage signal can be amplified by multiplication by the capacitance change ratio, while maintaining the magnitude of the bias voltage. However, there is a possibility that desired effects may not be sufficiently obtained in the event that an unexpected situation such as manufacturing irregularities of the first variable capacitance device P and second variable capacitance device N, for example, occurs, such that a capacitance difference ΔC occurs between the capacitance of the first variable capacitance device P and the second variable capacitance device N. The reason thereof will be briefly described below with reference to FIG. 6A through FIG. 7C.

For example, in the event that a capacitance difference ΔC occurs between the capacitance of the first variable capacitance device P and the second variable capacitance device N, the charge at the Gate terminal of the first variable capacitance device P in FIG. 6B is Qp1=−C1(Vdd/2−Vin), and also the charge at the Gate terminal of the second variable capacitance device N in FIG. 6B is Qn1=(C1+ΔC)·(Vdd/2+Vin). At this time, in FIG. 6B, the total of the charge at the Gate terminal of the first variable capacitance device P and the charge at the Gate terminal of the second variable capacitance device N is Qtotal=(2·C1+ΔC)Vin+ΔC·(Vdd/2), with the charge being dependent on the bias voltage Vdd/2.

Accordingly, the output voltage signal Voutput output from the amplifier via the Boost state shown in FIG. 7C is that wherein the bias voltage Vbias=Vdd/2 has also undesirably been amplified, as shown in Expression 6.

[Mathematical Expression 6]

$$Voutput = \left(1 + \frac{k\Delta C}{2C1 + \Delta C}\right)\left(\frac{Vdd}{2}\right) + kVin \quad \text{(Expression 6)}$$
$$= \left(1 + \frac{k\Delta C}{2C1 + \Delta C}\right) \cdot Vbias + kVin$$

Now, the amplification amount of the bias voltage Vbias shown in Expression 6 is such that the smaller the capacitance difference ΔC is, the smaller the amplification amount of the bias voltage Vbias is as compared to the amplification amount of the bias voltage amplified at the above-described conventional MOSFET parametric amplifier 10. However, if the bias voltage Vbias is amplified as shown in Expression 6, there is the possibility that the advantages of the amplifier according to embodiments of the present invention, which are "making handling of the output voltage signals easier", "enabling contribution to finer circuits and lower electric power consumption", and "desired output voltage signals can be obtained", may not be obtainable.

In order to deal with the above-described problem, a configuration wherein the area ratio of the Gate terminal of the first variable capacitance device P and the Gate terminal of the second variable capacitance device can be adjusted, has been illustrated as a second embodiment of the present invention. However, configurations for handling the above-described problem are not restricted to the second embodiment of the present invention. Accordingly, next, a seventh embodiment relating to another configuration for handling the above-described problem will be described with reference to FIGS. 19 through 21.

Figure 19:
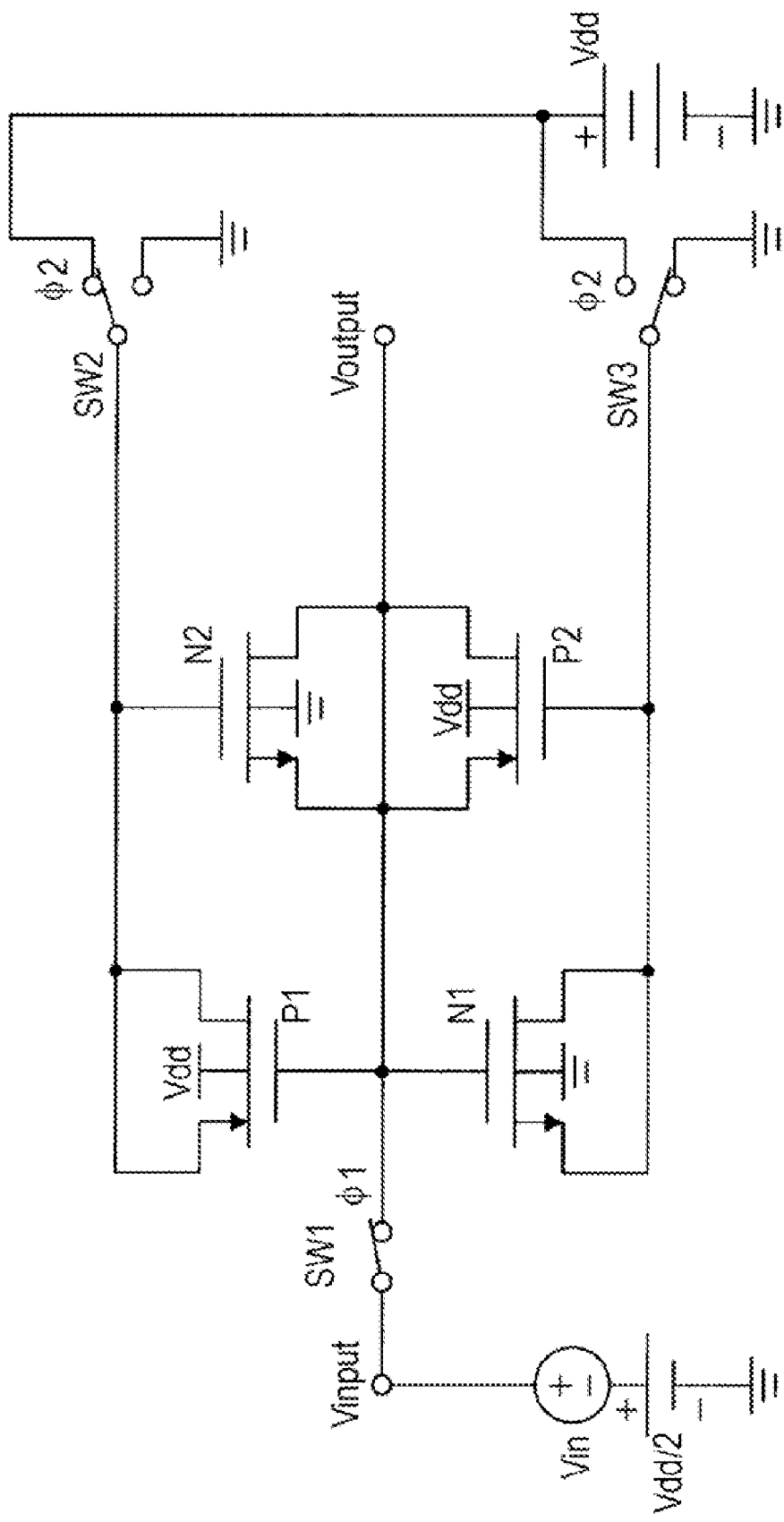
FIG. 19 is an explanatory diagram illustrating a Track state of an amplifier according to a seventh embodiment.
Figure 20:
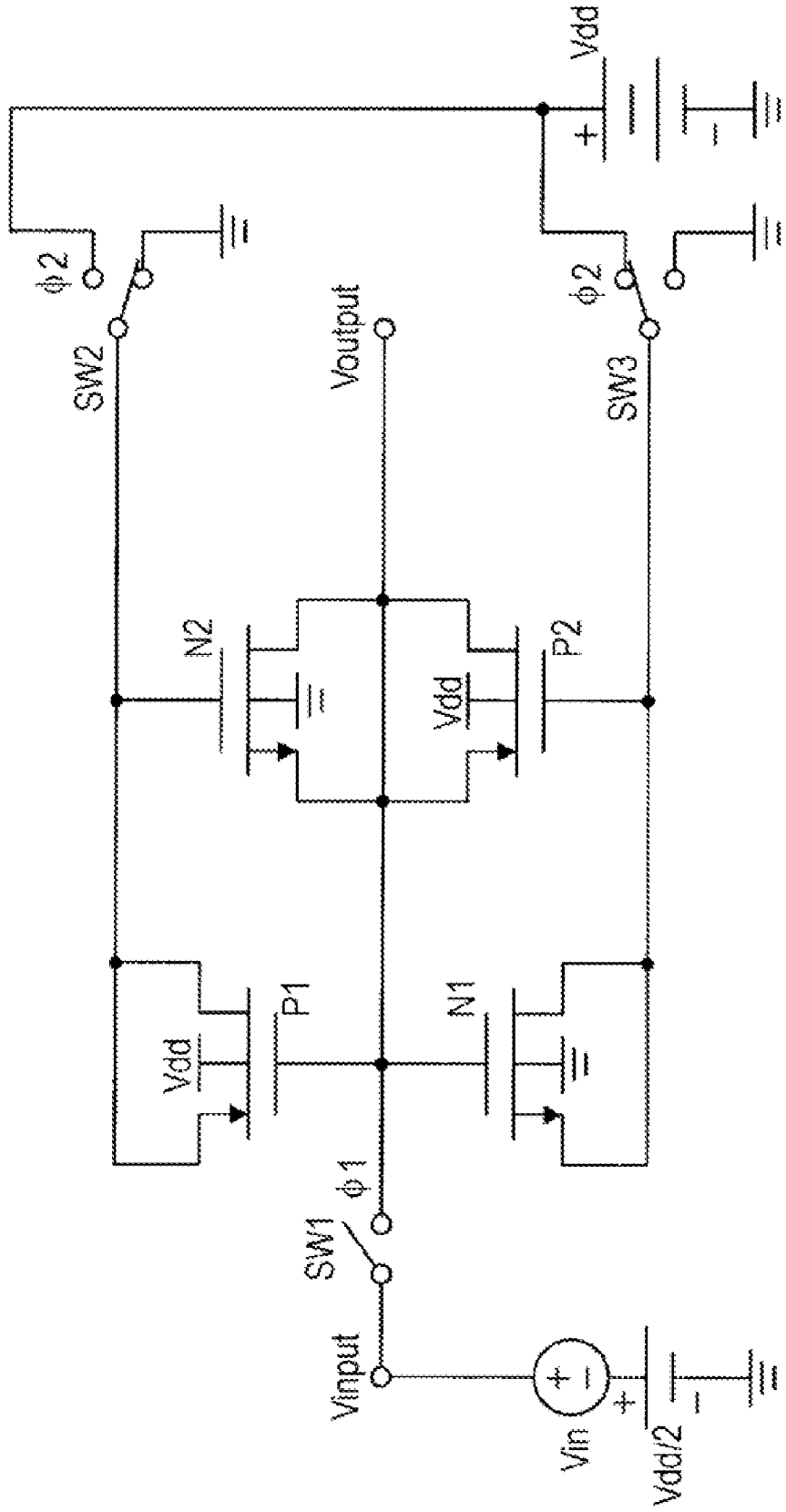
FIG. 20 is an explanatory diagram illustrating a Boost state of the amplifier according to the seventh embodiment.

FIG. 19 and FIG. 20 are explanatory diagrams illustrating an amplifier 700 according to a seventh embodiment of the present invention, with FIG. 19 illustrating a Track state, and FIG. 20 a Boost state, respectively.

Also, FIG. 21 is an explanatory diagram illustrating waveforms of signals according to the seventh embodiment of the present invention, with (a) illustrating control clock signals for controlling switches, (b) illustrating the input voltage signal Vinput, and (c) illustrating the output voltage signal Voutput, respectively. Note that while FIG. 19 through FIG. 21 illustrate the bias voltage as being Vbias=Vdd/2, it is needless to say that the bias voltage is not restricted to the above-described.

With reference to FIG. 19 and FIG. 20, the amplifier 700 according to the seventh embodiment of the present invention has the same basic configuration as with the amplifier 100 according to the first embodiment of the present invention, but further includes a p-MOS varactor P2 and n-MOS varactor N2. With the p-MOS varactor P2 and n-MOS varactor N2, as with the MOSFET shown in FIG. 2, capacitance can be changed depending on whether or not there is an inversion layer. Also, the p-MOS varactors P1 and P2 and the n-MOS varactors N1 and N2 of the amplifier 700 preferably have generally the same Gate terminal widths and lengths (i.e., in the order of manufacturing variance is permissible).

As with the amplifier 100 according to the first embodiment of the present invention, bias voltage Vdd/2 and voltage signal Vin are input to the Gate terminal of the n-MOS varactor N1, in accordance with the connection state of the switch SW1. Also, as with the amplifier 100 according to the first embodiment of the present invention, the Source terminal and Drain terminal of the p-MOS varactor P1 are connected to the power source voltage source and the ground in accordance with the connection state of the switch SW2, and the Source terminal and Drain terminal of the n-MOS varactor N1 are connected to the power source voltage source and the ground in accordance with the connection state of the switch SW3.

Also input to the (1) Source terminal and Drain terminal of the p-MOS varactor P2, and further to the (2) Source terminal and Drain terminal of the n-MOS varactor N2, are the bias voltage Vdd/2 and voltage signal Vin, each in accordance with the connection state of the switch SW1. Also, the Gate terminal of the n-MOS varactor N2 is connected to the power source voltage source and the ground, in accordance with the connection state of the switch SW2, and the Gate terminal of the p-MOS varactor P2 is connected to the power source voltage source and the ground, in accordance with the connection state of the switch SW3.

Now, the p-MOS varactor P1 and the n-MOS varactor N1, and the p-MOS varactor P2 and the n-MOS varactor N2, have inverse conductivity, so there is the need to match the increase/decrease change of capacitance. Accordingly, with the amplifier 700 according to the seventh embodiment of the present invention, while the switch SW2 is connected to the power source voltage source, the switch SW3 is connected to the ground, and while the switch SW2 is connected to the ground, the switch SW3 is connected to the power source voltage source.

Also, the switch SW1 operates synchronously with the clock signal φ1 shown in FIG. 21(a), so as to be in a closed state (i.e., "ON") when the clock signal φ1 is high, with the bias voltage Vdd/2 and voltage signal Vin being input to each of the Gate terminals of the p-MOS varactor P1 and n-MOS varactor N1, and the Source terminal and Drain terminals of the p-MOS varactor P2 and n-MOS varactor N2.

Also, when the clock signal φ1 goes to low, the switch SW1 goes to an opened state (i.e., "OFF"), and input of the bias voltage Vdd/2 and voltage signal Vin to each of (i) the Gate terminals of the p-MOS varactor P1 and n-MOS varactor N1, and (ii) the Source terminal and Drain terminals of the p-MOS varactor P2 and n-MOS varactor N2, being controlled. Note that the relation between the clock signal φ1 and the switch SW1 is not restricted to the above-described, and an arrangement may be made wherein, for example, the switch SW1 closes when the clock signal φ1 is low.

On the other hand, the switch SW2 is arranged such that the connection destination thereof switches over synchronously with the clock signal φ2 shown in FIG. 21(a), being connected to the ground when the clock signal φ2 is high, and connected to the power source voltage source when the clock signal φ2 is low. Conversely, the switch SW3 is arranged such that the connection destination thereof switches over synchronously with the clock signal φ2, being connected to the power source voltage source when the clock signal φ2 is high, and connected to the ground when the clock signal φ2 is low. Note that as shown in FIG. 21(a), the clock signal φ1 and the clock signal φ2, as with the first embodiment of the present invention, the clock signal φ1 and the clock signal φ2 are output such that the phases thereof do not overlap, thereby creating a Hold state.

With reference to FIG. 19, in the Track state, the switch SW1 closes due to the clock signal φ1 going to high, and the input voltage signal Vinput is input to the Gate terminals of the p-MOS varactor P1 and the n-MOS varactor N1. In the same way, the input voltage signal Vinput is input to the Source terminal and Drain terminal of the p-MOS varactor P2 and the Source terminal and Drain terminal of the n-MOS varactor N2. Now, the input voltage signal Vinput input to the amplifier 700 according to the seventh embodiment of the present invention is a signal wherein the bias voltage Vdd/2 and the voltage signal Vin are superimposed, as shown in FIG. 21(b).

Also, the switch SW2 is connected to the power source voltage source when the clock signal φ2 is low, and the switch SW3 is connected to the ground when the clock signal φ2 is low. At this time, inversion layers are formed at each of the p-MOS varactor P1 and n-MOS varactor N1, and the capacitance of each increases. Accordingly, the voltage at the Gate terminals of the p-MOS varactor P1 and n-MOS varactor N1 changes in accordance with the input voltage signal Vinput, in the same way as with the amplifier 100 according to the present embodiment, and a charge according to the input voltage signal Vinput is accumulated in the p-MOS varactor P1 and the n-MOS varactor N1.

In the same way, when the switch SW is connected to the power source voltage source, and the switch SW3 is connected to the ground, inversion layers are formed at each of the p-MOS varactor P2 and n-MOS varactor N2, and the capacitance of each increases.

Accordingly, in the Track state shown in FIG. 19, inversion layers are formed at the semiconductor interface directly below the Gate terminals of each of the p-MOS varactors P1 and P2 and n-MOS varactors N1 and N2, and the capacitance of each increases.

The following is a description of the capacitance of the p-MOS varactors P1 and P2 and n-MOS varactors N1 and N2 in the Track state, with reference to FIG. 22A through FIG. 25B. Note that in FIG. 22A through FIG. 25B, FIG. 22A, FIG. 23A, FIG. 24A, and FIG. 25A each illustrate a Track state, and FIG. 22B, FIG. 23B, FIG. 24B, and FIG. 25B each illustrate a Boost state.

Now, in FIG. 22A through FIG. 25B, Cgd indicates the overlap capacitance and fringe capacitance between the Gate terminal and Drain terminal. Also, Cox indicates the capacitance of the Gate oxide film, and Cgs indicates the overlap capacitance and fringe capacitance between the Gate terminal and Source terminal. Also, Cdep indicates the depletion layer capacitance directly below the Gate terminal. Also, Gjd indicates the junction capacitance of the Drain terminal, and Cjs indicates the junction capacitance of the Source terminal.

[Capacitance of p-MOS Varactor P1 in Track State]

Figure 22A:
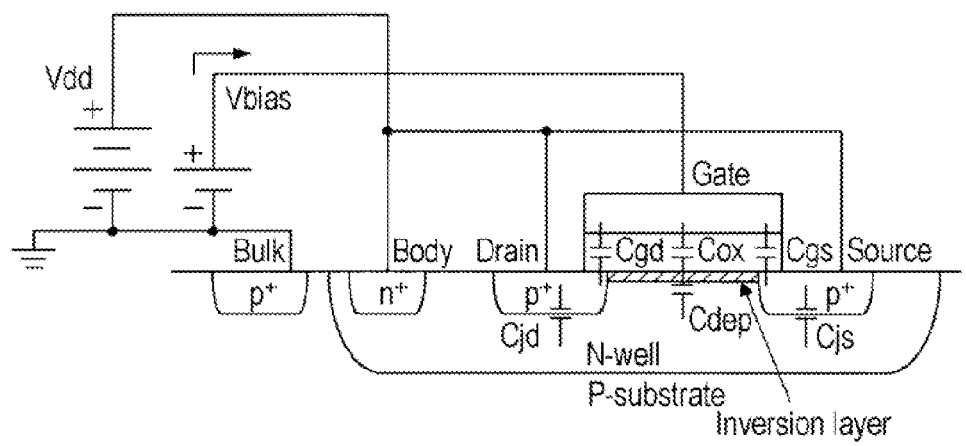
FIG. 22A is a schematic diagram illustrating a p-MOS varactor P1 which amplifier according to the seventh embodiment shown in FIG. 19 and FIG. 20 has.

FIG. 22A is a schematic diagram illustrating the Track state of the p-MOS varactor P1 which the amplifier 700 according to the seventh embodiment of the present invention has. The capacitance Cmax, p1 in the Track state as viewed from the Gate terminal side has the electric field terminated at the inversion layer (Inversion layer), and accordingly is expressed as in Expression 7.

[Mathematical Expression 7]

$$C_{max,P1} = Cox + Cgd + Cgs \qquad \text{(Expression 7)}$$

[Capacitance of n-MOS Varactor N1 in Track State]

Figure 23A:
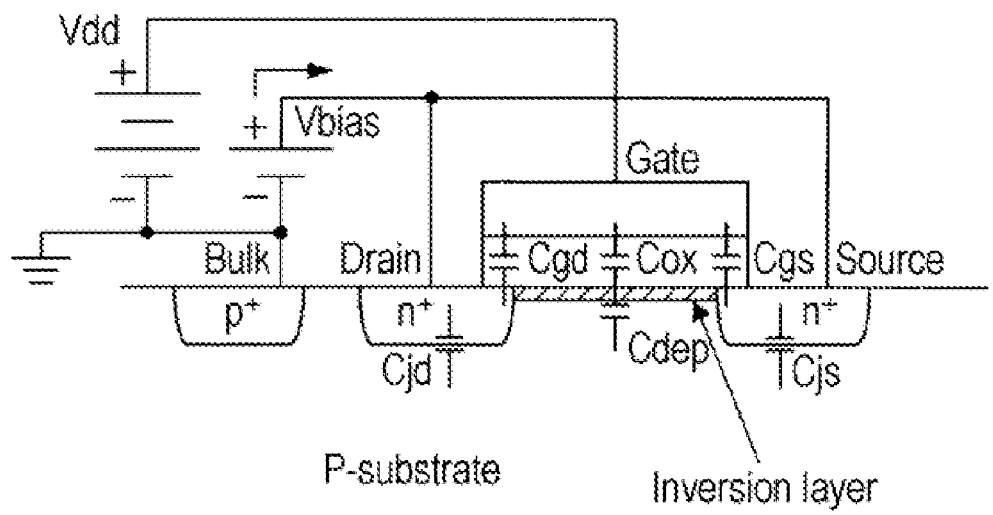
FIG. 23A is a schematic diagram illustrating an n-MOS varactor N2 which amplifier according to the seventh embodiment shown in FIG. 19 and FIG. 20 has.

FIG. 23A is a schematic diagram illustrating the Track state of the n-MOS varactor N2 which the amplifier 700 according to the seventh embodiment of the present invention has. The capacitance Cmax, N2 in the Track state as viewed from the Drain terminal and Source terminal can be seen as Cdg, Cox, and Cgs as to the Gate terminal, and also Cjd, Cdep, and Cjs as to the bulk terminal, and accordingly is expressed as in Expression 8.

[Mathematical Expression 8]

$$C_{max,N2} = Cox + Cgd + Cgs + Cjd + Cjs + Cdep \quad \text{(Expression 8)}$$

[Capacitance of n-MOS Varactor N1 in Track State]

Figure 24A:
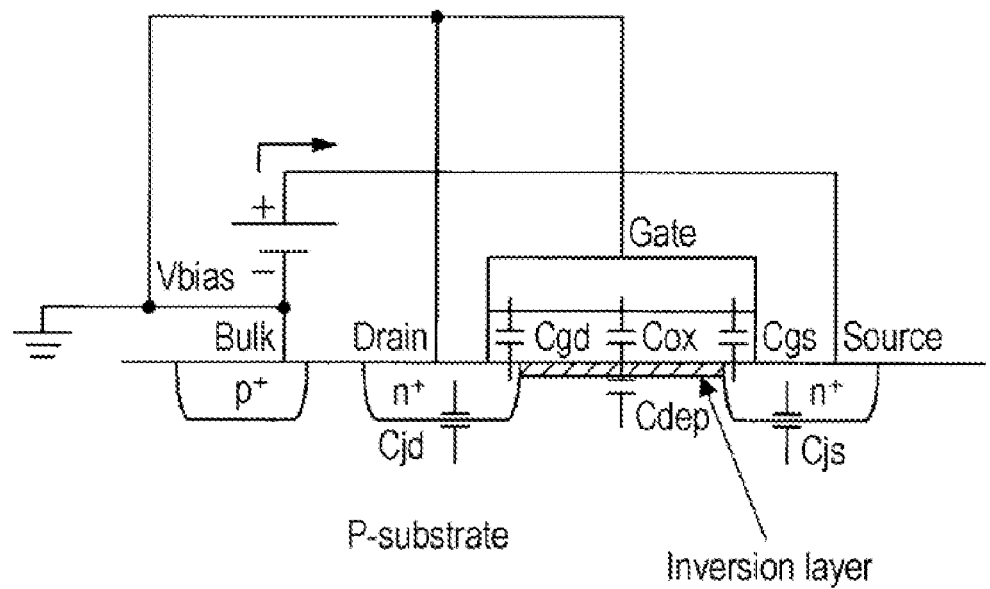
FIG. 24A is a schematic diagram illustrating an n-MOS varactor N1 which amplifier according to the seventh embodiment shown in FIG. 19 and FIG. 20 has.

FIG. 24A is a schematic diagram illustrating the Track state of the n-MOS varactor N1 which the amplifier 700 according to the seventh embodiment of the present invention has. The capacitance $C_{max, N1}$ in the Track state as viewed from the Gate terminal side has the electric field terminated at the inversion layer, and accordingly is expressed as in Expression 9.

[Mathematical Expression 9]

$$C_{max,N1} = Cox + Cgd + Cgs \quad \text{(Expression 9)}$$

[Capacitance of p-MOS Varactor P2 in Track State]

Figure 25A:
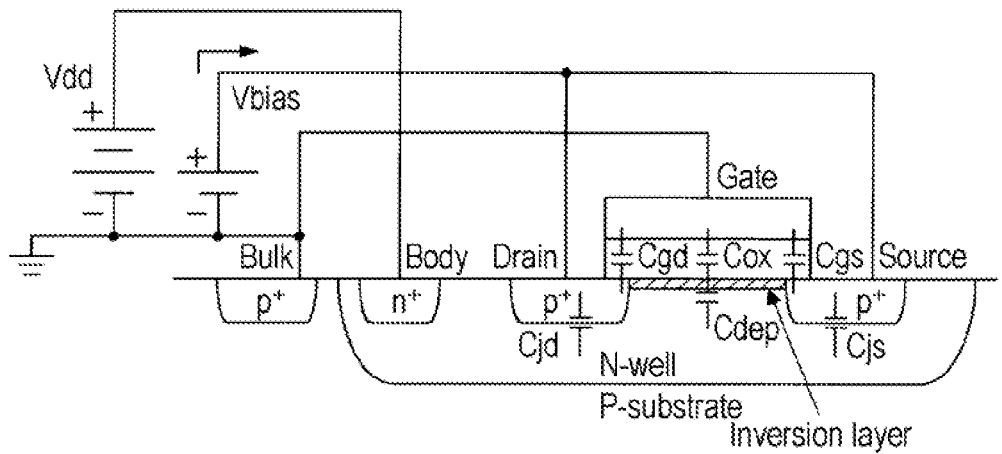
FIG. 25A is a schematic diagram illustrating a p-MOS varactor P2 which amplifier according to the seventh embodiment shown in FIG. 19 and FIG. 20 has.

FIG. 25A is a schematic diagram illustrating the Track state of the p-MOS varactor P2 which the amplifier 700 according to the seventh embodiment of the present invention has. The capacitance $C_{max, P2}$ in the Track state as viewed from the Drain terminal and Source terminal can be seen as Cdg, Cox, and Cgs as to the Gate terminal, and also Cjd, Cdep, and Cjs as to the Body (N-well contact), and accordingly is expressed as in Expression 10.

[Mathematical Expression 10]

$$C_{max,P2} = Cox + Cgd + Cgs + Cjd + Cjs + Cdep \quad \text{(Expression 10)}$$

[Capacitance of Amplifier 700 in Track State]

Accordingly, the capacitances $C_{a, max}$ and $C_{b, max}$ of the amplifier 700 in the Track state can be expressed as in Expression 11 and Expression 12, respectively.

[Mathematical Expression 11]

$$\begin{aligned} C_{a,max} &= C_{max,P1} + C_{max,N2} \\ &= Cox, p + Cgd, p + Cgs, p + Cox, n + \\ &\quad Cgd, n + Cgs, n + Cjd, n + Cjs, n + Cdep, n \end{aligned} \quad \text{(Expression 11)}$$

[Mathematical Expression 12]

$$\begin{aligned} C_{b,max} &= C_{max,N2} + C_{max,P2} \\ &= Cox, n + Cgd, n + Cgs, n + Cox, p + \\ &\quad Cgd, p + Cgs, p + Cjd, p + Cjs, p + Cdep, p \\ &= Cox, p + Cgd, p + Cgs, p + Cox, n + \\ &\quad Cgd, n + Cgs, n + Cjd, p + Cjs, p + Cdep, p \end{aligned} \quad \text{(Expression 12)}$$

Now, the capacitance $C_{a, max}$ shown in Expression 11 is the capacitance to the upper side in FIG. 19 and FIG. 20 (the sum of the capacitance of the p-MOS varactor P1 and the capacitance of the n-MOS varactor N2, i.e., the sum of Expression 7 and Expression 8). Also, the capacitance $C_{b, max}$ shown in Expression 12 is the capacitance to the lower side in FIG. 19 and FIG. 20 (the sum of the capacitance of the n-MOS varactor N1 and the capacitance of the p-MOS varactor P2, i.e., the sum of Expression 9 and Expression 10). Note that in Expression 11 and Expression 12, for example, Cox, p represents the Cox of a p-MOS varactor, and Cox, n represents the Cox of an n-MOS varactor. Also, other items are the same as well.

Comparing Expression 11 and Expression 12, it can be seen that while Cjd, Cjs, and Cdep differ among those relating to p-MOS varactors and n-MOS varactors, the other items are the same. Accordingly, it can be understood that the values shown in Expression 11 and the values shown in Expression 12 have difference which is dependent on the values of Cjd, Cjs, and Cdep. On the other hand, Cjd and Cjs are called junction capacitance, and if the size of the MOS varactors (here, size indicates the widths and lengths of the Gate terminals.) is generally the same, the junction capacitances differ little between p-MOS varactors and n-MOS varactors. Conversely, the Cdep is the depletion layer capacitance directly below the Gate terminal, so the capacitance differs between p and n. However, the depletion layer capacitance is sufficiently small as compared to the total capacitance of other capacitances, and accordingly can be ignored as a negligible error.

Accordingly, in the event that the size of the MOS varactors making up the amplifier is generally the same, no capacitance difference ΔC occurs in the Track state (strictly speaking, the capacitance difference ΔC can be made extremely small, and ignored as a negligible error.) with the amplifier 700 according to the seventh embodiment of the present invention.

Next, with reference to FIG. 20, in the Boost state, the switch SW1 opens by the clock signal φ1 going to low, and input of the input voltage signal Vinput to the Gate terminals of the p-MOS varactor P1 and n-MOS varactor N1, and to the Source terminals and Drain terminals of the p-MOS varactor P2 and n-MOS varactor N2, each, is stopped.

Also, when the clock signal φ2 is at high the switch SW2 is connected to the ground, and when the clock signal φ2 is at high the switch SW3 is connected to the power source voltage source. At this time, the inversion layers which had been generated at the semiconductor interface directly below the Gate terminals of the p-MOS varactor P1 and n-MOS varactor N1 and the p-MOS varactor P2 and n-MOS varactor N2 disappear, and the capacitances of each of the p-MOS varactors P1 and P2 and n-MOS varactors N1 and N2 decrease.

The following is a description of the capacitance of the p-MOS varactors P1 and P2 and n-MOS varactors N1 and N2 in the Boost state, with reference to FIG. 22B, FIG. 23B, FIG. 24B, and FIG. 25B.

[Capacitance of p-MOS Varactor P1 in Boost State]

Figure 22B:
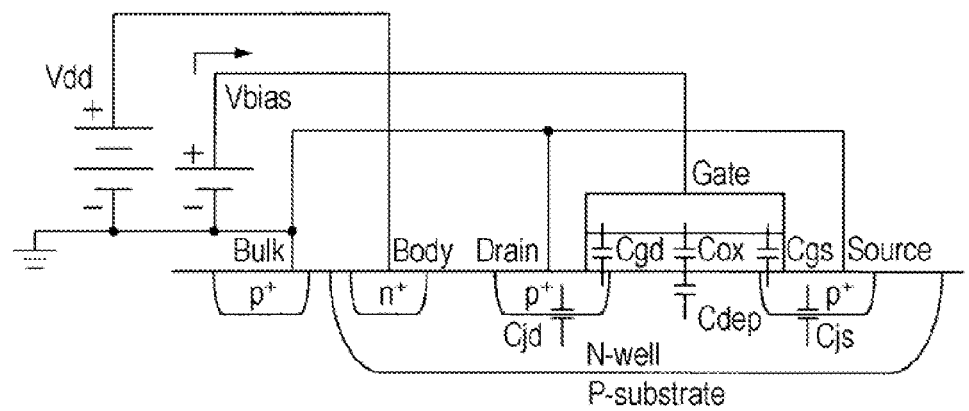
FIG. 22B is a schematic diagram illustrating the p-MOS varactor P1 which amplifier according to the seventh embodiment shown in FIG. 19 and FIG. 20 has.

FIG. 22B is a schematic diagram illustrating the Boost state of the p-MOS varactor P1 which the amplifier 700 according to the seventh embodiment of the present invention has. With the capacitance Cmin, p1 in the Boost state as viewed from the Gate terminal side, Cox and Cdep can be viewed due to the inversion layer disappearing, and accordingly is expressed as in Expression 13.

[Mathematical Expression 13]

$$C_{min,P1} = \frac{Cox \cdot Cdep}{Cox + Cdep} + Cgd + Cgs \quad \text{(Expression 13)}$$

[Capacitance of n-MOS Varactor N2 in Boost State]

Figure 23B:
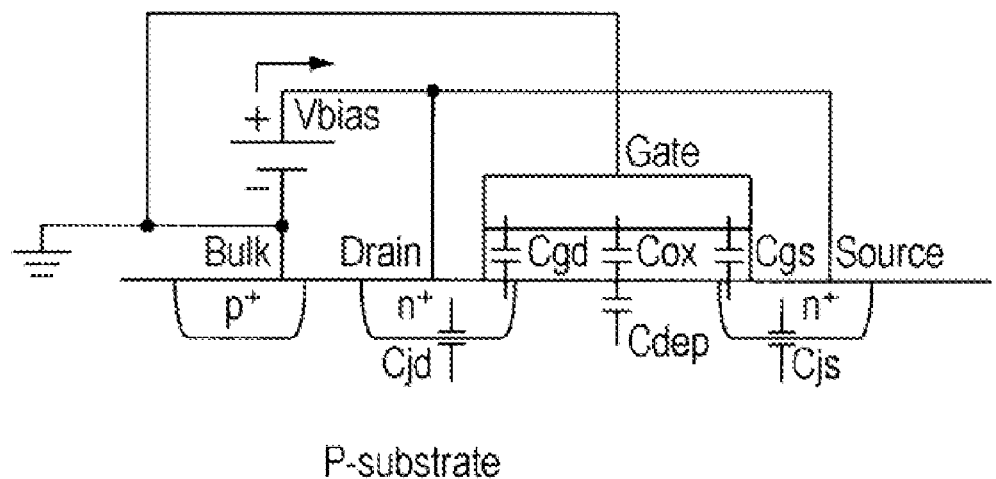
FIG. 23B is a schematic diagram illustrating the n-MOS varactor N2 which amplifier according to the seventh embodiment shown in FIG. 19 and FIG. 20 has.

FIG. 23B is a schematic diagram illustrating the Boost state of the n-MOS varactor N2 which the amplifier 700 according to the seventh embodiment of the present invention has. The capacitance $C_{min, N2}$ in the Boost state as viewed from the Drain terminal and Source terminal cannot view Cox and Cdep due to the inversion layer disappearing, and accordingly is expressed as in Expression 14.

[Mathematical Expression 14]

$$C_{min,N2} = Cgd + Cgs + Cjd + Cjs \quad \text{(Expression 14)}$$

[Capacitance of n-MOS Varactor N1 in Boost State]

Figure 24B:
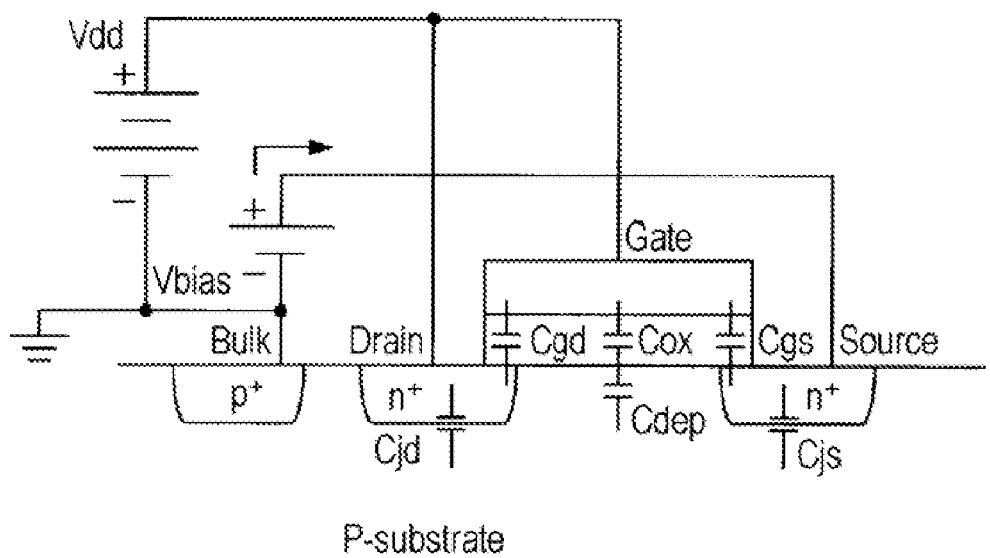
FIG. 24B is a schematic diagram illustrating the n-MOS varactor N1 which amplifier according to the seventh embodiment shown in FIG. 19 and FIG. 20 has.

FIG. 24B is a schematic diagram illustrating the Boost state of the n-MOS varactor N1 which the amplifier 700 according to the seventh embodiment of the present invention has. With the capacitance $C_{min, N1}$ in the Boost state as viewed from the Gate terminal side, Cox and Cdep can be viewed due to the inversion layer disappearing, and accordingly is expressed as in Expression 15.

[Mathematical Expression 15]

$$C_{min,N1} = \frac{Cox \cdot Cdep}{Cox + Cdep} + Cgd + Cgs \quad \text{(Expression 15)}$$

[Capacitance of p-MOS Varactor P2 in Boost State]

Figure 25B:
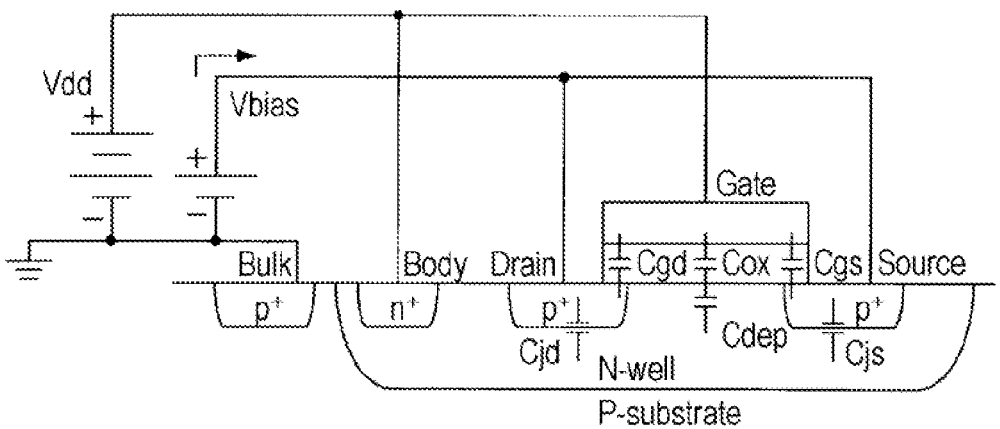
FIG. 25B is a schematic diagram illustrating the p-MOS varactor P2 which amplifier according to the seventh embodiment shown in FIG. 19 and FIG. 20 has.

FIG. 25B is a schematic diagram illustrating the Boost state of the p-MOS varactor P2 which the amplifier 700 according to the seventh embodiment of the present invention has. The capacitance $C_{min, P2}$ in the Boost state as viewed from the Drain terminal and Source terminal cannot view Cox and Cdep due to the inversion layer disappearing, and accordingly is expressed as in Expression 16.

[Mathematical Expression 16]

$$C_{min,P2} = Cgd + Cgs + Cjd + Cjs \quad \text{(Expression 16)}$$

[Capacitance of Amplifier 700 in Boost State]

Accordingly, the capacitances $C_{a,\,min}$ and $C_{b,\,min}$ of the amplifier 700 in the Boost state can be expressed as in Expression 17 and Expression 18, respectively.

[Mathematical Expression 17]

$$\begin{aligned}C_{a,min} &= C_{min,P1} + C_{min,N2} \quad \text{(Expression 17)}\\ &= \frac{Cox, p \cdot Cdep, p}{Cox, p + Cdep, p} + \\ &\quad Cgd, p + Cgs, p + Cgd, n + Cgs, n + \\ &\quad Cjd, n + Cjs, n\end{aligned}$$

[Mathematical Expression 18]

$$\begin{aligned}C_{b,min} &= C_{min,N1} + C_{min,P2} \quad \text{(Expression 18)}\\ &= \frac{Cox, n \cdot Cdep, n}{Cox, n + Cdep, n} + \\ &\quad Cgd, n + Cgs, n + Cgd, p + Cgs, p + \\ &\quad Cjd, p + Cjs, p \\ &= \frac{Cox, n \cdot Cdep, n}{Cox, n + Cdep, n} + \\ &\quad Cgd, p + Cgs, p + Cgd, n + Cgs, n + \\ &\quad Cjd, p + Cjs, p\end{aligned}$$

Now, the capacitance $C_{a,\,min}$ shown in Expression 17 is the capacitance to the upper side in FIG. 19 and FIG. 20 (the sum of the capacitance of the p-MOS varactor P1 and the capacitance of the n-MOS varactor N2, i.e., the sum of Expression 13 and Expression 14). Also, the capacitance $C_{b,\,min}$ shown in Expression 18 is the capacitance to the lower side in FIG. 19 and FIG. 20 (the sum of the capacitance of the n-MOS varactor N1 and the capacitance of the p-MOS varactor P2, i.e., the sum of Expression 15 and Expression 16).

Comparing Expression 17 and Expression 18, it can be seen that while Cjd, Cjs, and the series capacitance of Cox and Cdep (first term in Expression 17 and Expression 18) differs among those relating to p-MOS varactors and n-MOS varactors, the other items are the same. Accordingly, it can be understood that the values shown in Expression 17 and the values shown in Expression 18 have difference which is dependent on the values of Cjd, Cjs, Cox, and Cdep. On the other hand, with Cjd and Cjs, if the size of the MOS varactors is generally the same, there is little difference between p-MOS varactors and n-MOS varactors, as described above. Also, the series capacitance of Cox and Cdep is sufficiently smaller than Cdep in both p-MOS varactors and n-MOS varactors, so the difference of the series capacitance of Cox and Cdep is sufficiently small in Expression 17 and Expression 18. Accordingly, the difference of the series capacitance of Cox and Cdep in Expression 17 and Expression 18 can be ignored as a negligible error.

Accordingly, in the event that the size of the MOS varactors making up the amplifier is generally the same, no capacitance difference ΔC occurs in the Boost state (strictly speaking, the capacitance difference ΔC can be made extremely small, and ignored as a negligible error.) with the amplifier 700 according to the seventh embodiment of the present invention.

Also, the capacitance of the amplifier 700 according to the seventh embodiment of the present invention in the Track state, i.e., the maximum capacitance Cmax in the amplifier 700, can be taken as the sum of Expression 11 and Expression 12. Accordingly, the maximum capacitance of the amplifier 700 is expressed by Expression 19.

[Mathematical Expression 19]

$$\begin{aligned}Cmax &= C_{a,max} + C_{b,max} \quad \text{(Expression 19)}\\ &= 2(Cox, p + Cox, n) + Cdep, p + Cdep, n + \\ &\quad 2(Cgd, p + Cgs, p + Cgd, n + Cgs, n) + \\ &\quad Cjd, p + Cjs, p + Cjd, n + Cjs, n\end{aligned}$$

Also, the capacitance of the amplifier 700 according to the seventh embodiment of the present invention in the Boost state, i.e., the maximum capacitance Cmin in the amplifier 700, can be taken as the sum of Expression 17 and Expression 18. Accordingly, the maximum capacitance of the amplifier 700 is expressed by Expression 20.

[Mathematical Expression 20]

$$\begin{aligned}Cmin &= C_{a,min} + C_{b,min} \quad \text{(Expression 20)}\\ &= \left( \frac{Cox, p \cdot Cdep, p}{Cox, p + Cdep, p} + \frac{Cox, n \cdot Cdep, n}{Cox, n + Cdep, n} \right) + \\ &\quad 2(Cgd, p + Cgs, p + Cgd, n + Cgs, n) + \\ &\quad Cjd, p + Cjs, p + Cjd, n + Cjs, n\end{aligned}$$

As shown in Expression 19 and Expression 20, it can be seen that Cox and Cdep contribute to the capacitance change ratio. Now, in p-MOS varactors and n-MOS varactors, Cox becomes the series capacitance of Cox and Cdep in the case of the Boost state, so a layout of the amplifier 700 according to the seventh embodiment of the present invention such that other capacitances are as small as possible, is effective in making the capacitance change ratio great. Specifically, when the Gate length of each MOS varactor making up the amplifier 700 is longer, the area of the Drain terminal and Source terminal as to the area of the Gate region can be made correspondingly small. Accordingly, laying out the amplifier 700 as described above enables a great increase of the capacitance change ratio.

As described above, with the amplifier 700 according to the seventh embodiment of the present invention, there is no capacitance difference ΔC occurring in the Track state and Boost state. Accordingly, the amplifier 700 according to the seventh embodiment of the present invention can, in the same way as with the amplifier 100 according to the first embodiment, amplify the voltage signal Vin by multiplying by the capacitance change ratio, with the magnitude of the bias voltage Vdd/2 maintained, by change in capacitance such as shown in Expressions 2 and 3.

Accordingly, the output voltage Voutput of the amplifier 700 according to the seventh embodiment of the present invention is a waveform wherein the voltage signal Vin has been amplified by multiplying by the capacitance change ratio with the magnitude of the bias voltage Vdd/2 maintained. Now, the output voltage Voutput is smaller than the power source voltage Vdd, so there is no distortion occurring in the output voltage as with the conventional MOSFET parametric amplifier 10.

As described above, the amplifier 700 according to the seventh embodiment of the present invention has a configuration wherein both a p-MOS varactor and n-MOS varactor are vertically arrayed (here, "vertical" indicates a symmetrical placement such as shown in FIG. 19, for example. Accordingly, "horizontal" and "diagonal" are also included in the configuration of the amplifier 700 according to the seventh embodiment of the present invention as a matter of course.). Now, even in the event that there are manufacturing irregularities in the n-MOS varactors making up the amplifier 700, the capacitance difference among the MOS varactors is extremely small as long as they are MOS varactors with generally the same size and of the same conductivity type. Accordingly, with the amplifier 700 according to the seventh embodiment of the present invention, even in the event that there are manufacturing irregularities in the p-MOS varactors and n-MOS varactors making up the amplifier 700, the capacitance difference Δ can be made extremely small.

Accordingly, the amplifier 700 according to the seventh embodiment of the present invention can maintain the magnitude of the bias voltage included in the input voltage signal, even after amplification.

Thus, with the amplifier 700 according to the seventh embodiment of the present invention, in the same way as with the amplifier 100 according to the first embodiment of the present invention, an output voltage signal, wherein a voltage signal has been amplified by being multiplied by the capacitance change ratio with the magnitude of the bias voltage being held as it is as to the input voltage signal, can be output, so the output voltage signal never becomes unnecessarily great. Accordingly, a circuit having the amplifier 700 according to the seventh embodiment of the present invention no longer needs to be provided with special measures regarding output voltage signals of the amplifier 700, making handling of the output voltage signals easier, and also enabling contribution to finer circuits and lower electric power consumption. Further, the probability of the magnitude of the output voltage signal becoming greater than the power source voltage Vdd can be made very small, so there is no distortion in output voltage signals, and desired output voltage signals can be obtained.

Eighth Embodiment

The amplifier 700 according to the seventh embodiment of the present invention can be applied to a charged main filter circuit, as shown with the above-described sixth embodiment of the present invention. Accordingly, a charged main filter circuit having the amplifier 700 according to the seventh embodiment of the present invention will be described next as an eighth embodiment of the present invention.

Figure 26:
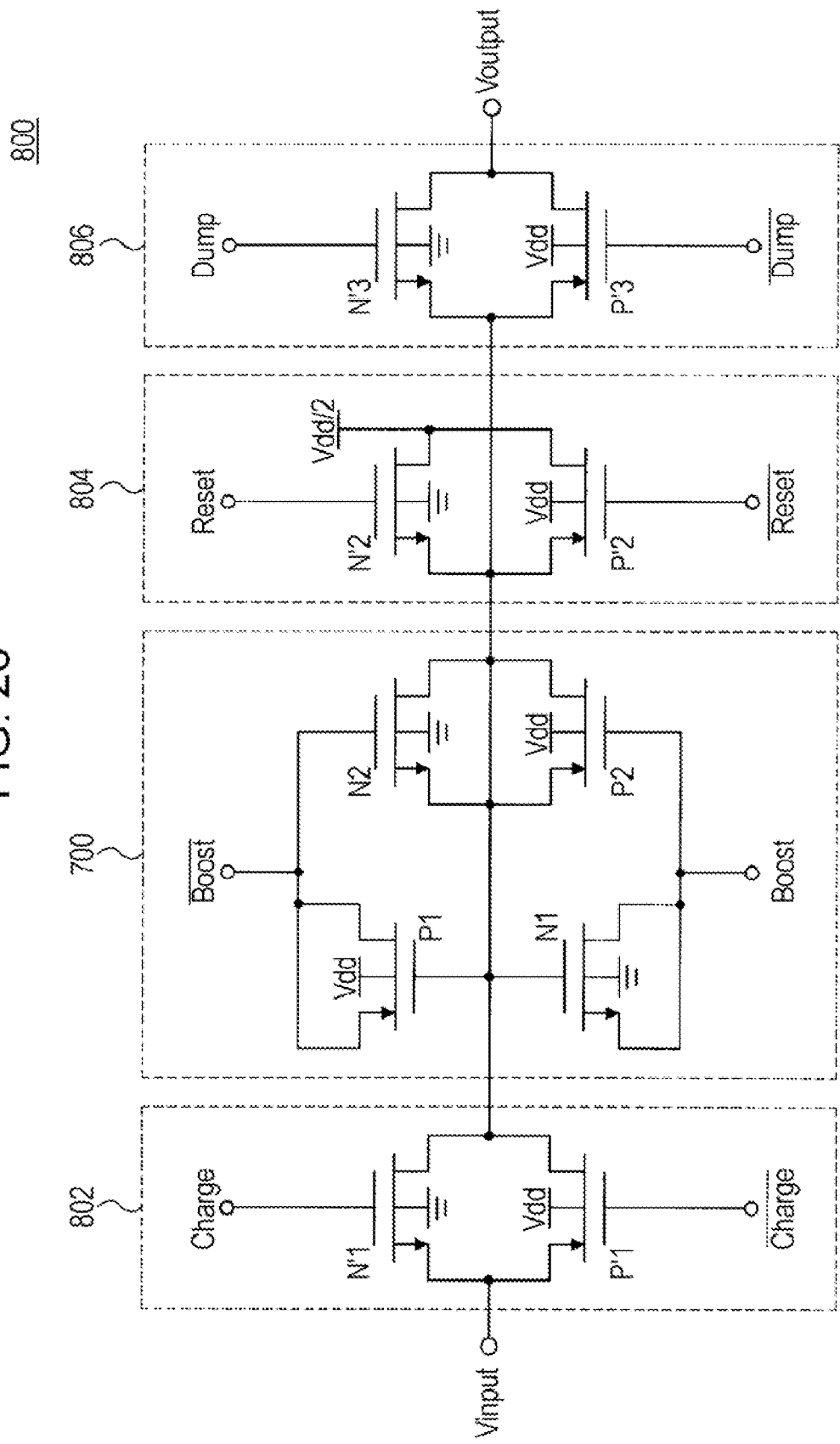
FIG. 26 is an explanatory diagram illustrating a charged main filter circuit having an amplifier according to an eighth embodiment of the present invention.

FIG. 26 is an explanatory diagram of a charged main filter circuit 800 having the amplifier 700, according to the eighth embodiment of the present invention.

With reference to FIG. 26, the charged main filter circuit 800 according to the eighth embodiment of the present invention has, for example, a MOSFET 802 serving as the Charge switch shown in FIG. 16, the amplifier 700 according to the seventh embodiment of the present invention, and a MOSFET 804 serving as a Reset switch, and a MOSFET 806 serving as a Dump switch.

An n-MOSFET (N'1) and p-MOSFET (P'1) which the MOSFET 802 has are each exclusively impressed with power source voltage Charge. Also, an n-MOSFET (N'2) and p-MOSFET (P'2) which the MOSFET 804 has are each exclusively impressed with power source voltage Reset. Also, an n-MOSFET (N'3) and p-MOSFET (P'3) which the MOSFET 306 has are each exclusively impressed with power source voltage Dump. Also, the upper-stage variable capacitance devices (p-MOS varactor P1 and n-MOS varactor N2) and lower-stage variable capacitance devices (n-MOS varactor N1 and p-MOS varactor P2) which the amplifier 700 has are each exclusively impressed with power source voltage Boost.

Now, with the charge main filter circuit 800, the components operating as variable capacitance devices may be only the MOSFETs of the amplifier 700, for example. Also, MOSFETs generally used as switches, such as the MOSFETs 802 through 806 such as shown in FIG. 26 for example, or the like, can be improved in operating speed by making the Gate length shorter to reduce ON resistance. However, with the charged main filter circuit 800, the MOSFETs 802 through 806 are parasitic capacitance as to the variable capacitance devices, and accordingly can be factors reducing the capacitance change ratio. Accordingly, with the charge main filter circuit 800, the Gate terminals of the switches such as the MOSFETs 802 through 806 are preferably formed small in size. Of course, it is needless to say that the size of the Gate terminals of the switches such as the MOSFETs 802 through 806, and the configuration of the MOSFETs 802 through 806, are not restricted to the above.

Also, the charged main filter circuit 800 can output the output voltage signal Voutput amplified with the bias voltage being maintained, by the basic operations of the charged main filter circuit according to the above-described embodiments of the invention.

Accordingly, by using the charged main filter circuit 800, there is no more need for a downstream circuit to be provided with special measures regarding output voltage signals of the charged main filter circuit 800, making handling of the output voltage signals easier, and also enabling contribution to finer circuits and lower electric power consumption. Further, the probability of the magnitude of the output voltage signal becoming greater than the power source voltage Vdd can be made very small, so there is no distortion in output voltage signals, and desired output voltage signals can be obtained.

Ninth Embodiment

Figure 27:
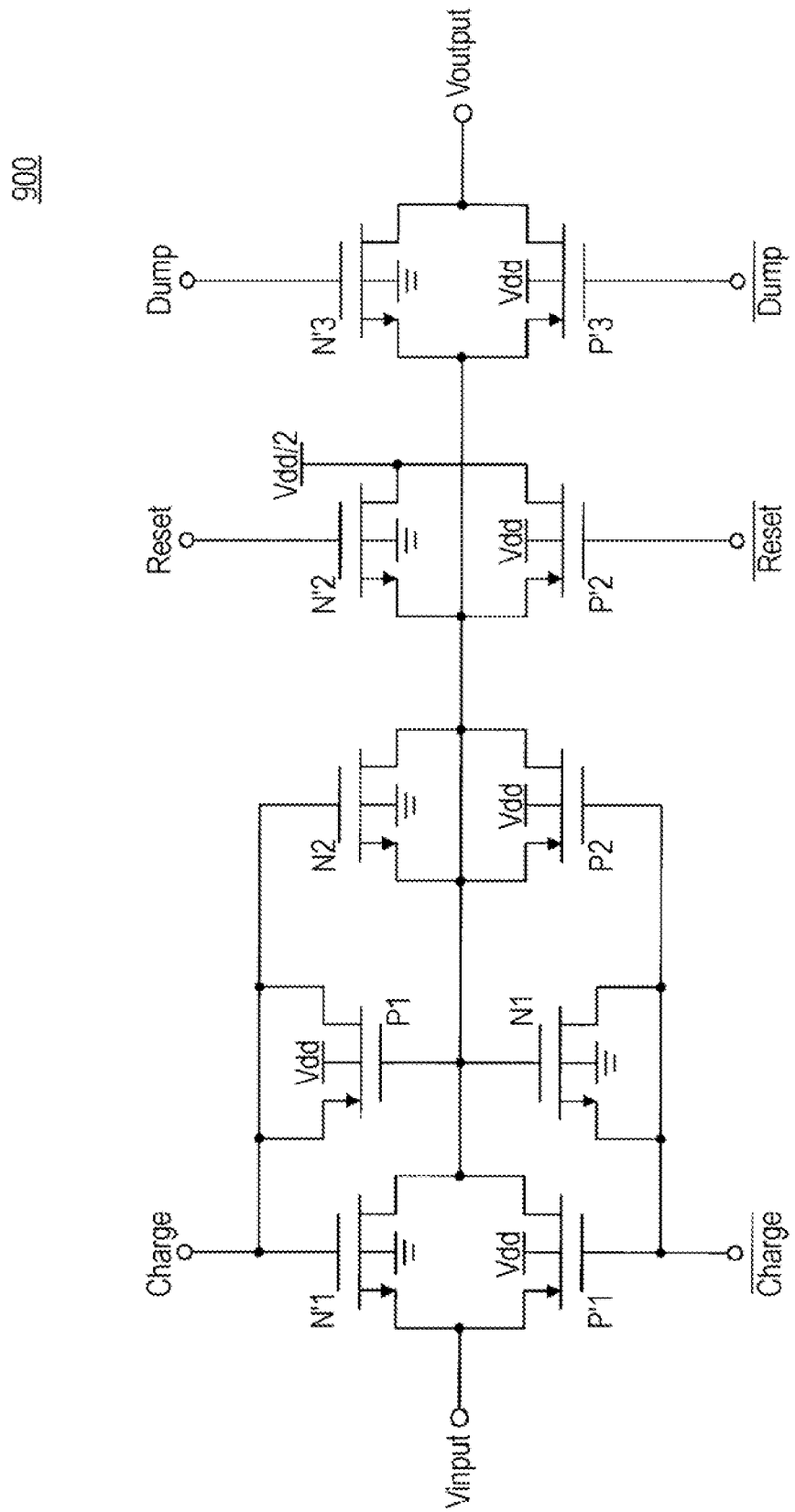
FIG. 27 is an explanatory diagram illustrating a charged main filter circuit having an amplifier according to a ninth embodiment of the present invention.

FIG. 27 is an explanatory diagram illustrating a charged main filter circuit 900 having the amplifier 700, according to a ninth embodiment of the present invention.

Making reference to FIG. 27, the charged main filter circuit 900 according to the ninth embodiment of the present invention has basically the same configuration as the charged main filter circuit 800 according to the ninth embodiment of the present invention. Now, as described in the basic operations of the charged main filter circuit according to the embodiments of the present invention, the Charge state and Boost state are in an exclusive relation. Accordingly, as shown in FIG. 27, the power source voltage applied to the MOSFET 802 and amplifier 700 can be held in common.

Accordingly, the charged main filter circuit 900 can be simplified in circuit configuration as compared to the charged main filter circuit 800.

Also, even with the configuration shown in FIG. 27, the charged main filter circuit 900 can output the output voltage signal Voutput amplified with the bias voltage being maintained, by the basic operations of the charged main filter circuit according to the above-described embodiments of the invention, in the same way as with the charged main filter circuit 800.

Accordingly, by using the charged main filter circuit 900 according to the ninth embodiment of the present invention, there is no more need for a downstream circuit to be provided with special measures regarding output voltage signals of the charged main filter circuit 800, making handling of the output voltage signals easier, and also enabling contribution to finer circuits and lower electric power consumption. Further, the probability of the magnitude of the output voltage signal becoming greater than the power source voltage Vdd can be made very small, so there is no distortion in output voltage signals, and desired output voltage signals can be obtained.

Tenth Embodiment

The amplifiers according to the above-described first through ninth embodiments are such that change in capacitance occurs due to whether or not inversion layers are present in the p-MOS varactors and n-MOS varactors, and accordingly perform "reverse mode" operations. Now, the p-MOS varactors and n-MOS varactors also operate in an "accumulation mode" wherein change in capacitance occurs due to accumulation of electron holes near the oxide film. Accordingly, even in cases of replacing the amplifiers according to the above-described first through sixth embodiments with the p-MOS varactors and n-MOS varactors operating in an "accumulation mode", of the bias voltage and voltage signal input to the amplifier, the voltage signal can be amplified, in the same way as with the amplifiers according to the above-described first through sixth embodiments.

Eleventh Embodiment

Figure 28A:
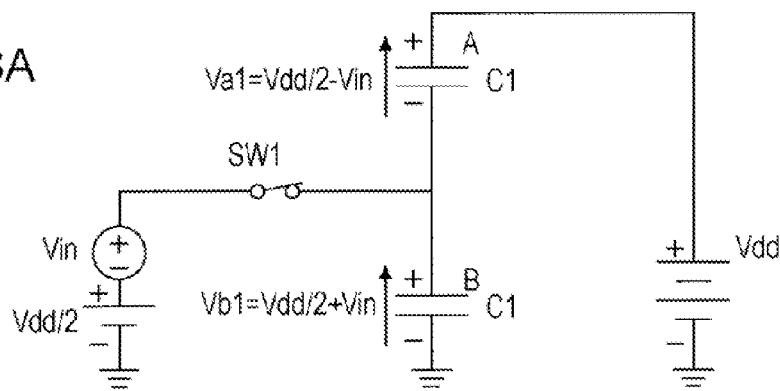
FIG. 28A is an explanatory diagram illustrating the principle of an amplifier according to an embodiment of the present invention.
Figure 28B:
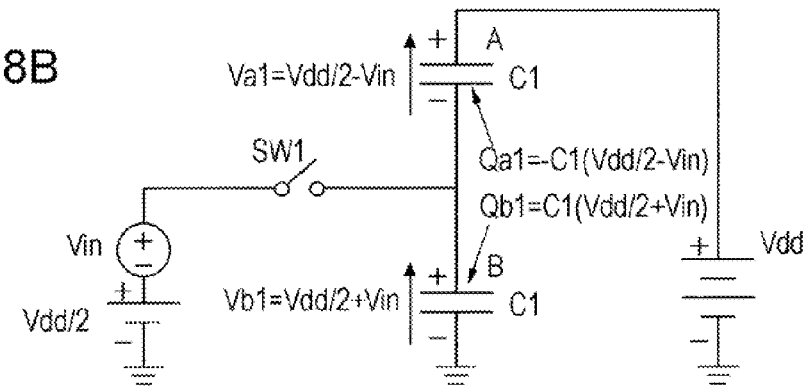
FIG. 28B is an explanatory diagram illustrating the principle of an amplifier according to an embodiment of the present invention.
Figure 28C:
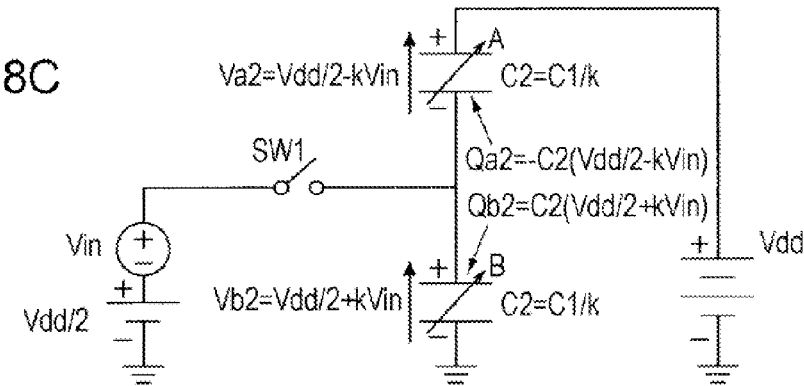
FIG. 28C is an explanatory diagram illustrating the principle of an amplifier according to an embodiment of the present invention.

Next, description will be made regarding an eleventh embodiment of the present invention. Now, the embodiments described above were each attempts to solve the above-described [first problem] through [third problem] occurring at the time of voltage Boost, by realizing a CMOS type amplifier using MOS varactors of inverse conductivity types (p-MOS and n-MOS). Conversely, the amplifier according to the present embodiment attempts to realize the same functions as the above embodiments by using variable capacitance devices (MOS varactors) of the same conductivity type.
[Principle of Amplification with Amplifier Configured of Variable Capacitance Devices of the Same Conductivity Type]
FIG. 28A through FIG. 28C are explanatory diagrams illustrating the principle of amplification with an amplifier according to an embodiment of the present invention. Here, FIG. 28A illustrates a Track state, 28B illustrates a Hold state, and 28C illustrates a Boost state, respectively.

With reference to FIG. 28A through FIG. 28C, the amplifier configured of variable capacitance devices of the same conductive type, according to an embodiment of the present invention, have (1) a first variable capacitance device A of which the capacitance varies, and (2) a second variable capacitance device B having the same conductivity type as the first variable capacitance device A, with bias voltage Vdd/2 and voltage signal Vin being input to the first variable capacitance device A and the second variable capacitance device B in accordance with the connection state of the switch SW1. Also, the first variable capacitance device A is connected to the power source voltage source, and the second variable capacitance device B is connected to the ground. Note that the bias voltage is shown as Vdd/2 in FIG. 28A through FIG. 28C, but of course is not restricted to this.

As shown in FIG. 28A, in the Track state, the switch SW1 is closed, whereby the bias voltage Vdd/2 and voltage signal Vin are input via the switch SW1. Accordingly, the potential difference at both ends of the first variable capacitance device A is Va1=Vdd/2−Vin, and the potential difference at both ends of the second variable capacitance device B is Vb1=Vdd/2+Vin. Consequently, the first variable capacitance device A and the second variable capacitance device B accumulate charge.

Next, as shown in FIG. 28B, in the Hold state, by the switch SW1 opening from the Track state, input of the bias voltage Vdd/2 and voltage signal Vin stops. Here, the following relations hold in the Hold state.
(1) The charge Qa1=−C1·Va1=−C1(Vdd/2−Vin) immediately prior to the switch SW1 opening is held at the lower side of the first variable capacitance device A (the terminal at the side connected to the switch SW1 in FIG. 28B).
(2) The charge Qb1=C1·Vb1=C1(Vdd/2+Vin) immediately prior to the switch SW1 opening is held at the upper side of the second variable capacitance device B (the terminal at the side connected to the switch SW1 in FIG. 28B).

Now, the total of charge $Qtotal_{Hold}$ at the lower side of the first variable capacitance device A and the upper side of the second variable capacitance device B is charge $Qtotal_{Hold}$=2·C1·Vin. Accordingly, the input signal Vin is equivalent to being input to a capacitance device having twice the capacitance of the capacitance C1.

Next, as shown in FIG. 28C, in the Boost state, the capacitance of the first variable capacitance device A and the second variable capacitance device B are each reduced from C1 to C2 respectively (here, C1>C2 holds.) by being multiplied by 1/k. That is to say, the capacitance of the first variable capacitance device A and the second variable capacitance device B is C2=C1/k.

At this time, due to the charge Q'=(k−1)C2·Vdd/2 making transition from the first variable capacitance device A to the power source voltage source side, charge of an amount equivalent to the charge Q' is cancelled out at the lower side of the first variable capacitance device A and the upper side of the second variable capacitance device B. Accordingly, the charge at the lower side of the first variable capacitance device A is Qa2=−C2(Vdd/2−kVin), and in the same way, the charge at the upper side of the second variable capacitance device B is Qb2=−C2(Vdd/2+kVin).

Accordingly, in the Boost state, the potential difference impressed on both ends of the first variable capacitance device A is Va2=Vdd/2−kVin, and the potential difference impressed on both ends of the second variable capacitance device B is Vb2=Vdd/2+kVin. Now, the charge total $Qtotal_{Boost}$ at the lower side of the first variable capacitance device A and the upper side of the second variable capacitance device B in the Boost state is $Qtotal_{Boost}=2 \cdot C1 \cdot Vin=Qtotal_{Hold}$. Accordingly, the charge is held even in the Boost state.

Accordingly, with the amplifier configured of variable capacitance devices of the same conductivity type according to an embodiment of the present invention, the input voltage signal Vin can be amplified k (capacitance change ratio) times, while maintaining the bias voltage Vdd/2=Vbias, as with the amplifiers having CMOS according to embodiments of the present invention described above. Accordingly, with the amplifier configured of variable capacitance devices of the same conductivity type according to an embodiment of the present invention, the output voltage is not unnecessarily great as with the conventional MOSFET parametric amplifier 10, so the probability of the three problems of the conventional MOSFET parametric amplifier 10 described above occurring can be made very small, thereby contributing to finer circuits and lower electric power consumption.

Also, the principle of amplification with the amplifier according to the above-described embodiments of the present invention can be applied regardless of cases wherein the variable capacitance devices configuring the amplifier are CMOS or cases wherein the variable capacitance devices are of the same conductive type.

[Exceptional Problem]

As described in the above [Principle of amplification with amplifier configured of variable capacitance devices of the same conductivity type], charge of the same amount is cancelled out at one terminal of the first variable capacitance device A and one terminal of the second variable capacitance device B electrically connected to the one terminal of the variable capacitance device A, whereby the voltage signal can be amplified by multiplication by the capacitance change ratio, while maintaining the magnitude of the bias voltage. However, there is a possibility that desired effects may not be sufficiently obtained in the event that an unexpected situation such as manufacturing irregularities of the first variable capacitance device A and second variable capacitance device B, for example, occurs, such that a capacitance difference ΔC occurs between the capacitance of the first variable capacitance device A and the second variable capacitance device B. The reason thereof will be briefly described below with reference to FIG. 19.

For example, in the event that a capacitance difference ΔC occurs between the capacitance of the first variable capacitance device A and the second variable capacitance device B, the charge at the lower side of the first variable capacitance device A in FIG. 28B (the terminal at the side connected to the switch SW1 in FIG. 28(b)) is Qa1=−C1(Vdd/2−Vin), and also the charge at the upper side of the second variable capacitance device B in FIG. 28B (the terminal at the side connected to the switch SW1 in FIG. 28B) is Qb1=(C1+ΔC)·(Vdd/2+Vin). At this time, in FIG. 28B, the total of the charge at the lower side of the first variable capacitance device A and the charge at the upper side of the second variable capacitance device B is Qtotal=(2·C1+ΔC)Vin+ΔC·(Vdd/2), with the charge being dependent on the bias voltage Vdd/2.

Accordingly, the output voltage signal Voutput output from the amplifier via the Boost state is that wherein the bias voltage Vbias=Vdd/2 has also undesirably been amplified, as shown in Expression 21.

[Mathematical Expression 21]

$$Voutput = \left(1 + \frac{k\Delta C}{2C1 + \Delta C}\right)\left(\frac{Vdd}{2}\right) + kVin \quad \text{(Expression 21)}$$
$$= \left(1 + \frac{k\Delta C}{2C1 + \Delta C}\right) \cdot Vbias + kVin$$

Now, the amplification amount of the bias voltage Vbias shown in Expression 21 is such that the smaller the capacitance difference ΔC is, the smaller the amplification amount of the bias voltage Vbias is as compared to the amplification amount of the bias voltage amplified at the above-described conventional MOSFET parametric amplifier 10. However, if the bias voltage Vbias is amplified as shown in Expression 21, there is the possibility that the advantages of the amplifier according to embodiments of the present invention, which are "making handling of the output voltage signals easier", "enabling contribution to finer circuits and lower electric power consumption", and "desired output voltage signals can be obtained", may not be obtainable.

With the amplifier configured of variable capacitance devices of the same conductivity type according to embodiments of the present invention, the first variable capacitance device A and the second variable capacitance device B are of the same conductivity type. Now, with variable capacitance devices of the same conductivity type, as long as the size is generally the same, the capacitance difference ΔC is extremely small even if an unexpected situation arises such as manufacturing irregularities or the like, so the capacitance difference ΔC can be handled as a negligible error. Accordingly, with the amplifier configured of variable capacitance devices of the same conductivity type according to embodiments of the present invention, the capacitance of the first variable capacitance device A and the second variable capacitance device B can be made to be the same (generally the same), so the above-described exceptional problem does not occur, and the voltage signal can be amplified by multiplication by the capacitance change ratio.

[Amplifier According to Eleventh Embodiment of the Present Invention]

Next, an amplifier 1000 according to an eleventh embodiment of the present invention will be described with reference to FIG. 29 through FIG. 31. Here, FIG. 29 illustrates a Track state of the amplifier 1000 according to the eleventh embodiment of the present invention, and FIG. 30 illustrates a Boost state of the amplifier 1000 according to the eleventh embodiment of the present invention.

Also, FIG. 31 is an explanatory diagram illustrating waveforms of signals according to the eleventh embodiment of the present invention, with (a) illustrating control clock signals for controlling switches, (b) illustrating the input voltage signal Vinput input to the amplifier 1000 according to the eleventh embodiment of the present invention, and (c) illustrating the output voltage signal Voutput, output from the amplifier 1000 according to the eleventh embodiment of the present invention. Note that while FIG. 29 through FIG. 31 illustrate the bias voltage as being Vbias=Vdd/2, it is needless to say that the bias voltage is not restricted to the above-described.

Figure 29:
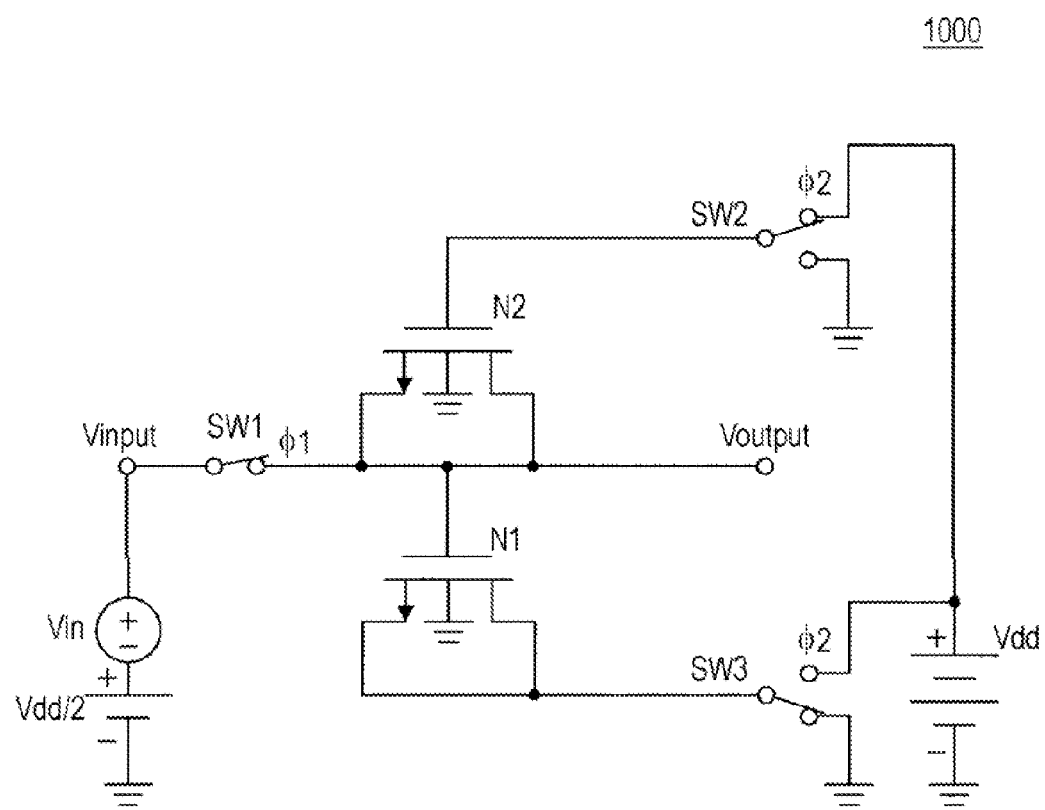
FIG. 29 is an explanatory diagram illustrating a Track state of an amplifier according to an eleventh embodiment.
Figure 30:
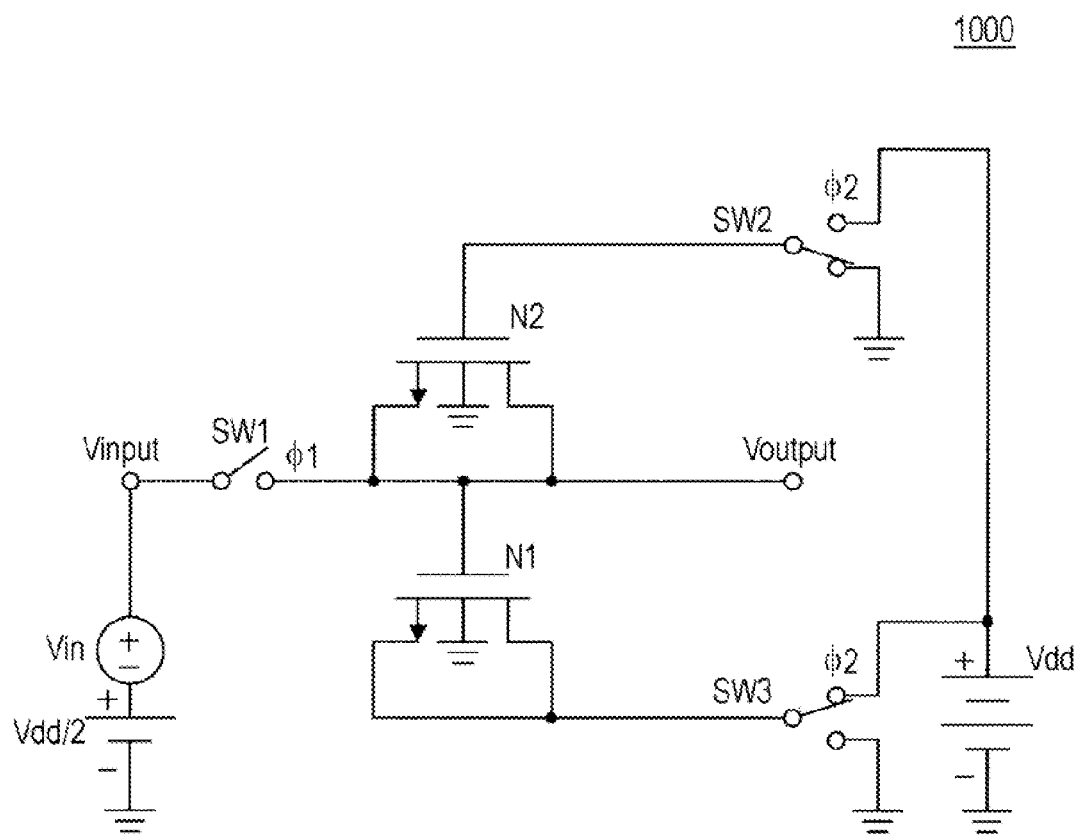
FIG. 30 is an explanatory diagram illustrating a Boost state of the amplifier according to the eleventh embodiment.

With reference to FIG. 29 and FIG. 20, the amplifier 1000 according to the eleventh embodiment of the present invention is configured of n-MOS varactors N1 and N2. As with the MOSFET shown in FIG. 2, the capacitance of the n-MOS varactors N1 and N2 can be changed depending on whether or not there is an inversion layer. Now, the n-MOS varactors N1 and N2 of the amplifier 1000 preferably have generally the same Gate terminal widths and lengths (i.e., in the order of manufacturing variance is permissible).

Input voltage signal Vinput is input to the Gate terminal of the n-MOS varactor N1, and to the Source terminal and Drain terminal of the n-MOS varactor N2, in accordance with the connection state of the switch SW1. Now, the input voltage signal Vinput input to the amplifier 1000 according to the eleventh embodiment of the present invention is a signal wherein the bias voltage Vdd/2 and the voltage signal Vin are superimposed, as shown in FIG. 31(*b*).

Also, the Source terminal and Drain terminal of the n-MOS varactor N1 are connected to the power source voltage source and the ground in accordance with the connection state of the switch SW3, and the Gate terminal of the n-MOS varactor N2 is connected to the power source voltage source and the ground in accordance with the connection state of the switch SW2. While the n-MOS varactors N1 and N2 are of the same conductivity type, the terminals connected to the switch SW1 differ. Accordingly, in order to match the increase/decrease change of capacitance for the n-MOS varactors N1 and N2, in the event that the switch SW2 is connected to the power source voltage source, the switch SW3 is connected to the ground, and in the event that the switch SW2 is connected to the ground, the switch SW2 is connected to the power source voltage source.

Now, the switch SW1 synchronizes with the clock signal φ1 shown in FIG. 31(*a*), so as to close when the clock signal φ1 is high, and input the bias voltage Vbias and voltage signal Vin to the Gate terminals of the n-MOS varactor N1 and n-MOS varactor N2. Also, the switch SW1 opens when the clock signal φ1 is low, thereby controlling input of the bias voltage Vbias and voltage signal Vin to the Gate terminals of the n-MOS varactor N1 and n-MOS varactor N2. Note that the relation between the clock signal φ1 and the switch SW1 is not restricted to the above, and the switch SW1 may close when the clock signal φ1 is low.

The switch SW2 synchronizes with the clock signal φ2 shown in FIG. 31(*a*), so as to be connected to the ground when the clock signal φ2 is high, and connected to the power source voltage source when the clock signal φ2 is low, for example. Also, the switch SW3 synchronizes with the clock signal φ2, so as to be connected to the power source voltage source when the clock signal φ2 is high, and connected to the ground when the clock signal φ2 is low, for example. Now, as shown in FIG. 31(*a*), the clock signal φ1 and clock signal φ2 are input such that the phases thereof do not overlap, the reason thereof being the same as with the above-described first embodiment (to create a Hold state).

In the Track state shown in FIG. 29, the input voltage signal Vinput is input to the Gate terminal of the n-MOS varactor N1 and the Source terminal and Drain terminal of the n-MOS varactor N2 by the switch SW1 closing due to the clock signal φ1 going high.

Also, the switch SW2 is connected to the power source voltage source when the clock signal φ2 is low, and the switch SW3 is connected to the ground when the clock signal φ2 is low. At this time, inversion layers are formed at the semiconductor interface directly below the Gate terminals of each of the n-MOS varactors N1 and N2, and the capacitance of each increases. Accordingly, charge corresponding to the input voltage signal Vinput is accumulated at each of the n-MOS varactors N1 and N2.

Also, in the Boost state shown in FIG. 30, the switch SW1 opens by the clock signal φ1 going to low, and input of the input voltage signal Vinput is stopped.

Also, when the clock signal φ2 is at high the switch SW2 is connected to the ground, and when the clock signal φ2 is at high the switch SW3 is connected to the power source voltage source. At this time, the inversion layers which had been generated at the semiconductor interface directly below the Gate terminal of each of the n-MOS varactor N1 and N2, disappear, and the capacitances of each of the n-MOS varactors N1 and N2 decrease. At this time, the Gate terminal of the n-MOS varactor N1 and the Source terminal and Drain terminal of the n-MOS varactor N2 have charge, so the voltage signal Vin is amplified by multiplication by the capacitance change ratio, by change in capacitance, while maintaining the magnitude of the bias voltage Vdd/2.

Accordingly, as shown in FIG. 31(*c*), the output voltage Voutput of the amplifier 1000 according to the eleventh embodiment of the present invention assumes a waveform wherein the voltage signal Vin has been amplified by being multiplied by the capacitance change ratio, with the magnitude of the bias voltage Vbias being held as it is, as to the input voltage signal Vinput. Now, the output voltage Voutput is smaller than the power source voltage Vdd, so there is no distortion output voltage as with the conventional MOSFET parametric amplifier 10. Also, having the clock signal φ2 to rise following the clock signal φ1 falling as shown in FIG. 31(*a*) causes transition from the Track state shown in FIG. 29A via the Hold state to the Boost state shown in FIG. 30.

As described above, the amplifier 1000 according to the eleventh embodiment of the present invention has a configuration wherein n-MOS varactors which are generally the same in size (here, size indicates the width and length of Gate terminals) are vertically arrayed (here, "vertical" indicates a symmetrical placement such as shown in FIG. 29, for example. Accordingly, "horizontal" and "diagonal" are also included in the configuration of the amplifier 1000 according to the eleventh embodiment of the present invention as a matter of course.). Now, even in the event that there are manufacturing irregularities in the n-MOS varactors making up the amplifier 1000, the capacitance difference among the MOS varactors is extremely small. Accordingly, with the amplifier 1000 according to the eleventh embodiment of the present invention, even in the event that there are manufacturing irregularities in the n-MOS varactors making up the amplifier 1000, the capacitance difference Δ can be made extremely small.

Accordingly, the amplifier 1000 according to the eleventh embodiment of the present invention can maintain the magnitude of bias voltage included in the input voltage signal after amplification as well.

Thus, with the amplifier 1000 according to the eleventh embodiment of the present invention, in the same way as with the amplifier 100 according to the first embodiment of the present invention, an output voltage signal, wherein a voltage signal has been amplified by being multiplied by the capacitance change ratio with the magnitude of the bias voltage being held as it is as to the input voltage signal, can be output, so the output voltage signal never becomes unnecessarily great. Accordingly, a circuit having the amplifier 1000 according to the eleventh embodiment of the present invention no longer needs to be provided with special measures regarding output voltage signals of the amplifier 1000 according to the eleventh embodiment of the present invention, making handling of the output voltage signals easier, and also enabling contribution to finer circuits and lower electric power consumption. Further, the probability of the magnitude of the output voltage signal becoming greater than the power source voltage Vdd can be made very small, so there is no distortion in output voltage signals, and desired output voltage signals can be obtained.

Twelfth Embodiment

A configuration using n-MOS varactors has been shown with the amplifier 1000 according to the eleventh embodiment of the present invention, as an amplifier configured of variable capacitance devices of the same conductivity type according to an embodiment of the present invention. However, an amplifier configured of variable capacitance devices of the same conductivity type according to an embodiment of the present invention is not restricted to using n-MOS varactors. Accordingly, next, a configuration using p-MOS varactors which are of inverse conductivity type as to the n-MOS varactors will be illustrated as an amplifier according to a twelfth embodiment of the present invention.

Figure 32:
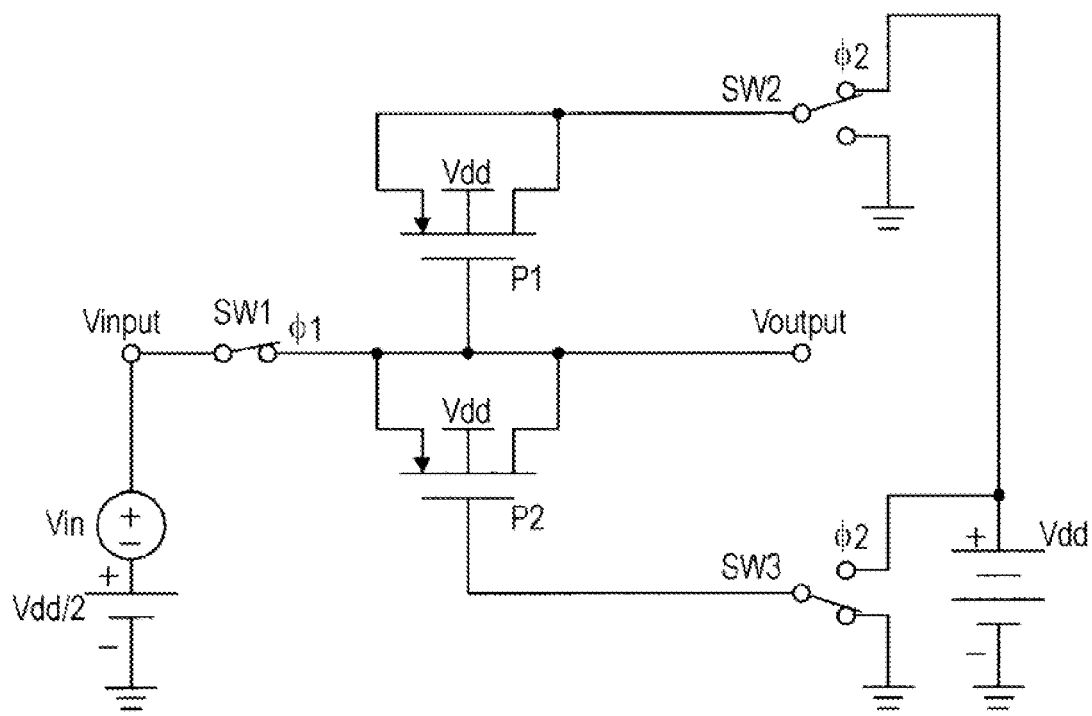
FIG. 32 is an explanatory diagram illustrating a Track state of an amplifier according to a twelfth embodiment.
Figure 33:
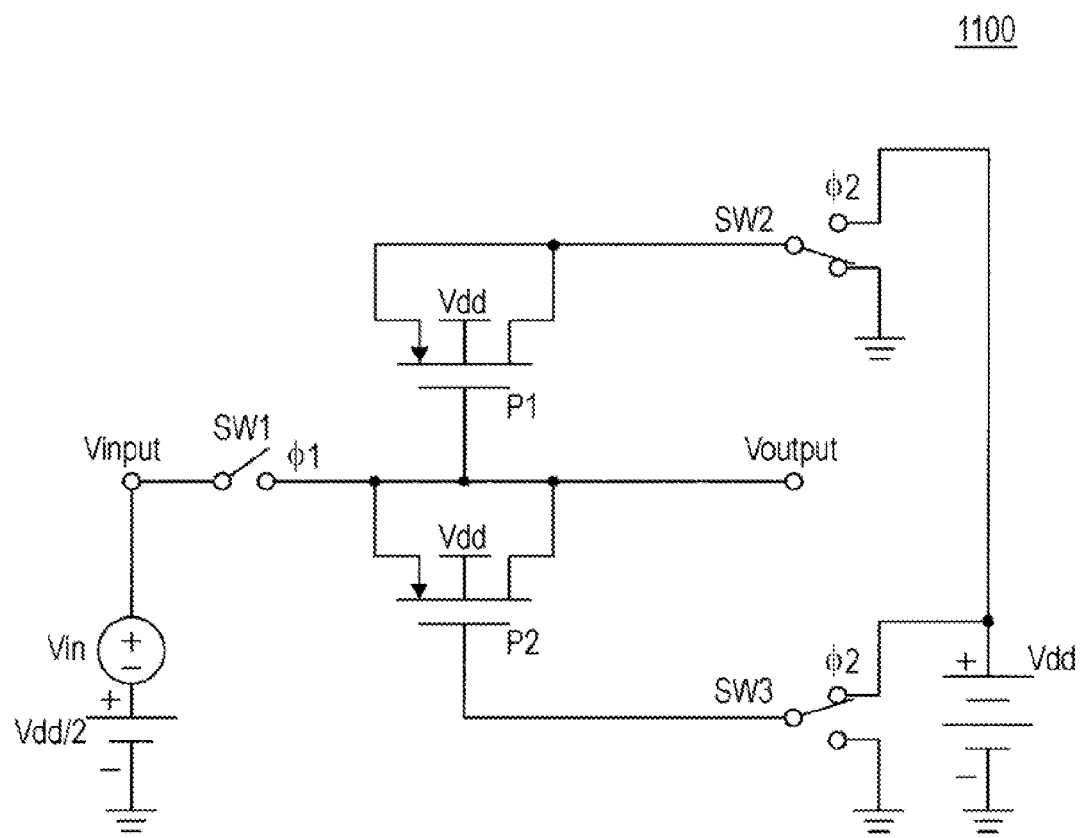
FIG. 33 is an explanatory diagram illustrating a Boost state of the amplifier according to the twelfth embodiment.

FIG. 32 and FIG. 33 are explanatory diagrams illustrating an amplifier 1100 according to the twelfth embodiment of the present invention. FIG. 32 illustrates a Track state, and FIG. 33 illustrates a Boost state, respectively.

With reference to FIG. 32 and FIG. 33, the amplifier 1100 according to the twelfth embodiment of the present invention is configured of p-MOS varactors P1 and P2. As with the MOSFET shown in FIG. 2A and FIG. 2B, the capacitance of the p-MOS varactors P1 and P2 can be changed depending on whether or not there is an inversion layer. Now, the p-MOS varactors P1 and P2 of the amplifier 1100 preferably have generally the same Gate terminal widths and lengths (i.e., in the order of manufacturing variance is permissible).

Input voltage signal Vinput is input to the Gate terminal of the p-MOS varactor P1, and to the Source terminal and Drain terminal of the p-MOS varactor P2, in accordance with the connection state of the switch SW1. Now, the input voltage signal Vinput input to the amplifier 1100 according to the twelfth embodiment of the present invention is a signal wherein the bias voltage Vdd/2 and the voltage signal Vin are superimposed, in the same way as with the amplifier 1000 according to the eleventh embodiment of the present invention shown in FIG. 31(*b*).

Also, the Source terminal and Drain terminal of the p-MOS varactor P1 are connected to the power source voltage source and the ground in accordance with the connection state of the switch SW2, and the Gate terminal of the p-MOS varactor P2 is connected to the power source voltage source and the ground in accordance with the connection state of the switch SW3. While the p-MOS varactors P1 and P2 are of the same conductivity type, the terminals connected to the switch SW1 differ. Accordingly, in order to match the increase/decrease change of capacitance for the p-MOS varactors P1 and P2, in the event that the switch SW2 is connected to the power source voltage source, the switch SW3 is connected to the ground, and in the event that the switch SW2 is connected to the ground, the switch SW3 is connected to the power source voltage source.

In the Track state shown in FIG. 32, the input voltage signal Vinput is input to the Gate terminal of the p-MOS varactor P1 and the Source terminal and Drain terminal of the p-MOS varactor P2 by the switch SW1 closing due to the clock signal ϕ1 going high.

Also, the switch SW2 is connected to the power source voltage source when the clock signal ϕ2 is low, and the switch SW3 is connected to the ground when the clock signal ϕ2 is low. At this time, inversion layers are formed at the semiconductor interface directly below the Gate terminals of each of the p-MOS varactors P1 and P2, and the capacitance of each increases. Accordingly, charge corresponding to the input voltage signal Vinput is accumulated at each of the p-MOS varactors P1 and P2.

Also, in the Boost state shown in FIG. 33, the switch SW1 opens by the clock signal ϕ1 going to low, and input of the input voltage signal Vinput is stopped.

Also, when the clock signal ϕ2 is at high the switch SW2 is connected to the ground, and when the clock signal ϕ2 is at high the switch SW3 is connected to the power source voltage source. At this time, the inversion layers which had been generated at the semiconductor interface directly below the Gate terminal of each of the p-MOS varactors P1 and P2, disappear, and the capacitances of each of the p-MOS varactors P1 and P2 decrease. At this time, the Gate terminal of the p-MOS varactor P1 and the Source terminal and Drain terminal of the p-MOS varactor P2 have charge, so the voltage signal Vin is amplified by multiplication by the capacitance change ratio, by change in capacitance, while maintaining the magnitude of the bias voltage Vdd/2.

Accordingly, in comparison with the amplifier 1000 according to the eleventh embodiment of the present invention, the amplifier 1100 according to the twelfth embodiment of the present invention has variable capacitance devices of inverse conductivity types as to the variable capacitance devices of the amplifier 1000 according to the eleventh embodiment of the present invention, so the connection relation of the variable capacitance devices differs, but it can be understood that the function as an amplifier is the same.

As described above, the amplifier 1100 according to the twelfth embodiment of the present invention has a configuration wherein p-MOS varactors which are generally the same in size (here, size indicates the width and length of Gate terminals) are vertically arrayed (here, "vertical" indicates a symmetrical placement such as shown in FIG. 29, for example. Accordingly, "horizontal" and "diagonal" are also included in the configuration of the amplifier 1100 according to the twelfth embodiment of the present invention as a matter of course.). Now, even in the event that there are manufacturing irregularities in the p-MOS varactors making up the amplifier 1100, the capacitance difference among the MOS varactors is extremely small. Accordingly, with the amplifier 1100 according to the twelfth embodiment of the present invention, even in the event that there are manufacturing irregularities in the p-MOS varactors making up the amplifier 1100, the capacitance difference Δ can be made extremely small.

Accordingly, the amplifier 1100 according to the twelfth embodiment of the present invention can maintain the magnitude of bias voltage included in the input voltage signal after amplification as well.

Also, with the amplifier 1100 according to the twelfth embodiment of the present invention, in the same way as with the amplifier 1000 according to the first embodiment of the present invention, an output voltage signal, wherein a voltage signal has been amplified by being multiplied by the capacitance change ratio with the magnitude of the bias voltage being held as it is as to the input voltage signal, can be output, so the output voltage signal never becomes unnecessarily great. Accordingly, a circuit having the amplifier 1100 according to the twelfth embodiment of the present invention no longer needs to be provided with special measures regarding output voltage signals of the amplifier 1100 according to the twelfth embodiment of the present invention, making handling of the output voltage signals easier, and also enabling contribution to finer circuits and lower electric power consumption. Further, the probability of the magnitude of the output voltage signal becoming greater than the power source voltage Vdd can be made very small, so there is no distortion in output voltage signals, and desired output voltage signals can be obtained.

Thirteenth Embodiment

The amplifiers according to the above-described first through eighth embodiments are such that change in capacitance occurs due to whether or not inversion layers are present in the p-MOS varactors and n-MOS varactors, and accordingly perform "reverse mode" operations. Now, the p-MOS varactors and n-MOS varactors also operate in an "accumulation mode" wherein change in capacitance occurs due to accumulation of electron holes near the oxide film. Accordingly, even in cases of replacing the amplifiers according to the above-described first through eighth embodiments with the p-MOS varactors and n-MOS varactors operating in an "accumulation mode", of the bias voltage and voltage signal input to the amplifier, the voltage signal can be amplified, in the same way as with the amplifiers according to the above-described first through eighth embodiments.

While preferred embodiments of the present invention have been described with reference to the attached drawings, it is needless to say that the present invention is not restricted by these examples. It is clearly understood that one skilled in the art could conceive various modifications or corrections within the scope of the Claims, and these are also encompassed in the technical scope of the present invention as a matter of course.

For example, with the amplifier according to the second embodiment of the present invention, a configuration has been shown wherein the amplifier according to the first embodiment further includes multiple adjusting p-MOS varactors of which the gate width is very small, but is not restricted to this configuration, and the amplifiers according to the third through sixth embodiments may further include multiple adjusting p-MOS varactors of which the gate width is very small. As described above, the adjusting p-MOS varactors which the amplifier according to the second embodiment of the present invention has serve to adjust the bias voltage, and even with a configuration wherein the amplifiers according to the third through sixth embodiments include multiple adjusting p-MOS varactors of which the gate width is very small, the voltage signal, of the bias voltage and voltage signal input to the amplifier, can be amplified.

Also, while a configuration having a CMOS has been illustrated with the amplifiers according to the third through fifth embodiments of the present invention, this is not restricted to this configuration, and arrangements may be made wherein, for example, the amplifiers according to the third through fifth embodiments of the present invention may be configured of variable capacitance devices of the same conductivity type as with the eighth and ninth embodiments of the present invention. Further, the amplifiers according to the third through fifth embodiments of the present invention may have configurations including both a configuration having a CMOS and a configuration with variable capacitance devices of the same conductivity type. With these configurations as well, output voltage signals wherein the voltage signal has been amplified by being multiplied by the capacitance change ratio can be output with the magnitude of the bias voltage maintained.

Also, while a configuration has been illustrated with the charged main filter circuit according to the sixth embodiment of the present invention, wherein the amplifying units 610 through 616 of the second SINC filter circuit are of a configuration of the amplifier according to the first embodiment of the present invention, this is not restricted to this configuration, and the amplifying units of the second SINC filter circuit in the charged main filter circuit according to the sixth embodiment of the present invention are amplifiers according to the second through fifth, seventh, and eight embodiments of the present invention. Even in a case wherein the amplifying units are of the above configuration, the amplifying units can output voltage signals wherein the voltage signal has been amplified by being multiplied by the capacitance change ratio, with the magnitude of the bias voltage maintained.

The above-described configurations are readily achievable by one skilled in the art, and should be understood to belong to the equivalent scope of the present invention.

The invention claimed is:

1. An amplifier comprising:
   a first variable capacitance device;
   a second variable capacitance device, electrically connected to said first variable capacitance device, and of an inverse conductivity type from said first variable capacitance device;
   a third variable capacitance device of the same conductivity type as said first variable capacitance device;
   a fourth variable capacitance device electrically connected to said third variable capacitance device, said fourth variable capacitance device being of the same conductivity type as said second variable capacitance device and of an inverse conductivity type from said first and third variable capacitance devices; and
   a first input unit for selectively inputting a bias voltage and a voltage signal to said first variable capacitance device, said second variable capacitance device, said third variable capacitance device, and said fourth variable capacitance device,
   wherein, when said bias voltage and said voltage signal are input to said first variable capacitance device, said second variable capacitance device, said third variable capacitance device, and said fourth variable capacitance device, a capacitance of said first variable capacitance-device, said second variable capacitance device, said third variable capacitance device, and said fourth variable capacitance device is taken as a first value,
   wherein said voltage signal is amplified with the capacitance of said first variable capacitance device, said second variable capacitance device, said third variable capacitance device, and said fourth variable capacitance device as a second value smaller than said first value,
   and wherein a ratio of a first capacitance of said first variable capacitance device and said fourth variable capacitance device, and a second capacitance of said second variable capacitance device and said third variable capacitance device does not change.

2. The amplifier according to claim 1, characterized in that voltage for canceling the amplification amount of said bias voltage is impressed on said first variable capacitance device, said second variable capacitance device, said third variable capacitance device, and said fourth variable capacitance device.

3. The amplifier according to claim 1, wherein
   said first input unit selectively inputs said bias voltage and a positive phase voltage signal making up a differential signal serving as said voltage signal,
   said first variable capacitance device and said second variable capacitance device amplify said positive phase voltage signal with said capacitance as a second value smaller than said first value,
   said amplifier further comprises
   a second input unit for selectively inputting, to said third variable capacitance device and said fourth variable capacitance device, said bias voltage and an inverse phase voltage signal of which the phase has been inverted from said positive phase voltage signal;

wherein, in the event that said bias voltage and said inverse phase voltage signal are input to said third variable capacitance device and said fourth variable capacitance device, the capacitance of said third variable capacitance device and said fourth variable capacitance device are taken as a third value, and wherein said inverse phase voltage signal is amplified with the capacitance of said third variable capacitance device and said fourth variable capacitance device as a fourth value smaller than said third value.

4. The amplifier according to claim 1, wherein the capacitance of said first variable capacitance device and said second variable capacitance device is taken as a third value greater than said first value in the event of attenuating said voltage signal, wherein said third variable capacitance device is connected to said first input unit in parallel to said first variable capacitance device; and wherein said fourth variable capacitance device is connected to said first input unit in parallel to said second variable capacitance device.

5. The amplifier according to claim 1, characterized in comprising at least one capacitance device having a predetermined capacitance and capable of accumulating a charge equivalent to said predetermined capacitance, disposed upstream of said first input unit, wherein said voltage signal which said first input unit inputs is a voltage signal due to charge sharing by said first variable capacitance device, said second variable capacitance device, said third variable capacitance device, said fourth variable capacitance device, and said at least one capacitance device.

6. An amplifier comprising:

a first variable capacitance unit of which capacitance is variable;

a second variable capacitance unit, electrically connected to said first variable capacitance unit; and a first input unit for selectively inputting a bias voltage and a voltage signal to said first variable capacitance unit and said second variable capacitance unit, wherein, when said bias voltage and said voltage signal are input to said first variable capacitance unit and said second variable capacitance unit, a capacitance of said first variable capacitance unit and said second variable capacitance unit is taken as a first value, wherein said voltage signal is amplified with the capacitance of said first variable capacitance unit and said second variable capacitance unit as a second value smaller than said first value, and wherein a ratio of a first capacitance of said first variable capacitance device and a second capacitance of said second variable capacitance device does not change.

7. An amplifying method, relating to an amplifier including a first variable capacitance device, and a second variable capacitance device of a same conductivity type as said first variable capacitance device, the method comprising:

inputting a bias voltage and a voltage signal to said first variable capacitance device and said second variable capacitance device, and accumulating a first charge corresponding to a first capacitance;

holding said first charge, and a voltage corresponding to said bias voltage and said voltage signal; and amplifying said voltage signal by reducing a capacitance of said first variable capacitance device and said second variable capacitance device from said first capacitance to a second capacitance smaller than said first capacitance, such that a ratio of a third capacitance of said first variable capacitance device and a fourth capacitance of said second variable capacitance device does not change.

8. The amplifying method according to claim 7, further comprising:

reducing the capacitance of said first variable capacitance device and said second variable capacitance device from said first capacitance to said second capacitance;

amplifying said bias voltage and said voltage signal in accordance to the ratio of said first capacitance and said second capacitance; and canceling out a charge equivalent to the amount of amplification of the amplified bias voltage at said first variable capacitance device and said second variable capacitance device.

9. An amplifier comprising:

a first variable capacitance device;

a second variable capacitance device, electrically connected to said first variable capacitance device; and a first input unit for selectively inputting a bias voltage and a voltage signal to said first variable capacitance device and said second variable capacitance device, wherein, when said bias voltage and said voltage signal are input to said first variable capacitance device and said second variable capacitance device, a capacitance of said first variable capacitance device and said second variable capacitance device is taken as a first value, wherein said voltage signal is amplified with the capacitance of said first variable capacitance device and said second variable capacitance device as a second value smaller than said first value, and wherein a ratio of a first capacitance of said first variable capacitance device and a second capacitance of said second variable capacitance device does not change.

10. The amplifier according to claim 9, characterized in that voltage for canceling the amplification amount of said bias voltage is impressed on said first variable capacitance device and said second variable capacitance device.

11. The amplifier according to claim 9, characterized in that said first variable capacitance device and said second variable capacitance device are of the same conductivity type.

* * * * *